(12) United States Patent
Maeda et al.

(10) Patent No.: US 8,194,305 B2
(45) Date of Patent: Jun. 5, 2012

(54) PACKAGE FOR MICROMIRROR DEVICE

(75) Inventors: Yoshihiro Maeda, Hachioji (JP);
Hirokazu Nishino, Akishima (JP);
Akira Shirai, Hino (JP); Hirotoshi Ichikawa, Hachioji (JP); Fusao Ishii, Menlo Park, CA (US)

(73) Assignees: Silicon Quest Kabushiki-Kaisha (JP);
Olympus Corporation (JP)

( * ) Notice: Subject to any disclaimer, the term of this patent is extended or adjusted under 35 U.S.C. 154(b) by 588 days.

(21) Appl. No.: 12/231,922

(22) Filed: Sep. 5, 2008

(65) Prior Publication Data

US 2009/0008669 A1 Jan. 8, 2009

Related U.S. Application Data

(63) Continuation-in-part of application No. 11/121,543, filed on May 4, 2005, now Pat. No. 7,268,932, which is a continuation-in-part of application No. 10/698,620, filed on Nov. 1, 2003, now abandoned, and a continuation-in-part of application No. 10/699,140, filed on Nov. 1, 2003, now Pat. No. 6,862,127, and a continuation-in-part of application No. 10/699,143, filed on Nov. 1, 2003, now Pat. No. 6,903,860.

(60) Provisional application No. 60/967,811, filed on Sep. 6, 2007.

(51) Int. Cl.
*G02B 26/00* (2006.01)
*G02B 26/08* (2006.01)
*G02F 1/29* (2006.01)

(52) U.S. Cl. ........................................ 359/298; 359/290

(58) Field of Classification Search .......... 359/290–292, 359/298
See application file for complete search history.

(56) References Cited

U.S. PATENT DOCUMENTS

| | | | |
|---|---|---|---|
| 529,351 A | 3/1994 | Poradish et al. | |
| 555,039 A | 8/1996 | Kocian et al. | |
| 5,610,625 A | 3/1997 | Sampsell | |
| 5,936,758 A | 8/1999 | Fisher et al. | |
| 607,161 A | 6/2000 | Sulzbach et al. | |
| 662,494 A1 | 9/2003 | Wallace et al. | |
| 6,618,186 B2 * | 9/2003 | Kaeriyama | 359/292 |
| 6,649,435 B2 | 11/2003 | Liu et al. | |
| 6,664,779 B2 * | 12/2003 | Lopes et al. | 257/682 |
| 672,020 A1 | 4/2004 | Choi | |
| 674,688 A1 | 6/2004 | Duncan et al. | |
| 6,762,868 B2 | 7/2004 | Liu et al. | |
| 6,827,449 B1 | 12/2004 | Klonis et al. | |
| 6,862,127 B1 | 3/2005 | Ishii | |
| 6,940,636 B2 | 9/2005 | Felton | |
| 6,947,020 B2 | 9/2005 | Kiser et al. | |
| 695,884 A1 | 10/2005 | Huibers et al. | |
| 6,952,301 B2 | 10/2005 | Huibers | |
| 6,975,444 B2 | 12/2005 | Huibers | |
| 699,504 A1 | 2/2006 | Patel et al. | |
| 7,027,207 B2 | 4/2006 | Huibers | |
| 7,034,985 B1 | 4/2006 | Huibers et al. | |

(Continued)

*Primary Examiner* — Joseph P Martinez
*Assistant Examiner* — Brandi Thomas
(74) *Attorney, Agent, or Firm* — Bo-In Lin

(57) ABSTRACT

The present invention discloses a mirror device that includes a mirror element which further comprising an elastic hinge and a mirror and which modulates incident light emitted from a light source, a device substrate on which a drive circuit for driving the mirror element is placed, a package substrate which is made of transparent glass or a silicon material and on which the device substrate is placed, a metallic thermal transfer path connected to the device substrate, and a cover glass connected to the package substrate so that the device substrate is covered.

19 Claims, 25 Drawing Sheets

U.S. PATENT DOCUMENTS

| | | |
|---|---|---|
| 704,262 A1 | 5/2006 | Huibers et al. |
| 7,042,623 B1 | 5/2006 | Huibers et al. |
| 7,046,419 B2 | 5/2006 | Gupta et al. |
| 706,404 A1 | 6/2006 | Yang |
| 710,906 A1 | 9/2006 | Yang |
| 7,110,160 B2 | 9/2006 | Patel et al. |
| 7,164,199 B2 | 1/2007 | Tarn |
| 722,681 A1 | 6/2007 | Kocian et al. |
| 743,257 A1 | 10/2008 | Malone |
| 2002/0004251 A1 | 1/2002 | Roberts et al. |
| 2002/0131146 A1 * | 9/2002 | Gee et al. .................... 359/291 |
| 2004/0232535 A1 | 11/2004 | Tarn |
| 2004/0238600 A1 | 12/2004 | Tarn |
| 2005/0214969 A1 | 9/2005 | Gore et al. |
| 2005/0275930 A1 | 12/2005 | Patel et al. |
| 2007/0065638 A1 | 3/2007 | Wang et al. |
| 2007/0072328 A1 | 3/2007 | Yang et al. |
| 2007/0263275 A1 | 11/2007 | Huibers |
| 2008/0158519 A1 | 7/2008 | Malone |
| 2008/0158892 A1 | 7/2008 | Davis |
| 2008/0231938 A1 | 9/2008 | Pan |

* cited by examiner

PACKAGE FOR MICROMIRROR DEVICE

This is a Non-provisional application of a U.S. Patent Provisional Application No. 60/967,811 filed on Sep. 6, 2007. The Patent Application 60/967,811 is a Continuation In Part (CIP) Application of a U.S. patent application Ser. No. 11/121,543 filed on May 4, 2005 issued into U.S. Pat. No. 7,268,932. The application Ser. No. 11/121,543 is a Continuation In Part (CIP) Application of three previously filed applications. These three applications are Ser. Nos. 10/698,620 filed on Nov. 1, 2003 now abandoned, 10/699,140 filed on Nov. 1, 2003 now issued into U.S. Pat. No. 6,862,127, and Ser. No. 10/699,143 filed on Nov. 1, 2003 now issued into U.S. Pat. No. 6,903,860 by the Applicant of this patent applications. The disclosures made in these patent applications are hereby incorporated by reference in this patent application.

BACKGROUND OF THE INVENTION

1. Field of the Invention

The present invention relates generally to the image projection apparatuses manufactured by applying the Micro Electro Mechanical Systems (MEMs) technology. More particularly, this invention relates to an image projection apparatus implemented with a mirror device disposed on a device substrate and packaged in a package substrate made of a transparent silicon material with a metallic thermal transfer path connected to the device substrate and a cover glass covering the package substrate.

2. Description of the Related Art

Design and development of image display apparatuses with high resolutions such as a full high-definition (Full HD: 1920 by 1080 pixels) are in great demand recently. For image projection apparatuses implemented with a mirror device to function as the spatial light modulator (SLM), the demand of high resolution image display imposes a more stringent design and manufacturing requirements on the mirror device, particularly to a mirror device implemented with two-dimensional arrays of micromirrors.

A common mirror device used for a Full-HD (High definition) display apparatus has the diagonal size of 24.13 mm (0.95 inches), with a mirror pitch of 11 μm. An eXtended Graphics Array (XGA)-sized mirror device has the diagonal size of 17.78 mm (0.7 inches) wherein the mirror array has a mirror pitch of 14 μm.

In order to provide a projection apparatus to achieve higher resolution it is desirable to shrink the mirror size of the mirror element of a mirror device. Furthermore, it is desirable to provide a package for protecting the mirror device. The package is configured to cover the mirror device with an intermediate member on the device substrate of the mirror device to support a cover glass.

Such a configuration of placing an intermediate member on the device substrate, however, needs to secure a region for placing the intermediate member of the device substrate. Consequently, the device substrate becomes as large as the region necessary for placing the intermediate member on the device substrate. This in turn limits the number of units of device substrates that are cut out of one semiconductor wafer, increasing the cost of the device substrate.

Furthermore, if the number of units of device substrate that are cut out of a semiconductor wafer is limited, the ratio of defective units to the number of usable units is increased making it difficult to improve the yield in production.

Meanwhile, conventional methods use a package in which a mirror device is placed on a ceramic substrate and the mirror device is covered with a metallic cover accompanied by a cover glass. The package uses a metallic cover that has an advantage in heat dissipation by radiating and transferring the heat generated from the light irradiated on the mirror device and from the operation of the mirror device thus preventing a temperature rise inside the package.

The processes for manufacturing a package with metallic cover are however more complex. Furthermore, there is another problem with the metallic cover that usually have a large area size and the shape and size of the metallic cover can have a significant change with the variations of temperature due to the coefficient of thermal expansion of the metallic cover.

There are additional technical problems in designing and manufacturing the package associated with the miniaturization of the mirror device. For example, the size of a mirror array with approximately two million pixels used for a full high definition (FULL-HD) is currently about 24.13 mm (0.95 inches). In order to reduce the mirror array to a size of 10.16 mm to 22.098 mm-(0.4 to 0.87 inches), a package needs to be designed that by taking into consideration of the issues such as the heat generated by the mirror device due irradiation of light, the reduction of floating capacitance, light shielding for preventing extraneous incident light and a change in the package forms due to temperature, in addition to a miniaturization of the mirror. As discussed above, for the purpose of containing and protecting the mirror device, it is critical to provide a package with improved heat conduction configuration to effectively dissipate the heat generated inside the package.

SUMMARY OF THE INVENTION

One aspect of the present invention is to provide a package for containing and protecting the mirror device with improved configuration for more effectively removing the heat generated inside the package from operation of the mirror device inside the box.

A first exemplary embodiment of the present invention provides a mirror device, comprising: a mirror element which is constituted by an elastic hinge and a mirror and which modulates incident light emitted from a light source, a device substrate on which a drive circuit for driving the mirror element is placed, a package substrate which is made of transparent glass or a silicon material and on which the device substrate is placed, a metallic thermal transfer path connected to the device substrate, and a cover glass connected to the package substrate so that the device substrate is covered.

A second exemplary embodiment of the present invention provides the mirror device according to the first exemplary embodiment, wherein the package substrate or cover glass has a cavity in which the device substrate is placed.

A third exemplary embodiment of the present invention provides the mirror device according to the first exemplary embodiment, wherein at least a part of the thermal transfer path is a circuit-wiring pattern electrically connected to the device substrate.

A fourth exemplary embodiment of the present invention provides the mirror device according to the first exemplary embodiment, wherein the thermal transfer path is a path for radiating heat from the bottom surface of the device substrate to the outside of the package substrate.

A fifth exemplary embodiment of the present invention provides the mirror device according to the first exemplary embodiment, wherein a light absorption layer is further formed on the package substrate.

A sixth exemplary embodiment of the present invention provides the mirror device according to the first exemplary embodiment, wherein a nano-structured anti-reflection coating layer, with the reflectance being no more than 0.4% of the incident light, is formed on the cover glass and/or the package substrate.

A seventh exemplary embodiment of the present invention provides a mirror device, comprising: a mirror for modulating incident light emitted from a light source, an elastic hinge for supporting the mirror on the bottom surface, a device substrate on which a drive circuit for driving the mirror is placed, a thermal conduction member placed on the bottom surface of the device substrate, a package substrate for supporting the device substrate, and a cover glass joined with a fritted glass or a low-melt metal onto the package substrate to cover the device substrate, wherein the difference in linear expansion rates between the package substrate and cover glass is no more than $2*10^{-6}$/K.

An eighth exemplary embodiment of the present invention provides the mirror device according to the seventh exemplary embodiment, wherein the package substrate is constituted by a material with the thermal conductivity being no less than 40 Wm/K.

A ninth exemplary embodiment of the present invention provides the mirror device according to the seventh exemplary embodiment, wherein the package substrate composed of the same material as that of the device substrate.

A tenth exemplary embodiment of the present invention provides the mirror device according to the seventh exemplary embodiment, wherein the package substrate and elastic hinge are constituted by a material containing silicon.

An eleventh exemplary embodiment of the present invention provides the mirror device according to the seventh exemplary embodiment, wherein the package substrate composed of a silicon material.

A twelfth exemplary embodiment of the present invention provides the mirror device according to the seventh exemplary embodiment, wherein the package substrate is constituted by a silicon nitride material.

A thirteenth exemplary embodiment of the present invention provides the mirror device according to the seventh exemplary embodiment, wherein the package substrate is constituted by a silicon carbide material.

A fourteenth exemplary embodiment of the present invention provides the mirror device according to the seventh exemplary embodiment, wherein the package substrate is constituted by a glass layer and a silicon layer.

A fifteenth exemplary embodiment of the present invention provides the mirror device according to the seventh exemplary embodiment, wherein the glass transition temperature of the fritted glass is no higher than 350 degrees C. and the melting point of the low-melt metal is no higher than 350 degrees C.

A sixteenth exemplary embodiment of the present invention provides a mirror device, comprising: a mirror element for modulating incident light emitted from a light source; a device substrate on which a drive circuit for driving the mirror element is placed; and a package substrate on which the device substrate is placed, wherein the package substrate is made of a substrate obtained by dicing a silicon semiconductor wafer.

A seventeenth exemplary embodiment of the present invention provides the mirror device according to the sixteenth exemplary embodiment, wherein the semiconductor wafer is a recycled component.

An eighteenth exemplary embodiment of the present invention provides the mirror device according to the sixteenth exemplary embodiment, wherein the semiconductor wafer is the same size as that of a semiconductor wafer producing the mirror device.

A nineteenth exemplary embodiment of the present invention provides the mirror device according to the sixteenth exemplary embodiment, wherein the package substrate comprises a wiring or a circuit.

A twentieth exemplary embodiment of the present invention provides a mirror device, comprising: a cover glass transmitting incident light; a device substrate on which both a plurality of mirror elements for modulating the incident light and a drive circuit are formed; and a package substrate on which the device substrate is fixed, wherein the total thickness of the cover glass and package substrate, with both of them fixed together, is no more than 3 mm.

A twenty-first exemplary embodiment of the present invention provides the mirror device according to the twentieth exemplary embodiment, wherein the coefficient of linear expansion of the package substrate is no larger than $5*10^{-6}$/K.

A twenty-second exemplary embodiment of the present invention provides the mirror device according to the twentieth exemplary embodiment, wherein the package substrate or cover glass has a cavity in which the device substrate is placed.

A twenty-third exemplary embodiment of the present invention provides the mirror device according to the twentieth exemplary embodiment, wherein the thickness of the package substrate is no more than 1 mm.

A twenty-fourth exemplary embodiment of the present invention provides the mirror device according to the twentieth exemplary embodiment, wherein the distance between the bottom surface of the cover glass and the top surface of the mirror is no less than 0.1 mm.

A twenty-fifth exemplary embodiment of the present invention provides the mirror device according to the twentieth exemplary embodiment, wherein the thickness of the package substrate is different from that of the cover glass.

A twenty-sixth exemplary embodiment of the present invention provides a mirror device, comprising a plurality of device substrates and a package substrate on which a device substrate is placed and connected, wherein the package substrate comprises a plurality of cavities.

A twenty-seventh exemplary embodiment of the present invention provides the mirror device according to the twenty-sixth, wherein the package substrate is made of glass or a silicon material.

A twenty-eighth exemplary embodiment of the present invention provides the mirror device according to the twenty-sixth, wherein the package substrate comprises a wiring connected to the device substrate, wherein a part of the wiring constitutes a heat-conducting circuit-wiring for conducting and transmitting the heat.

A twenty-ninth exemplary embodiment of the present invention provides the mirror device according to the twenty-sixth, wherein the package substrate comprises a wiring connected to the device substrate, wherein a part of the wiring is equipped with an alignment mark that is to be used when placing the device substrate.

A thirtieth exemplary embodiment of the present invention provides a mirror device, comprising: a cover glass transmitting incident light; a device substrate on which a plurality of mirror elements for modulating the incident light and a drive circuit are placed; and a package substrate on which the device substrate is fixed and which comprises a wiring, wherein an alignment mark for establishing the positional relationship with the device substrate is provided on the package substrate.

A thirty-first exemplary embodiment of the present invention provides the mirror device according to the thirtieth exemplary embodiment, wherein the alignment mark also fills the role of the wiring.

The packages according to the above-noted respective exemplary embodiments of the present invention are configured to position the mirror device in relation to the glass substrate or ceramic substrate, in which the configuration of the difference between a reference surface and the mirror surface of a mirror element can be designated at no more than 20 micrometers, where the top surface of the glass substrate or ceramic substrate is defined as the reference surface.

The projection apparatus using the mirror device according to the above-noted respective exemplary embodiments of the present invention can be configured to comprise a laser light source for emitting a light flux with the numerical aperture NA being larger than 0.07 and a projection lens with the F number being smaller than 7.2, wherein the deflection angle of each deflectable mirror of a plurality of mirror elements, which reflect the light flux enlarged by an illumination optical system, is designated at any angle between ±4 degrees and +13 degrees clockwise (CW) in relation to the horizontal direction of the mirror.

The projection apparatus using the mirror device according to the above-noted respective exemplary embodiments of the present invention can be configured such that the individual sides of the deflectable mirror of a mirror element for reflecting the light flux enlarged by an illumination optical system are not parallel to the respective sides of a package, and the optical axis of the incident light from a laser light source is in the positional relationship that is the right angle relative to the plane direction of a mirror array or to any of the individual sides of the package.

The present invention discloses a package for a mirror device to improve the efficiency of heat dissipation through heat conduction, convection and radiation.

This invention also discloses a projection apparatus using a mirror device accommodated by the package with improved efficiency of heat dissipation through heat conduction, convection and radiation.

This invention further discloses a package with improved efficiency of heat dissipation through heat conduction, convection and radiation, and a package compatible with a miniaturized mirror device.

BRIEF DESCRIPTION OF THE DRAWINGS

The present invention is described in detail below with reference to the following figures.

DESCRIPTION OF THE PREFERRED EMBODIMENTS

The following detail descriptions are for the preferred embodiment of the present invention with reference to the accompanying drawings.

Embodiment 1-1

The following description explains the configuration of a package according to a preferred embodiment 1-1 of the present invention.

Figure 1A:
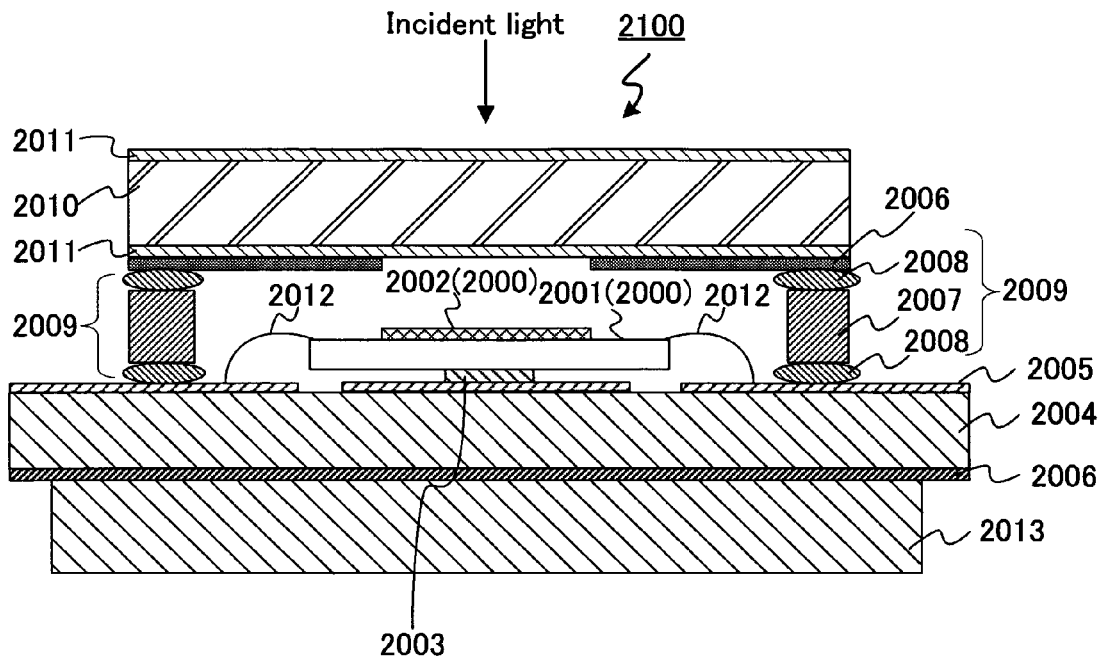
FIG. 1A is a front cross-sectional diagram of an assembly supported on a package substrate for packaging a mirror device with a cover glass.

FIGS. 1A through 1E show the assembly 2100 that contains the mirror device 2000 in a glass package. The mirror device 2000 corresponds to the spatial light modulator 5100 described later. FIG. 1A is a front cross-sectional diagram of the assembly 2100 that contains and protects the mirror device 2000 in a glass package.

The assembly 2100 includes a package substrate 2004 made of a glass material, a cooling/radiation member (heat sink) 2013, an intermediate member 2009, a thermal conduction member 2003, a mirror device 2000 and a cover glass 2010. Here, the "package" generally refers to the parts assembled together as a container unit for containing and protecting the mirror device 2000. As an example, the package substrate 2004 formed with glass material, cooling/radiation member (heat sink) 2013, intermediate member 2009, thermal conduction member 2003 and cover glass 2010, which are shown in FIG. 1A, are parts that assembled into the package.

The following is a description of each individual part of the assembly 2100 shown in FIG. 1A.

[Package Substrate 2004]

The package substrate 2004 is formed with a glass material is joined to the heat conducting member 2013 used for conducting the heat from the package substrate 2004, to the thermal conduction member 2003. The heat is then conducted from the package substrate 2001, and to the intermediate member 2009 used for creating a sealed space together with the cover glass 2010.

A circuit-wiring pattern 2005 is used for forming an electrical conduction from the mirror device 2000 to the device substrate 2001 of the mirror device 2000. A heat conducting-circuit wiring-pattern 2014 (refer to FIG. 1B) is used for radiating the heat inside of the package to outside thereof. The heat conducting-circuit wire-patterns 2014 are placed on the upper surface of the package substrate 2004. A large number of circuit wiring patterns 2005 are thus wired on the upper surface of the package substrate 2004. As a result, the pitch between the individual wiring is very much narrowed. Therefore, a ground wiring is preferably placed between individual wirings to prevent noise generated between the wirings. Moreover, an insulation layer is preferably coated uniformly on the upper surface of the package substrate 2004 in case the upper surface of the package substrate 2004 is not smooth, and the circuit wiring patterns 2005 is preferably placed on the coated surface.

The term "inside of the package" noted in the present specification document represents a space surrounding the mirror device 2000 inside the package, For example, the space in which the mirror device 2000 is sealed by the package substrate 2004, cover glass 2010 and intermediate member 2009 is called the "inside of the package" in FIG. 1A.

A light shield layer 2006 used for absorbing extraneous light, which transmits through the upper surface of the package substrate 2004, is placed on the bottom surface of the transparent package substrate 2004 made of a glass material. By placing the light shield layer 2006 with a good thermal conductivity on the bottom surface of the package substrate 2004 greatly improve heat dissipation to the space outside of the package. The light shield layer 2006 may be substituted by forming on the surface of a silicon material or a metallic material with a black coating.

Furthermore, the cooling/radiation member (heat sink) 2013 includes a radiation plate that further has a fan. A metallic radiation member is preferably joined onto the bottom surface of the package substrate 2004 in order to effectively conduct and dissipate the heat from the package substrate 2004. A package substrate 2004 with a larger surface area improve the rate of heat conduction.

Further, it is preferable to use a glass material that has better thermal conductivity for the package substrate 2004. For example, soda ash glass with the thermal conductivity being about 0.55 to 0.75 W/mK, and Pyrex (a registered trademark; used to be manufactured by Corning, Inc.; now by World Kitchen, LLC) exceeding 1 W/mK, are available.

[Circuit Wiring Pattern 2005 and Heat Conducting Circuit Wiring Pattern 2014]

The circuit-wiring pattern 2005 is the wiring of a control circuit for controlling the mirror device 2000 and is electrically connected to the device substrate 2001. The radiation-circuit wiring-pattern 2014 transfers the heat inside of the package to the outside. The heat conducting circuit wiring pattern 2014 has large wiring widths, and is placed across the inside and outside of the package on the package substrate 2004. This configuration makes it possible to transfer the heat generated inside the package to the outside space surrounding the package through the heat conducting-circuit wiring-pattern 2014. Meanwhile, the heat may also be radiated by way of the circuit-wiring pattern 2005, which has a large number of small-width wirings.

The metallic material for forming the heat conducting circuit wiring pattern 2014 may include materials such as tungsten (W), aluminum (Al), gold (Au), silver (Ag), copper (Cu), silicon (Si) or magnesium (Mg), with a thermal conductivity of 150 W/mK or higher. These metallic materials can also be used as thermal conductive members. Further, the heat conducting circuit wiring pattern 2014 serves an additional function because the heat transmission and the electrical connection are also useful for removing noise from the device substrate 2001.

In this application to a mirror device in an image projection system, when the mirror device 2000 includes one million to four million mirror elements when controlled by signals of 10 bits, a very large number of data that a high-speed data transfer is required. Therefore, the resistance on a circuit wiring and the floating capacity of a capacitor greatly affect the speed of data transfer. Therefore, the circuit wiring pattern 2005 is preferable implemented with a material with a small resistance in the temperature range 0° through 100° C. Such material may include aluminum (2.5- to $3.55*10^{-8}$ Ωm), tungsten (4.9- to $7.3*10^{-8}$ Ωm), gold (2.05- to $2.88*10^{-8}$ Ωm) and copper (1.55- to $2.23*10^{-8}$ Ωm).

[Cooling/Radiation Member 2013]

The cooling/radiation member (heat sink) 2013 is disposed onto the bottom surface of the package substrate 2004, and is a thermal conduction member, to carry out the function of transferring the heat conducted from the package substrate 2004.

The cooling/radiation member 2013 includes a radiation plate equipped with one or a plurality of fans or with a metallic radiation member. The metallic radiation member may be attached directly to the bottom surface of the package substrate 2004 or may be attached to another member made of a material with a coefficient of linear expansion that is approximately the same as that of the package substrate 2004. Moreover, the cooling/radiation member 2013 may be thermally connected to the package substrate 2004 by penetrating it with a metallic Via or embedding it. Furthermore, a metallic cooling/radiation member 2013 formed with a black surface by a covering with a light shield layer is disposed on the bottom surface of the package substrate 2004. This configuration serves dual functions as a light shield and a heat-conducting path to a heat sink or a free space.

[Intermediate Member]

The intermediate member 2009 is placed on the top surface of the package substrate 2004 and supports the cover glass 2010 for, providing a sealed space between the package substrate 2004 and cover glass 2010. In particular, dust or small particles fall upon and adhere to the top or bottom surface of the cover glass 2010 have adverse effect on the quality of the projected image. Therefore, when a sealed space is between the package substrate 2004 and cover glass 2010, the distance between the top surface of the mirror of the mirror device 2000 and the cover glass 2010 is desired to secure no less than seven times the depth of focus, i.e., the focal length, of a projection optical system. For example, a large distance is preferred between the top surface of the mirror of the mirror device 2000 and the cover glass 2010. Since dust or small particles may sometimes adhere to the product in the production process of the mirror device 2000 or that of the projection apparatus, therefore, the cover glass 2010 is preferably placed apart from the mirror with a distance equivalent to at least the depth of a focal length.

Considering the situation that the dust or foreign particles may sometimes fall upon a coating surface in the process of coating the cover glass with an anti-reflection (AR) layer and the foreign particles cannot be removed. Therefore, it is desirable to place the coated cover glass at a distance greater than the focal length of the projection length such that the image of the foreign particles will not be shown in the displayed images. When a laser light source or a similar light source is used, diffraction light and scattered light tend to be generated from the light irradiated on dust or foreign materials, and therefore, it is desirable to place the cover glass at a position apart from the mirror element when a laser is used as the light source.

The intermediate member 2009 includes an intermediate part 2007 for regulating the height of the cover glass 2010. A seal material 2008 is made of fritted glass (i.e., granulated glass) or a low melting point metallic material such as solder. The intermediate part 2007 may use a fritted glass as the same material of the seal material 2008. Furthermore, the package substrate 2004 may be integrated with the intermediate part 2007 by using a package substrate 2004 with cavity.

The substrate 2004 is composed of a glass material, The cover glass 2010 is joined to the package substrate 2004 by welding with the fritted glass, i.e., a granulated glass to function as the intermediate member 2009, or a low-melting point metallic material such as solder with the seal material 2008. For example, the fritted glass is coated, as the seal material 2008, on the joinder surface between the package substrate 2004 and cover glass 2010. Then, they are put into an electric furnace. Then, the joinder surface is stacked together from the top and bottom with a heater or a welding apparatus and is welded, thereby accomplishing the joining.

In particular, the seal material 2008 is used preferably with glass with a low-melting point, i.e., the glass transition temperature being no higher than 400° C., or a metallic material with a melting point being no higher than 400° C. The reason is that an aluminum circuit wiring and the like are formed on the device substrate 2001 in a semiconductor process, and that the constituent components of the device substrate 2001 are unable to withstand a temperature no lower than 400° C. for an extended period of time.

For example, the mirror of a mirror element is made of an aluminum layer with thickness of about 1500 angstroms to 3000 angstroms and is supported by an elastic hinge that is 200 angstroms to 700 angstroms thick. The elastic hinge also uses aluminum or the like. Therefore, the mirror, elastic hinge, and the aluminum circuit wiring are unable to withstand a temperature no lower than 400° C. for an extended period of time. If a temperature no lower than 400° C. is continuously applied for an extended period of time, the heat will cause the internal stress of the elastic hinge to be changed. As a result, the positions of the mirror may be changed, which could cause malfunction of the mirror device.

The seal material 2008 may use a low-melting point glass with the glass transition temperature being no higher than 350° C. or a metallic material with the melting point being no higher than 350° C. The usage of such a low-melting point material makes it easy to carry out welding. Low-melting point glass includes a seal member made of, for example, fritted glass. While the fritted glass allows different melting points and thermal expansion, depending on the material, it is generally used in many cases including the barium oxide (BaO)-series and the lead oxide (PbO)-series lead glass with good fluidity and sealing property.

Furthermore, unleaded glass, with a glass transition temperature between 300° C. and 400° C. has been developed in recent years. Unleaded glass includes a material obtained, for example, by adding $TeO_2$ or $P_2O_5$ to, a $V_2O_5$—ZnO—BaO component series material. The coefficient of linear expansion of this type of materials is about 6- to $7*10^{-6}$/K and has good fluidity and sealing property.

Several materials with a melting point between 200° and 400° C. are available as low melting point metallic materials. For example, an Au 80-Sn 20 alloy has a melting point between 260° and 320° C. In addition, an alloy such as Sn 80-Ag 20 that is a tin series high-temperature solder has a melting point between 220° and 370° C., and likewise, Sn 95-Cu 5 has a melting point between 230° and 370° C. Additionally, indium (In) has a melting point of about 157° C. The use of the intermediate material 2009, made of the above, showed that low melting point material makes it easy to carry out welding. The intermediate member 2009 preferably uses a material possessing a coefficient of linear expansion approximately the same as that of a non-alkali glass, such as the material used for the package substrate 2004 and that of a silicon substrate used for the device substrate 2001, or a material with a coefficient of linear expansion between the ranges of aforementioned coefficients of linear expansion.

Meanwhile, the package substrate 2004 may also be configured to have a cavity structure comprising an intermediate part that constitutes walls on all sides, and the intermediate part 2007 reduces a member(s) requiring consideration for a coefficient of linear expansion by making it a formation configured by the form of the package substrate 2004.

In this exemplary embodiment, the device substrate 2001 is placed in the concave part. The concave part is formed by etching, or other similar processes at the center part of the package substrate 2004. Furthermore, the parts of the substrate surrounding the device substrate 2001 serve the function as the intermediate part 2007.

Furthermore, the package substrate 2004 may be formed with the same silicon material as that of the device substrate 2001. In such a case, the package substrate 2004 is opaque and has the same coefficient of linear expansion as the device substrate 2001. The use of a silicon material makes it easy to open a cavity in the package substrate. Furthermore, opening a cavity in the center part of the package substrate 2004 can be conveniently carried out by applying a silicon etch process. Alternatively, a cavity structure can also be formed by further depositing a silicon material or the like on the circumference of the package substrate 2004 that is made of a silicon material. Meanwhile, the silicon material may use an 8- to 10-inch silicon wafer in the production process for the device substrate 2001. Using the glass for the package substrate 2004 also reduces the material cost. The using of such a silicon material makes it easy to handle the forming of a cavity and that of a three-dimensional feature. Furthermore, the package substrate 2004 may use a ceramic material when forming a three-dimensional form using a mold. Moreover, the package substrate 2004 may be formed as a metallic substrate. One aspect of the present invention is achieved by joining together the cover glass and the package substrate in which the device substrate 2001 produced in the minimum size is placed and by selecting the optimal material, for the intermediate member used in the joinder part, in terms of a coefficient of linear expansion and melting temperature.

[Thermal Conduction Member 2003]

The thermal conduction member 2003 is joined to the device substrate 2001 and package substrate 2004. Further, the thermal conduction member 2003 receives, by way of the device substrate 2001, the heat generated by the light and the like irradiated after it passes the gap between mirrors of the mirror device 2000, and conducts the heat to the heat conducting circuit wiring pattern 2014 and package substrate 2004, thereby mediating the heat transmission out from the package.

Referring to FIG. 1A, the light absorbed in the surface of the mirror and the light passing through the gap between mirrors to be absorbed by the device substrate 2001 are both turned into heat. Then, the heat is conducted to, and radiated from, the top surface of the package substrate 2004 that is joined with the thermal conduction member 2003 by way of the thermal conduction member 2003 that is joined to the bottom surface of the device substrate 2001. The thermal conduction member 2003 can also heat conducting circuit wiring pattern 2014.

The thermal conduction member 2003 preferably uses a material possessing a good thermal conductivity to the device substrate 2001 and package substrate 2004. Preferably, it uses a material containing a substance (e.g., tungsten, silicon, aluminum, gold, silver and magnesium) with the thermal conductivity of no less than 150 W/mK. The silicon (Si) is the primary element to form the device substrate 2001 that has a thermal conductivity of 168 W/mK. Furthermore, it is preferable that the thermal conduction member 2003 is selected from a material by considering its coefficient of linear expansion. For example, at the ambient temperature (i.e., 20° C.), tungsten possesses a coefficient of linear expansion of $4.5*10^{-6}$/K, while tantrum possesses one of $6.3*10^{-6}$/K. A tungsten silicide, which is produced by the reaction between tungsten and silicon (Si), and a tantrum silicide, which is produced by the reaction between tantrum and Si, possess coefficients of linear expansion close to that of the material used for the device substrate 2001, which contains Si possessing a coefficient of linear expansion of $2.6*10^{-6}$/K, or close to the coefficient of linear expansion of the package substrate 2004 made of a silicon material or glass material. Therefore, they are suitable to the thermal conduction member 2003.

[Mirror Device 2000]

The mirror device 2000 that includes mirror array 2002 is formed on the device substrate 2001. The mirror device is then placed on the thermal conduction member 2003 attached to the package substrate 2004

In FIG. 1A, the bottom surface of the device substrate 2001 of the mirror device 2000 is joined with the thermal conduction member 2003, and the mirror device 2000 joined with the thermal conduction member 2003 is placed on the package substrate 2004. Then, an electrode pad placed on the top surface of the device substrate 2001 is connected, by a wire 2012, to an electrode pad placed in the circuit-wiring pattern 2005 that is on the top surface of the package substrate 2004. For example, the material for the wire 2012 is preferably a high-thermal conductive material, such as gold, so that the heat of the device substrate 2001 can also transmitted through the wire 2012.

Furthermore, the mirror array 2002 supported on the device substrate 2001 includes plurality of mirror elements arranged as mirror arrays in two dimensions reflects the light emitted from a light source, and then transmitted through the cover glass, and controls the direction of the reflection light.

The heat of the light absorbed in the individual mirrors of the mirror array 2002 is conducted to the device substrate 2001 by way of structures such as the elastic hinge and post, which constitute the mirror element. Then, the heat is conducted from the device substrate 2001 to the thermal conduction member 2003, and then radiated to outside of the package from the package substrate 2004 and other members. Therefore, it is preferable for the elastic hinge and post to use a material possessing high thermal conductivity.

For example, the elastic hinge, which is a few hundred angstroms thick and a few micrometers wide, uses a material containing Al, W or Si, which possess good thermal conductivity, in order to prevent a deformation due to the heat. For a good thermal conductivity material containing Al, W or Si, a silicon material possessing a thermal conductivity of 168

W/mK, and an aluminum material of about 236 W/mK, and similar materials, are appropriate.

The silicon materials are available in several crystallization states such as amorphous silicon, poly-silicon and single crystal silicon, from which the most optimal material is selected in consideration its property as a spring. In the meantime, considering thermal conduction, it is preferable that other members linked to the elastic hinge use a material possessing thermal conductivity of at least 150 W/mK.

Therefore, it is possible to effectively conduct the heat of the light absorbed in the mirror and the heat generated by the operation of the mirror element to the device substrate 2001 by selecting the material described above for the elastic hinge or the member linked thereto and accordingly, to radiate heat from the device substrate 2001 to the outside by way of the thermal conduction member 2003 and the related components.

[Cover Glass 2010]

The cover glass 2010 is designed to be smaller than the package substrate 2004 for the purpose of covering the upper side of the mirror device 2000. The cover glass 2010 is joined to the package substrate 2004 using the intermediate member 2009. The cover glass 2010 mainly protects the mirror device 2000 from, for example, external moisture and dust.

An anti-reflection (AR) coating 2011 is applied to the top and bottom surfaces of the cover glass 2010, and thereby, the light reflected by the top surface of the cover glass 2010 is not reflected toward the projection lens. Further, the AR coating 2011 prevents the light reflected by the mirror array 2002 from being further reflected by the bottom surface of the cover glass 2010, and thereby, the diffuse reflection of the light is prevented. The preventing of the diffuse reflection enables the AR coating to prevent extraneous light from entering the mirror device 2000, generating heat inside of the package and degrading the contrast of an image.

Furthermore, either one of the top and bottom surfaces of the cover glass 2010, or both surfaces, are partially provided with the light shield layer 2006 for preventing extraneous light from entering the mirror device 2000. In FIG. 1A, the light shield layer 2006 is formed on the bottom surface of the AR coating 2011, which is applied to the bottom surface of the cover glass 2010.

While a cover glass is placed to nearly touch a liquid crystal layer in a liquid crystal device in a mirror device, it is preferable that a cover glass is placed by maintaining a distance of, for example, 0.1 mm to 1 mm between the mirror and the bottom surface of the cover glass. Such a setup makes it possible to allow a certain degree of freedom for the roughness of the cover glass surface. For example, the roughness, about 0.15 μm- to 0.3 μm per 20 mm, for the bottom surface of the cover glass is permissible. Further, the cover glass surface may be polished to about 0.05 μm- to 0.15 μm per 20 mm.

[AR Coating 2011]

An anti-reflection (AR) coating 2010 is applied to either one of the top and bottom surfaces of the cover glass 2010, or both surfaces, to prevent a reflection on the surface of the cover glass 2010 and to prevent the light reflected by the mirror array 2002 from diffusely reflecting internally within the package.

The AR coating 2011 can be applied, for example, by coating magnesium fluoride ($Mg_2F$) on a glass surface, or applying a processed glass material as a nanostructure, therefore, the reflectance of the incident light can be limited to be no higher than 0.4%.

A coating layer on a glass surface is formed by applying a multi-coating process to eliminate dependence on various wavelengths and the incident angle. Multi-coating corresponding to wide wavelength range is also viable.

When processing a nanostructure, fine particles are layered with a gelatinous material and then metallic particles are thermally removed, and thereby, a fine form can be formed. Note that adopting the method for processing a nanostructure makes it possible to cause the layer to respond to a wide wavelength range in an easier manner than a multi-coating that layers an inorganic material.

The application of such AR coating 2011 reduces the reflection light intensity oriented from the cover glass 2010 to the projection lens, thereby enhancing the contrast of an image. Further, a large volume of light is projected to the mirror array 2002. Considering this fact, the AR coating 2011 is preferably applied to that can most effectively reduce the reflection of the incident light.

Among projection apparatuses projecting a color image by modulating, with a mirror array 2002, the illumination light of, for example, the respective colors red (R), green (G) and blue (B) in accordance with an image signal, there is a projection apparatus in which the brightness is enhanced by increasing the intensity of green light evenly with the trade-off of the color balance among R, G and B. In such a case, an application of the optimal AR coating 2011 to the green light makes it possible to effectively enhance the brightness.

A multi-panel projection apparatus, comprising a plurality of the mirror devices 2000 respectively corresponding to a plurality of illumination lights, such as R, G and B, it is preferable to provide it with AR coating 2011, by applying a multi-coating or single layer coating, either of which is optimal to the respective illumination lights.

Further, if a light source used for a projection apparatus is a mercury lamp and the like, the numerical aperture NA of the light is larger than that of a laser light source, and the light, even as green light, contains many wavelengths, and therefore the deflection angle of a mirror of the mirror device 2000 is designated, for example, at ±13 degrees. If there is such a degree of difference in angles of the deflection angle between the incident light and reflection light on the basis of the deflection angle of the mirror, the dependence on the incident angle is reduced by applying a multi-coating in consideration of the optical path lengths of the incident light and reflection light passing through the cover glass.

In contrast, in the case of a laser light source, the numerical aperture NA is smaller than that of a mercury lamp and the light has a single wavelength, and therefore the deflection angle of the mirror of the mirror device 2000 can be designated in the range of ±4 degrees and ±8 degrees. Therefore, the angular difference between the incident light and reflection light can be reduced by using the mercury lamp. As a result, the optical path lengths of the incident light and reflection light passing through the cover glass can be shortened by using the mercury lamp. Therefore, a sufficient effect can be obtained by applying a single layer coating with a thickness of about ¼ wavelength of the incident light to optimize it for the wavelength of the incident light. An alternative configuration may be applying an optical AR coating for the respective wavelengths R, G and B, with a reduced performance of an AR coating for other wavelengths.

Furthermore, when the deflection angles of a mirror in the ON state and OFF state are respectively ±13 degrees, the total deflection angle of the mirror is 26 degrees. Here, if the deflection angle is reduced to the range of ±4 degrees and ±8 degrees, the total deflection angle is reduced to the range of ±8 degrees and ±16 degrees. This configuration makes it possible to reduce the difference in light transmissions between the incident light and reflection light passing through the AR coating 2011 formed on the cover glass.

Meanwhile, although it is difficult for the illumination light reflected by the cover glass to head for the direction of the projection light path, the projection light reflected by the cover glass can repeat diffused reflections in various directions after re-incident to the mirror array. Therefore, it is preferable to improve the transmission of light for the reflection light.

Furthermore, a transparent member placed between the mirror array 2002 and cover glass 2010 increases the surface reflection surface of the transparent member, reducing the contrast. Therefore, it is preferable for the space inside of the package is to form a sealed structure between the cover glass 2010 and package substrate 2004 that is either kept in vacuum or filled with a gaseous body so that the space has a certain refractive index.

[Light Shield Layer 2006]

The light shield layer 2006 absorbs both the extraneous light irradiated onto the mirror device 2000 and the undesirable light reflected by it, thereby alleviating a temperature rise within the package. Further, the light shield layer, which uses a material with good thermal conductivity, also makes it possible to dissipate the heat and prevent the heat to transmit to the entirety of the package.

While a portion of light passing through the outer layer of the package to enter to the space inside of the package is absorbed by the light shield layer, the package assembly according to the configuration shown in FIG. 1A includes a light shield layer 2004 on the bottom surface of the package substrate 2004 further improving the transmission of the heat out from the package.

A light shield layer 2006 may form a layer with a black material containing carbon, or a layer, which easily transmits light, by means of an AR coating 2011 with a thin film coating. Alternatively, a layer of a silicon material may be placed onto the surface of a package substrate made of a glass material.

[Cover Glass 2010 and Package Substrate 2004]

The material for the cover glass 2010 and package substrate 2004 can use any glass materials, such as non-alkali glass, which are used for a thin-film transistor (TFT) liquid crystal, and in which an alkali component is limited to 1% or less, soda ash glass and low-alkali glass, which are used for a supertwist nematic (STN) liquid crystal, and high strain point glass used for a plasma display. A circuit and glass, however, are practically attached to each other in a liquid crystal, and therefore, when the soda ash glass is used, a protective film made of $SiO_2$ needs to be on a glass surface in order to prevent the elution of an alkali component from the glass and to prevent light that is diffusively reflected by the mirror device 2000. Further, borosilicate glass and barium borosilicate glass, which have a higher thermal resistance than that of soda ash glass, are also available.

According to a Laid-Open Japanese Patent Application Publication No. 2006-301153, a material with a coefficient of linear expansion of $10*10^{-6}$/K is used for a support member of a diffraction grating type device filled in a protective member. In contrast, the present embodiment is configured to use a material that has a coefficient of linear expansion less than $10*10^{-6}$/K in order to widen the limit range of the temperatures of the environment in operating the mirror device.

Although there are various types of non-alkali glass, the coefficients of linear expansion of many types fall between 4.6- and $4.8*10^{-6}$/K, with some of them falling between 3.7- and $3.8*10^{-6}$/K. Meanwhile, common soda ash glass and high strain point glass fall between 7.8- and $8.5*10^{-6}$/K.

Furthermore, a Laid-Open Japanese Patent Application Publication No. H11-116271 has disclosed a fritted glass of which the coefficient of linear expansion falls between about 7.2- and $9*10^{-6}$/K. Among the above described glass materials, the glass to be used for the cover glass 2010 and package substrate 2004 is preferably possess a coefficient of linear expansion that is no higher than $8.5*10^{-6}$/K. Further, preferably a material has a coefficient no higher than $5*10^{-6}$/K.

In the meantime, the device substrate 2001 of the mirror device 2000 is cut from a wafer made of a single crystal silicon material. The coefficient of linear expansion of silicon (Si), which is the main component of the device substrate 2001, is $2.6*10^{-6}$/K at normal temperature (20° C.). If a non-alkali glass that has a coefficient of linear expansion between 3.5- and $4.8*10^{-6}$/K is used for the cover glass 2010 and package substrate 2004, the difference in coefficients of linear expansion between them and device substrate 2001 is small. Due to thermal expansion, this in turn causes the difference in form changes between the glass package and device substrate 2001 to be reduced. Furthermore, it is preferable that the coefficient of linear expansion of the intermediate member 2009 connecting the cover glass 2010 and package substrate 2004 is also the same as that of the device substrate 2001, since a sufficient permissible stress exists against a deformation of the member due to temperature. Therefore, it is preferable to use the material(s) possessing approximately the same coefficient of linear expansion for the cover glass 2010 and package substrate 2004, and it is further preferable to use a material possessing a coefficient of linear expansion not higher than $5*10^{-6}$/K. A material possessing a coefficient of linear expansion not higher than $5*10^{-6}$/K may use silicon, which is the same material used for the device substrate 2001, and is the best material for preventing a deformation due to heat and radiating it. Furthermore, as a material with a low coefficient of linear expansion and a high thermal conductivity, a silicon carbide material with the thermal conductivity no lower than 40 Wm/K and the coefficient of linear expansion no higher than $5*10^{-6}$/K is available. Alternatively, an aluminum nitride material with the thermal conductivity no lower than 160 Wm/K and with the coefficient of linear expansion no higher than $5*10^{-6}$/K, or the like material, is also available. The thermal conductivity of aluminum nitride is close to that of silicon. Silicon possesses a high reflectivity of light, while it absorbs the visible light well. Many aluminum nitride materials are white, thereby not transmitting light like glass, and therefore, when silicon or the like material is used for a package substrate, it is preferable to equip the surface thereof with a light shield layer or an anti-reflection structure.

As described above, it is preferable that a package material, especially for a compact display device and a device on which an illumination light with strong intensity is irradiated, use a material such as silicon, silicon carbide, silicon nitride, in addition to transparent glass with a small coefficient of linear expansion.

Moreover, the package substrate may use a silicon (Si) wafer for forming a semiconductor. The application of a silicon substrate makes it possible to recycle an unusable wafer that failed in the semiconductor, as a package substrate. A wiring and a circuit can be formed on a package substrate made of a silicon wafer by a semiconductor process that is similar to that of producing a device substrate. In this case, if the wafer of the package substrate is the same size as that of the device substrate, they can be easily produced in the same semiconductor process. It is also possible to carry out processes (i.e., dicing, packaging, anti-stiction coating, cleaning and inspection) continuously after producing the device substrate and package substrate respectively on the wafer.

When a silicon wafer is used for a package substrate, it is easy to electrically connect a circuit placed on the device substrate with the wiring or circuit on the package substrate, and devise a countermeasure against a noise disrupting a high-speed transmission of electrical signals.

Furthermore, unless a complex configuration is used for a circuit placed on the package substrate, a lower cost semiconductor process than forming a semiconductor with the wiring and circuit, which are placed on the device substrate, can be employed for the package substrate. It is naturally possible to equip the package substrate with a complex circuit, such as memory and driver, and a relatively simple wiring for the purpose of an electrical conduction and/or thermal conduction.

Meanwhile, the thicknesses of the cover glass 2010 and package substrate 2004 may be configured to be as thin as 1 to 2 mm, or 0.5 to 1.5 mm for both, thereby optimizing the balance of thermal effects to the upper and lower glasses. Also, it is desirable that the heat conduction characteristics and the coefficients of linear expansion are matched with the thickness of the package materials. Furthermore, the thickness of the device substrate 2001 is no more than 1 mm, making it possible to limit the total thickness in the state of packaging to no more than 3 mm.

[Space Inside of Package]

The space inside of the package may be filled with a uniform gas, or kept as a near vacuum, while being shut-off from the atmosphere. If the space is filled with a gas with high thermal conductivity, the heat dissipation efficiency is improved. Furthermore, when is space is filled with an inert gas such as argon, it is possible to prevent the oxidization of metallic parts. Note that the thermal conductivity of nitrogen gas is $3.09*10^{-2}$ Wm/K, while that of argon is $2.12*10^{-2}$ Wm/K. Moreover, it is also possible to simplify the process by filling particles to serve the function as a countermeasure to stiction in the process of filling the space with an inert gas or a process before or after the gas filling process.

Further, it is desirable for the space between the cover glass and mirror element to have a uniform refractive index. If members with different refractive indices are placed, incident light and reflection light from the mirror are reflected on the boundary surface. The contrast of an image is reduced due to the extraneous reflection light.

Figure 1B:
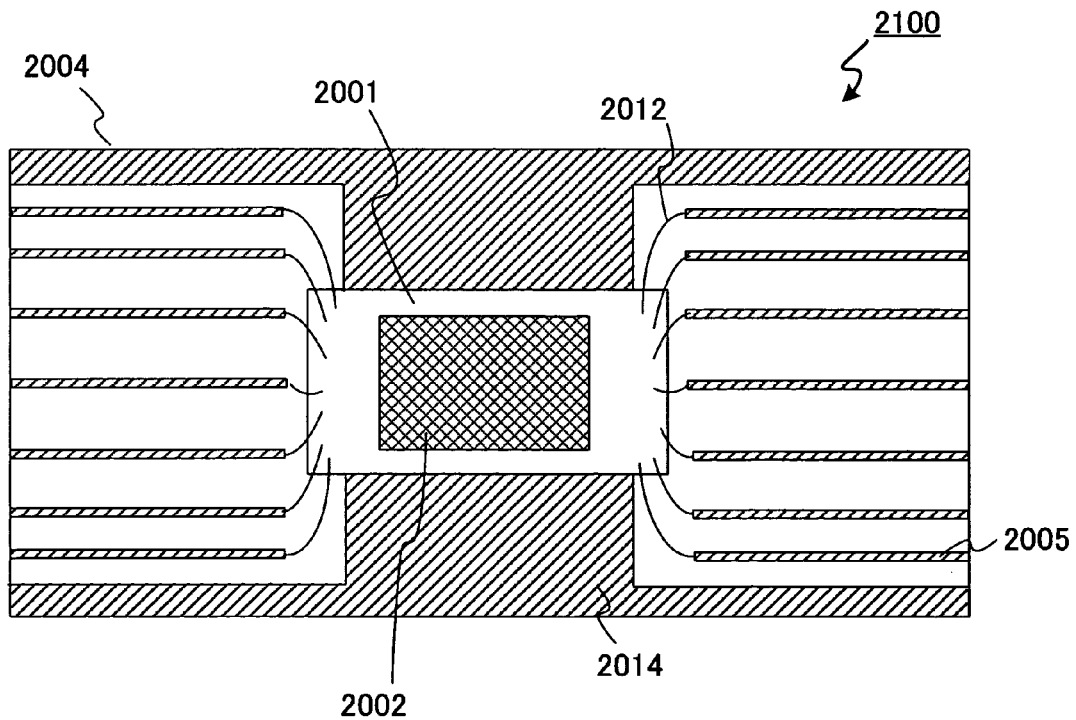
FIG. 1B is a top view diagram of the assembly shown in FIG. 1A, with the cover glass and intermediate member removed.

FIG. 1B is a plain view diagram of the assembly body 2100 shown in FIG. 1A, with the cover glass 2010 and intermediate member 2009 removed. The mirror array 2002 is formed on the device substrate 2001, and the device substrate 2001 is connected, via the wire 2012, to the circuit-wiring pattern 2005 placed on the package substrate 2004. The thermal conduction member 2003 (not shown in this drawing) is placed on the bottom surface of the device substrate 2001, and the configuration is such that the heat is conducted from the thermal conduction member 2003 to the package substrate 2004 and heat conducting circuit wiring pattern 2014, and is radiated to outside of the package.

Figure 1C:
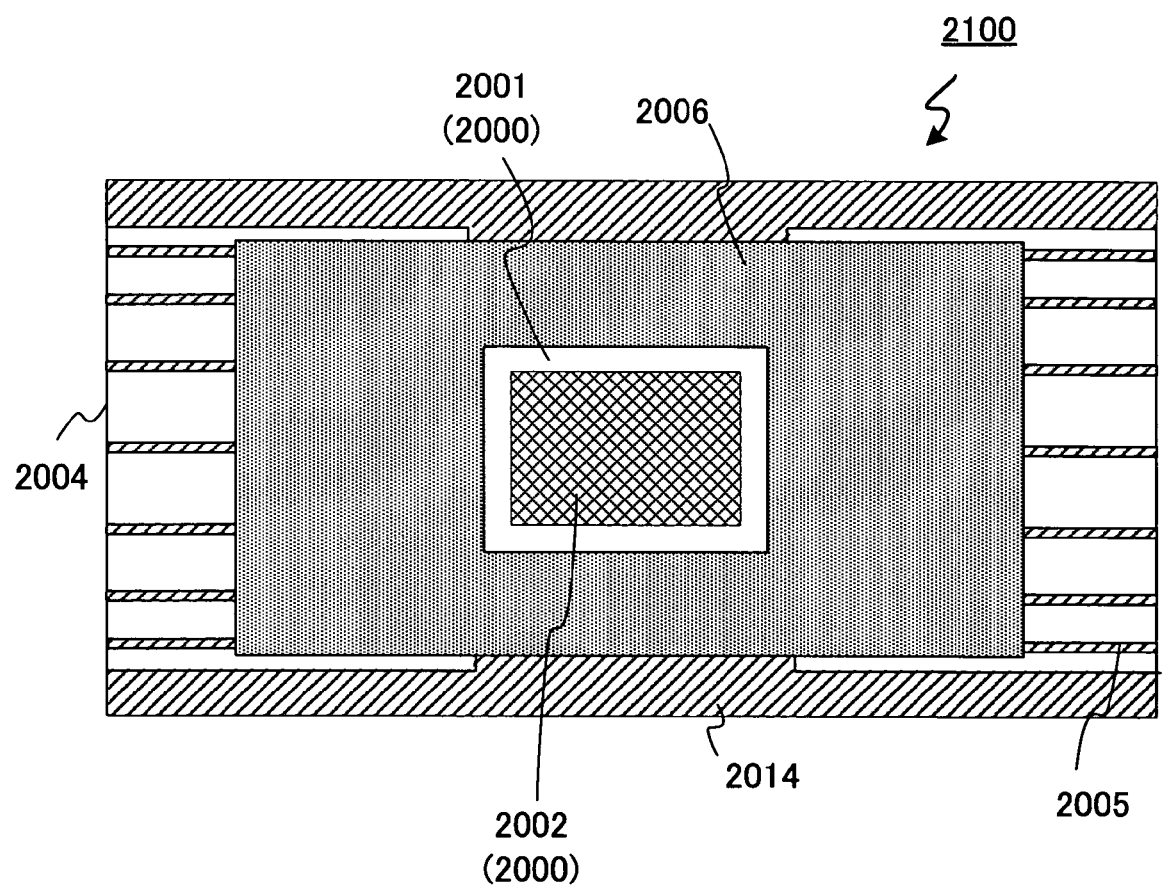
FIG. 1C is a top view diagram of the assembly shown in FIG. 1A.

FIG. 1C is a top view diagram of the assembly body 2100 shown in FIG. 1A. The comprising of the cover glass 2010 and intermediate member 2009 on the upper side of the assembly body 2100 shown in FIG. 1B enables the light shield layer 2006, which is applied to the bottom surface of the cover glass 2010, to absorb the light irradiated onto regions other than the mirror array 2002. The configuration further makes it possible to transmit the heat generated inside of the package through the heat conducting circuit-wiring pattern 2014, extending from the inside to outside of the package.

Figure 1D:
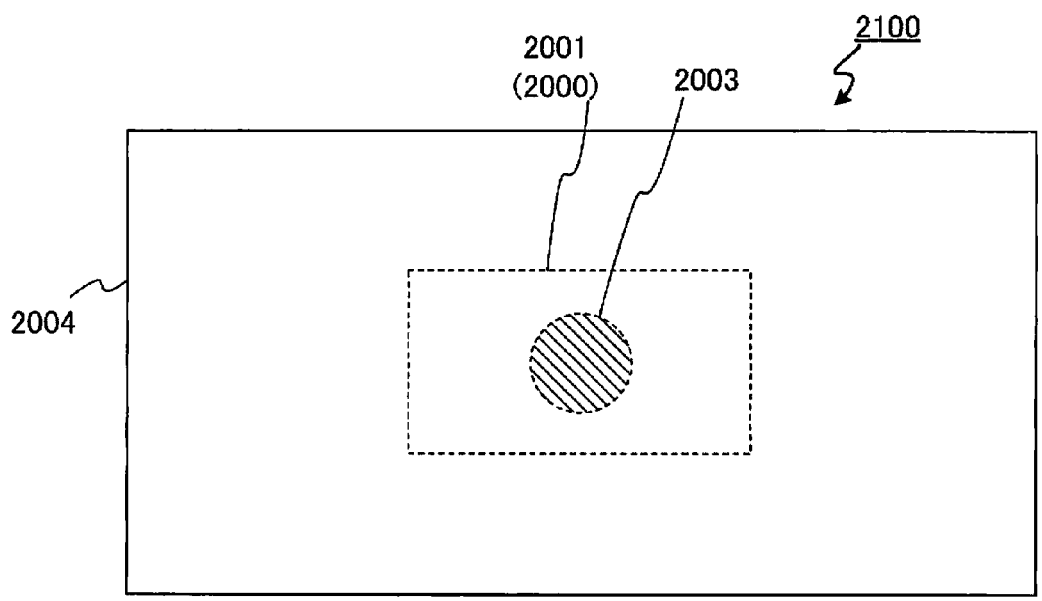
FIG. 1D is a bottom view diagram of the assembly shown in FIG. 1A, with a columnar thermal conduction member placed at the center of the bottom surface of a device substrate.
Figure 1E:
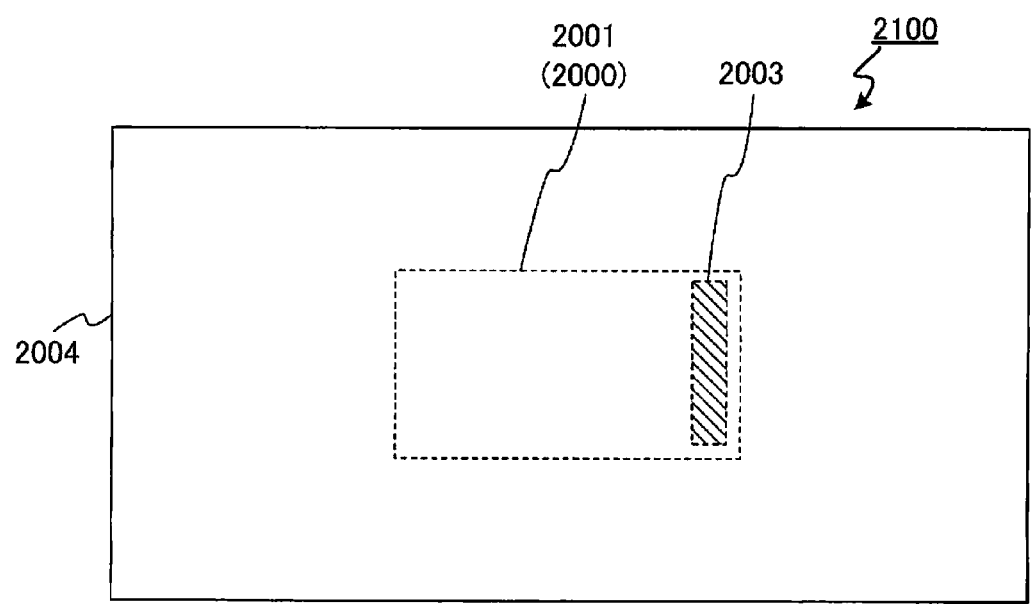
FIG. 1E is bottom view diagram of the assembly, shown in FIG. 1A, with a thermal conduction member placed along a side of the bottom surface of a device substrate.

FIGS. 1D and 1E are bottom view diagrams of the assembly body 2100 shown in FIG. 1A. Incidentally, the drawing of the cooling/radiation member (heat sink) 2013, light shield layer 2006 and circuit wiring pattern 2005 is omitted here to depict the location and shape of the thermal conduction member 2003.

The shape of the thermal conduction member 2003 may be flexibly configured and so is its position in the device substrate 2001. The shape and location for placement of the thermal conduction member 2003, however, need to consider the change in shapes due to thermal expansion, since the thermal conduction member 2003 is closely placed with the device substrate 2001.

FIG. 1D shows an exemplary embodiment for placing the columnar thermal conduction member 2003 at the center of the bottom surface of the device substrate 2001.

Conducting of heat through the columnar thermal conduction member 2003 results in thermal expansion that causes the thermal conduction member 2003 to expand as a concentric column. This phenomenon causes the positions of the device substrate 2001 placed on the thermal conduction member 2003 to change, further creating a change of the positions of the mirror of the mirror array 2002. The configuration, however, is contrived because the columnar thermal conduction member 2003 deforms at the center of the device substrate 2001. The optical axis shift that may at the center of the screen can be limited to a minimum. Further, the device substrate 2001 is stabilized with the placement of the thermal conduction member 2003 at the center of gravity position of the device substrate 2001, In the alternate configuration of FIG. 1E, a rectangular-shaped thermal conduction member 2003 is placed in line with the bottom surface of the device substrate 2001. This configuration makes the other side of the device substrate 2001 a free end. Therefore, the problem caused by different thermal expansions of the device substrate 2001 and package substrate 2004 are alleviated. This fact widens the degree of freedom in selecting a glass material, and broadens the temperature range of the environment in which the device substrate is used.

Note that it is preferable to replace one piece of the thermal conduction member 2003 for a part of one piece of the device substrate 2001. The reason is that a placement of multiple thermal conduction members requires an attention to the fact there are different degrees of deformation of those thermal conduction members 2003.

Embodiment 1-2

A package according to a preferred embodiment 1-2 is an exemplary modification of that of embodiment 1-1.

The package according to the embodiment 1-2 is configured to have a separate package substrate, or to have an opening part in the package substrate, which is the different from the package according to the embodiment 1-1. Further, the package improves the efficiency heat dissipation by placing the opening part of the package substrate under the mirror device. In this case, a seal member similar to the intermediate member is placed between the device substrate and package substrate for joining them together, and thereby, a contact between the inside and outside of the package is removed.

Further, it is possible to transmit the heat out from the package directly from the device substrate by way of a thermal conduction member connecting it to the bottom surface of the device substrate of the mirror device. Therefore, an alternative configuration may be provide by eliminating the thermal conduction member. Furthermore, the efficiency of heat transmission can be improved by providing a heat sink formed with heat dissipating fins with heat cooling and heat dissipation function in the opening part of the package substrate.

Figure 2A:
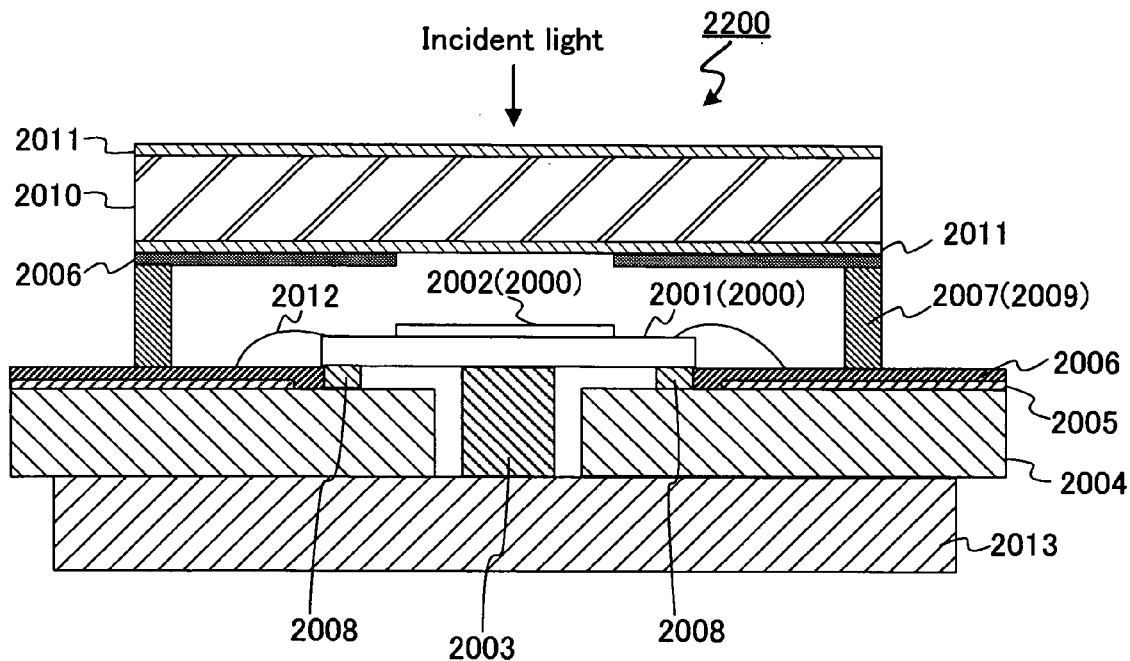
FIG. 2A is a front cross-sectional diagram of an assembly supported on a package substrate for containing a mirror device with an opening part.
Figure 2B:
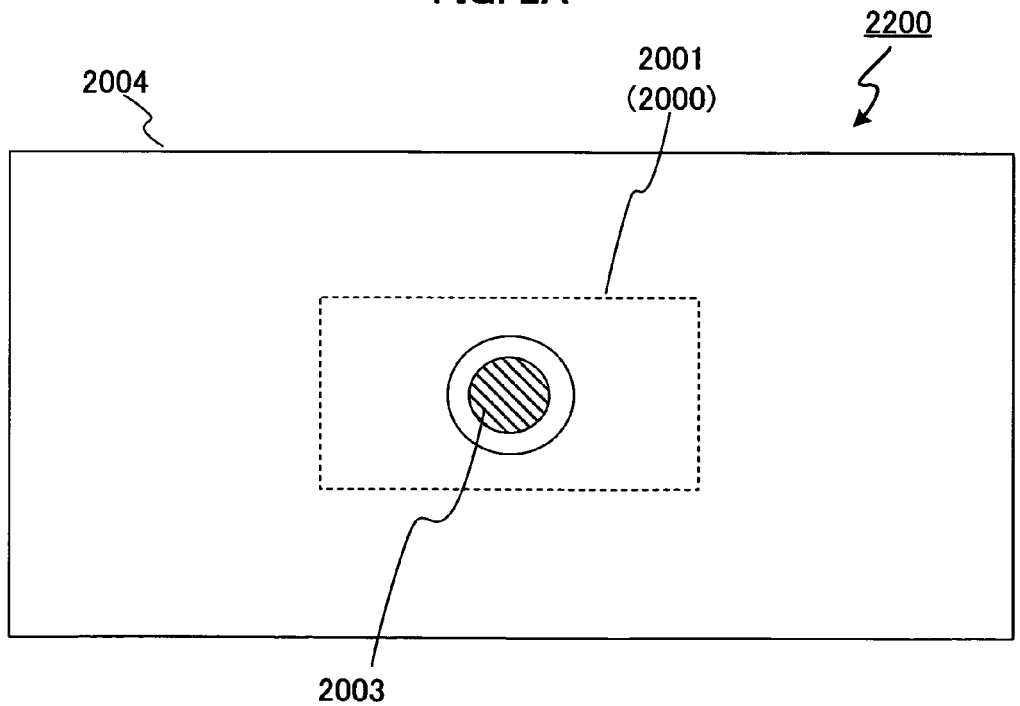
FIG. 2B is a bottom view diagram of the assembly shown in FIG. 2A.

FIGS. 2A and 2B show the assembly body 2200 that packages the mirror device 2000 using a package substrate 2004 having an opening part, as a preferred embodiment 1-2. FIG. 2A is the front cross-sectional diagram of the assembly body 2200 that packages the mirror device 2000 using the package substrate 2004 that has an opening part.

In the assembly body 2200 shown in FIG. 2A, the package substrate 2004 has an opening part, where the thermal conduction member 2003 joined to the mirror device at the center of the opening part is placed. Here, the top surface of the thermal conduction member 2003 is joined to a device substrate 2001 and the bottom surface of the thermal conduction member 2003 is joined to a cooling/radiation member (heat sink) 2013 that is a large thermal conduction member. This configuration makes it possible to externally radiate the heat conducted from the device substrate 2001 directly. A space is provided between the opening part of the package substrate 2004 and the thermal conduction member 2003, so that the heat can be transmitted from such a space by way of the cooling/radiation member (heat sink) 2013. An alternative configuration may be such that a space of opening part is not provided between the thermal conduction member 2003 and the opening part of the package substrate 2004. Instead, a thermal conduction member 2003 now is placed on the opening part of the package substrate 2004. It is further configured such that a light shield layer 2006 is overlapped with the top surface of the package substrate 2004, including a circuit-wiring pattern 2005.

The placing of the light shield layer 2006 on the top surface of the package substrate 2004 enables an instant absorption of the incident light that is inside of the package and that is not reflected by the mirror array 2002, thereby, further transmissions of the reflection of light inside the package can be suppressed. Further, the efficiency of transmission of the heat out from the package, of the metallic circuit wiring pattern 2005 formed under the light shield layer 2006 is also improved. The light shield layer 2006 is formed with a black material that contains carbon and an insulation layer (not shown in a drawing herein) p is placed between the circuit wiring pattern 2005 and light shield layer 2006. Furthermore, the package substrate 2004 has an opening part and includes the circuit-wiring pattern 2005. The lower part of the device substrate 2001 are welded/joined together with the intermediate member 2009 (e.g., a seal material 2008 such as solder) to create a sealed space.

Furthermore, there is a sealed space between the package substrate 2004 and cover glass 2010 with the intermediate part 2007 formed with the fritted glass. The other parts of the embodiment 1-2 are similar to those of the embodiment 1-1 and therefore further descriptions are not provided here.

FIG. 2B is the bottom top view diagram of the assembly body 2200 shown in FIG. 2A. Note that the drawing omits the cooling/radiation member (heat sink) 2013, light shield layer 2006 and circuit wiring pattern 2005 for showing the opening part of the package substrate 2004. There is a columnar opening part formed at the center of the package substrate 2004. The columnar thermal conduction member 2003, which has a similar shape as that of the opening part, is formed at the center of the opening part. It is understood that the shape of the thermal conduction member 2003 is not limited as described above.

FIG. 2B shows the package substrate 2004 that does not contact the thermal conduction member 2003 and there is a space between them. Furthermore, the top surface of the thermal conduction member 2003 is connected to the bottom surface of the device substrate 2001, and the bottom surface of the thermal conduction member 2003 is connected to the cooling/radiation member (heat sink) 2013 (not shown here).

The package as shown advantageously configures the bottom surface of the device substrate 2001 and the thermal conduction member 2003 to expose to the external space outside of the package. The heat transmitted from the device substrate 2001 can be more effectively transmitted through the substrate 2001 and the thermal conduction member 2-003.

As described above, the package as shown in FIGS. 2A and 2B improves the efficiency of dissipating and transmitting heat out from the package.

Embodiment 1-3

A package according to a preferred embodiment 1-3 of the present invention is another exemplary modification of the package according to the embodiment 1-1.

The package according to the embodiment 1-3 differs from the package of the embodiment 1-1. The package substrate is composed of a glass material; a device substrate is composed of a silicon material, a metallic material or a ceramic material. The package substrate includes a cavity, and is configured to form an electrical connection between a device substrate and a cover glass by forming a circuit-wiring pattern on the cover glass.

Figure 3:
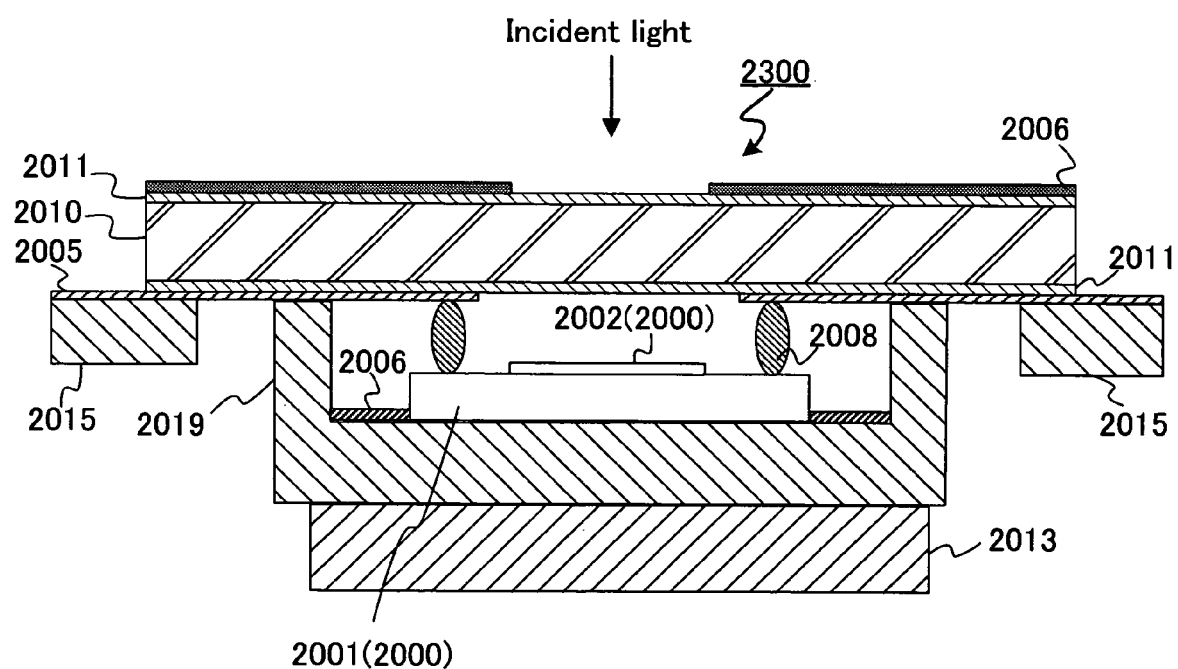
FIG. 3 is a front cross-sectional diagram of an assembly supported on a package substrate with a cavity for containing a mirror device electrically connects to a device substrate through a cover glass with a circuit-wiring pattern.

FIG. 3 is a front cross-sectional diagram of an assembly body 2300 that packages a mirror device 2000 to electrically connect to a device substrate 2001 by forming a cover glass 2010 with a circuit-wiring pattern 2005 using a support substrate 2019.

The assembly body 2300 shown in FIG. 3 is configured to form a light shield layer 2006 on the top surface of the cover glass 2010 and form the circuit-wiring pattern 2005 on the bottom surface of the cover glass 2010. The light shield layer 2006 formed on the top surface of the cover glass 2010 reduces the external light to project onto the mirror device 2000, thereby reduces heat accumulation inside the package.

Furthermore, the circuit wiring pattern 2005 extends from inside of the package to outside thereof and is connected to a circuit substrate on the outside of the package. The circuit wiring pattern 2005 is electrically connected to an intermediate member 2009 possessing good electrical conductivity, e.g., a seal member 2008 such as solder, which is placed on the device substrate 2001 inside of the package. This configuration enables the control circuit formed a circuit board 2015 to control the mirror device 2000 by way of the circuit wiring pattern 2005.

Further, different from the embodiment 1-1, the light shield layer 2006 is placed on the top surface of the support substrate 2019, thereby random reflection of the illumination light projected to the top surface of the support substrate 2019 is suppressed.

The other parts of the embodiment 1-3 are similar to those of the embodiment 1-1, and therefore further descriptions are not provided here. The circuit board 2015 has an opening part, and the support substrate 2019 is inserted therein by using the cover glass as a flange.

Embodiment 1-4

A package according to a preferred embodiment 1-4 of the present invention is a package storing a plurality of mirror devices and a control circuit for controlling the mirror devices. A plurality of mirror devices and the control circuit are placed directly on a support substrate. The support substrate may be a glass substrate, a silicon substrate, a metallic substrate or a ceramic substrate.

When a device substrate is contained in a package, the device substrate is commonly placed on the package and cover glass, which are formed in an approximately similar way to the outer shape of a mirror device. When two or three device substrates are placed in a package made of glass for the top and bottom parts or in one package, however, the preferable configuration is such that the outer shape of the package is not parallel to that of the device substrate causing the incident light to enter from a side of the package. The reason is that the placement of a side of the package parallel to any side of an optical element that is placed above the package simplifies the positioning of the mirror device and that further simplifies the assembly processes.

In the case of using a square mirror element, the placement of each side of the mirror element is 45-degree angle relative to a side of the package thus making the side of the package parallel to the deflection axis of the mirror element.

Particularly, when a plurality of mirror devices is placed inside of a single package, the illumination lights corresponding to the respective mirror devices may be projected from directions along different sides or from the same direction. The layout enables an improvement in the freedom of layout within the frame of a projection apparatus.

Based on the above description, the preferred placement of a light source is arranged that a plurality of mirror devices does not have a side parallel to the outer circumference of a package and also the optical axis of the incident light is perpendicular to any of the sides of the package in the plane direction of the mirror array.

An alternative configuration includes a thermal conduction member 2003 is joined to a plurality of mirror devices and/or the control circuit and the thermal conduction member 2003 is joined with the support member to enable efficient conduction of heat.

Figure 4A:
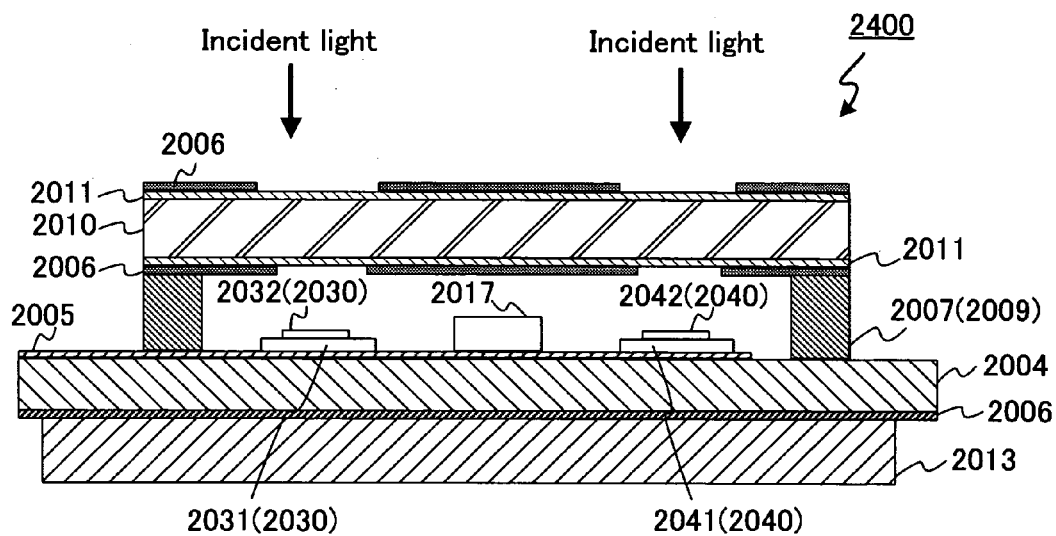
FIG. 4A is a front cross-sectional diagram of an assembly formed on a support substrate for containing and packaging two mirror devices
Figure 4B:
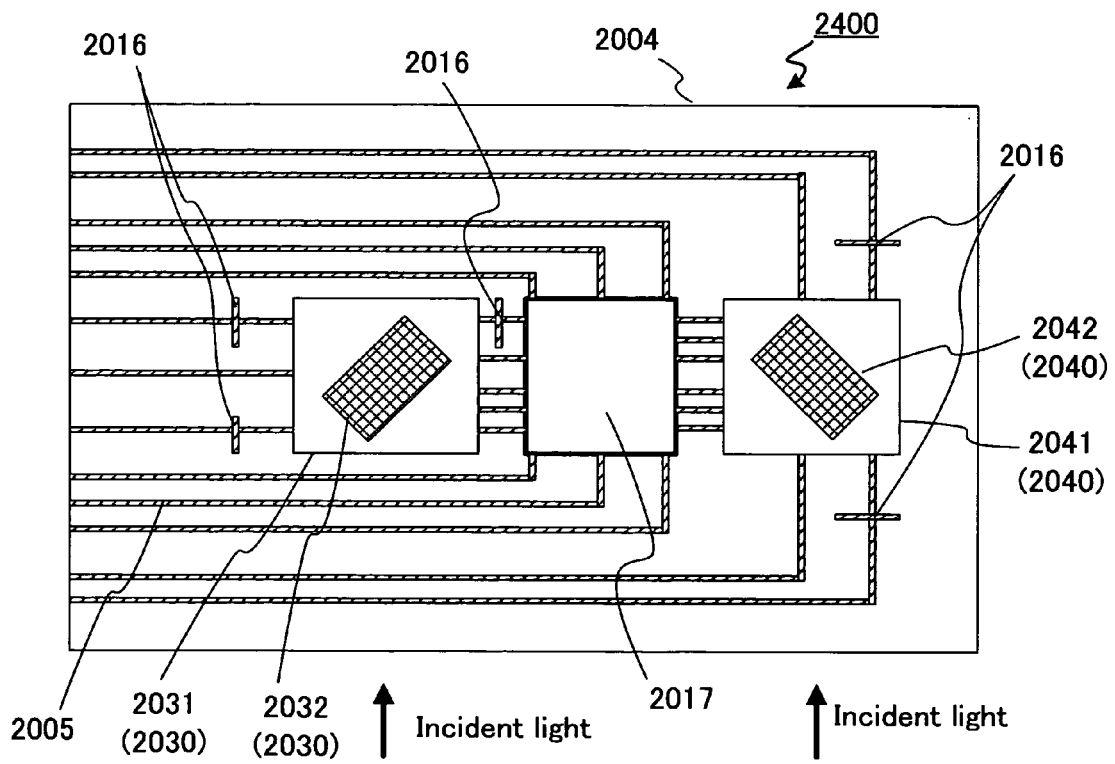
FIG. 4B is a top view diagram of the assembly shown in FIG. 4A, with the cover glass and intermediate member removed.
Figure 4C:
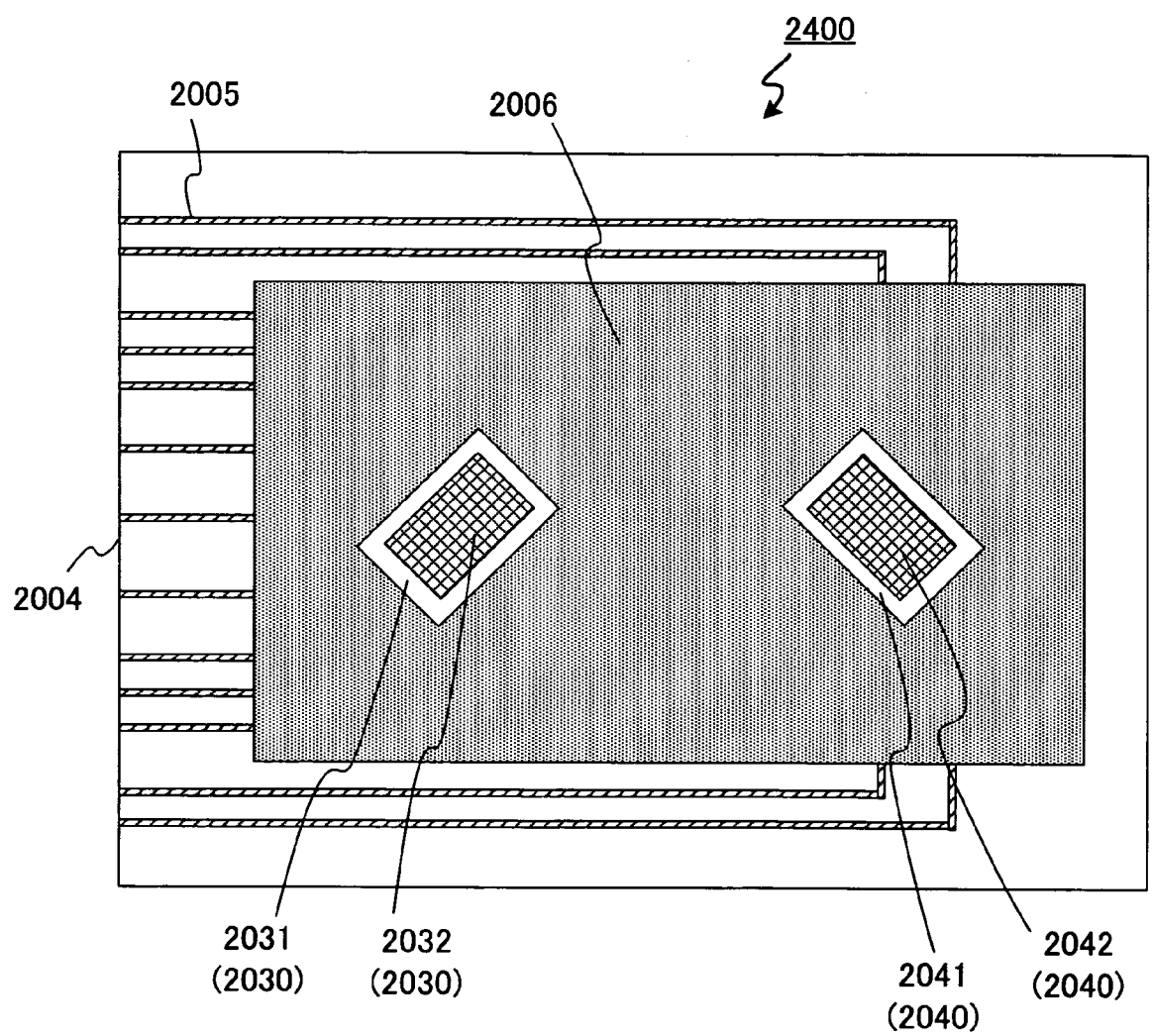
FIG. 4C is a top view diagram of the assembly body shown in FIG. 4A.

FIGS. 4A through 4C show an assembly body that packages a plurality of mirror devices and a control circuit used for controlling the mirror devices in one package shown in the embodiment 1-1.

FIG. 4A is a front cross-sectional diagram of an assembly 2400 that packages two mirror devices 2030 and 2040 and a control circuit 2017 using one package substrate 2004.

The assembly 2400 as shown in FIG. 4A, includes the package substrate 2004 made of a silicon material, and includes two mirror devices 2030 and 2040 and a control circuit 2017 on the package substrate 2004.

Further, a circuit wiring pattern 2005 is configured to collect the circuit wiring pattern 2005 only in the left direction of the package, as shown in FIG. 4A.

Furthermore, a part of the top and bottom surfaces of a cover glass 2010 has the light shield layers 2006. The regions other than the mirror arrays 2032 and 2042 of the respective mirror devices 2030 and 2040 are excluding from light transmission.

The other components of the embodiment 1-4 are the same as those of the embodiment 1-1, therefore, the descriptions are not provided here.

The package shown in FIG. 4A is capable of further accommodating many mirror devices, control circuits. When a plurality of mirror devices are placed in one package as described above, the processes are simplified in placing a plurality of mirror devices with both the heights from the top surface of the support substrate and the intervals between mirror devices uniformly aligned. The plurality of mirror devices are placed on the same support substrate in the same process, with the placement performed by using the same positioning part as reference. Furthermore, the package may be equipped with a cavity to place the mirror device(s). The configuration simplifies the process to align the positional relationship with a synthesis optical system used for synthesizing the reflection lights from individual mirror devices. A video image projected by such a system suffers little degradation of resolution, because the pixels of the respective mirror devices overlap with each other. Furthermore, the colors reflected by the respective mirror devices are observed with a reduced degree of blur.

Furthermore, the control circuit inside of the package makes it possible to place the circuit wiring pattern of the control circuit comprises a very large number of lines, inside of the package, thereby shortening the wiring and reducing the floating capacity and the like of the circuit wiring pattern. Furthermore, the control circuit, which is controlled in a higher speed than video signals, can be placed at a position equally distanced from the respective mirror devices, and the differences in the resistance values and floating capacity of the respective circuit wiring patterns connected to the individual mirror devices are accordingly reduced. This enables the use of a mirror device that includes many mirror elements and a mirror device for which a data processing volume is large and which is capable of controlling a higher number of gray scales. This accordingly enables the projection of an image with higher levels of gray scales and higher resolution. Further, this makes it easy to synchronize the timing, for controlling the mirror devices, between the respective mirror devices.

Furthermore, multiple mirror devices enclosed in a single package are operated under the same thermal environments. Making the positional shifts due to thermal expansion of mirror elements of the respective mirror devices are approximately the same. Therefore, arrangements of the same projection conditions can also be conveniently achieved. Furthermore, the mirror devices can also be handled and controlled at the same environment with the same control conditions. An analogical control for the mirror and the voltage value of memory can be made the same for the mirror devices.

FIG. 4B is a top view diagram of the assembly body 2400 shown in FIG. 4A, with the cover glass and the intermediate part 2007 removed. The circuit-wiring pattern 2005 is formed on the package substrate 2004, and the circuit-wiring pattern 2005 is directly connected to the device substrates 2031 and 2041 of the respective mirror devices, and also to the control circuit 2017. The circuit wiring pattern 2005 is configured to collect the pattern only in the left direction in FIG. 4B. Alternatively, the circuit-wiring pattern 2005 may be configured to collect evenly in the left and right directions depending on the number of wirings.

Furthermore, a positioning pattern 2016 is formed on the circuit-wiring pattern 2005 to position the two mirror devices 2030 and 2040 or control circuit 2017 on the package substrate 2004. Then, the positional relationship among mirror devices 2030 and 2040 and control circuit 2017 can be determined with a high precision by measuring the positioning pattern 2016 on the package substrate 2004 optically with a charge-coupled device (CCD) camera. A similar process is carried out using a substrate made of a glass or ceramic material. In the case of adopting the package substrate 2004, which is made of a silicon material, the silicon is etched by applying a semiconductor process to form an uneven part (e.g., a convex/concave part) to position the device substrate with the support substrate.

Alternatively, the support substrate 2019 (shown in FIG. 3) having a concave part in place of the package substrate 2004 and intermediate part 2007, to place the mirror devices 2030 and 2040 in the concave part.

Even though the configuration shown in FIG. 4B of a package that forms the positioning pattern 2016 with the same circuit wiring pattern 2005, the positioning pattern may be formed with a material different from that of the circuit wiring pattern 2005.

Collation of the placement of the positioning pattern 2016 with the mirror devices 2030 and 2040 and control circuit 2017 can be carried out by using a marker on the mirror of the mirror devices 2030 and 2040. Alternately, the process may include a step of taking the circuit wiring pattern or a land placed on the outer circumference of the device substrates 2031 and 2041 as reference. Assuming that the width of the circuit wiring pattern and positioning pattern 2016 is 0.1 µm, a positioning can be performed with accuracy of at least one half the width of the wiring or better, that is, 0.05 µm or better. Furthermore, the positioning pattern may also function as the circuit-wiring pattern and/or heat conducting circuit-wiring pattern.

FIG. 4C is a top view diagram of the assembly body 2400 shown in FIG. 4A. FIG. 4B shows a cover glass 2010 and intermediate part 2007 on the assembly body 2400. The configuration of FIG. 4B enables the light shield layers 2006 disposed on the top and bottom surfaces of the cover glass 2010, to absorb the light projected onto the parts other than the respective mirror arrays 2032 and 2042.

The circuit wiring pattern 2005 connected to the mirror devices 2030 and 2040 and extends from the inside of the package to the outside, and conducts the heat inside of the package and radiates it to the outside. In the configuration of FIG. 4C, the opening parts of the light shield layers 2006 correspond to the regions between the respective outer shapes of the individual device substrates 2031 (and 2041) and individual mirror arrays 2032 (and 2042), respectively.

[Projection Apparatus]

Next is a description of a projection apparatus comprising a light modulation device, such as a mirror device packaged as described above.

The projection apparatus according to the present embodiment comprises a laser light source, an illumination optical system, a light modulation device, a package and a projection lens.

The illumination optical system illuminates the light flux emitted from the laser light source by enlarging it.

The light modulation device modulates and reflects the light flux enlarged by the illumination optical system. The light modulation device is constituted by a light modulator array of which the diagonal size is between 10.41 mm and 22.098 mm (0.41 inches to 0.87 inches) and in which, for example, no less than two million pixels of light modulation elements are arrayed in two dimensions on a device substrate. The light modulation device is, for example, a mirror device. The device substrate is, for example, a silicon substrate.

The package protects the light modulation device. The package comprises a support substrate for supporting the device substrate, a transparent cover grass and an intermediate member for joining the support substrate and cover glass together.

The support substrate is, for example, a glass substrate or a ceramic substrate, as described above.

Other constituent members are preferably configured as noted above. Particularly, a package configured by using glass selects an appropriate material to minimize the difference in coefficients of linear expansion between the glass and the material for the light modulation device. This configuration makes it possible to prevent a breakage or a mutual peel-off due to the difference in thermal expansion between the light modulation device and package.

The projection lens projects the light modulated by the light modulation device.

This configuration makes it possible to display a high resolution, bright image.

Note that the heat accumulated in the light modulation device can be reduced by controlling the intensity of a laser light irradiated onto the light modulation device.

For example, the changing of the intensities of a laser light source changes the intensities modulated by the light modulation device which is used for modulating light in accordance with an image signal. In this case, while it is very difficult to adjust the brightness for each mirror element since the intensities of the entirety of the mirror array are changed, there is still a possibility that the entire screen is dark or the average brightness of the screen is low, depending on the image signal, causing the modulation time at the mirror array to become short. In such a case, the heat accumulated in the mirror device can be reduced by modulating the light by lowering the intensity of the illumination light. Note that having the capability of regulating the intensity of a laser light makes it possible to reduce the intensity of the light source constantly by about 50%, depending on the image mode of the projection apparatus, thereby making it possible to project the image while reducing the heat accumulated in the mirror device.

Further, if the entire screen is bluish and the modulation performed by the light modulation array corresponding to the red laser light source is finished early in a multi-panel projection apparatus comprising light modulation devices corresponding to the respective light sources of R, G and B, the red laser light source is turned OFF early by shortening the sub-frame corresponding to red. As such, it is possible to eliminate the extraneous illumination on the light modulation device corresponding to the red laser light source, and accordingly reduce the heat retained by the light modulation device due to an extraneous illumination.

Next, the resolution of an image projected by the projection apparatus is determined by the size of a mirror, the F number of a projection lens, the numerical aperture NA of a light source, and the coherency of a light flux.

When a laser light source is used, a bright image can be projected by maintaining the resolution even with the numerical aperture NA of an illumination light flux being between 0.122 and 0.07, because the degradation in the high frequency component of the spatial frequency of a laser light is small. Further, it is possible to maintain the resolution of a projection image even with the F number of the projection lens increased to any value between 4.1 and 7.2, which is larger than when using a mercury lamp or the like.

Then, the deflection angle of the mirror device can be determined in accordance with the illumination light flux and the F-number of the projection light flux. Where "$\theta$" is the deflection angle of the mirror, an approximation can be performed by letting the numerical aperture be: $NA = \sin\theta$ and the F-number be: F-number=$\frac{1}{2} * NA$.

With this approximation equation, the appropriate F-numbers will be changed in association with the deflection angle $\theta$ of a mirror and the numerical aperture NA.

When the deflection angle θ of a mirror is ±4 degrees, the numerical aperture NA of an obtainable light flux is 0.070, and the preferable F-number for a projection lens is 7.2.

When the deflection angle θ of a mirror is ±5 degrees, the NA of an obtainable light flux is 0.087, and the preferable F-number for a projection lens is 5.7.

When the deflection angle θ of a mirror is ±7 degrees, the NA of an obtainable light flux is 0.122, and the preferable F-number for a projection lens is 4.1.

When the deflection angle θ of a mirror is ±9 degrees, the NA of an obtainable light flux is 0.156, and the preferable F-number for a projection lens is 3.2.

When the deflection angle θ of a mirror is ±13 degrees, the NA of an obtainable light flux is 0.225, and the preferable F-number for a projection lens is 2.2.

Based on the approximation result, when the F-number for a projection lens is determined to be 2.2 in a system using a mercury lamp, the deflection angle of a mirror element is preferably designated at ±13 degrees. For example, a rear projection system comprising a mercury lamp uses a mirror device of which the deflection angle of the mirror element is between ±10 degrees and ±13 degrees, with the numerical aperture NA designated between 0.17 and 0.21, and the F-number for a projection lens designated between 2.4 and 2.8.

Meanwhile, when a light source, such as a laser light source, of which the numerical aperture is between 0.122 and 0.070, is used, the F-number for a projection lens can be increased to between 4.1 and 7.2, larger than when using a mercury lamp. This in turn makes it possible to decrease the deflection angle between ±4 and ±7 degrees.

When an aberration of light or such is not considered, an appropriate relationship between an F-number for a projection lens and the deflection angle of a mirror can be uniquely determined. A projection apparatus comprising a mirror device with un-miniaturized 11 μm square mirrors designates the deflection angle of mirror at ±13 degrees for increasing the numerical aperture NA of an illumination light flux to reflect the entirety of incident light toward the projection lens.

In contrast, in a projection apparatus comprising a miniaturized mirror device of which one side of a mirror is any value between 4 μm and 10 μm, decreasing the deflection angle of mirror to between ±4 degrees and ±7 degrees, and the use of a laser light source makes it possible to decrease the numerical aperture NA of the light flux while minimizing a degradation in the spatial frequency of a high frequency component. Therefore, it is possible to use a projection lens with a larger F number than the conventional case and obtain a brighter image.

A projection apparatus according to the present embodiment is configured to set the deflection angle of a mirror to any value between ±4 degrees and ±7 degrees, and decrease the numerical aperture NA of the light flux that can be taken up by a laser light source to no larger than 0.14, thereby making it possible to use a projection lens with the F number larger than 4.1. Further, as the F-number of the projection lens increases, the depth of focus, i.e., the focal length, increases. This in turn makes it possible to widen the amount of placement shift that is permissible when the mirror device is placed at the focus position of the projection lens than when the deflection angle of mirror is large and a conventional projection lens is used.

Furthermore, since a laser light is the light with a uniform phase and therefore clearer diffracted light is generated than in the case of when the light is emitted from a mercury lamp. Therefore, it is possible to make it difficult for a projection lens to project the diffracted light by setting the deflection angle of mirror at larger than the appropriate deflection angle of mirror approximated in accordance with the numerical aperture NA of the light flux of the laser light source and the F number of the projection lens. Considering this, the incidence of the diffracted light into the projection lens can be suppressed by setting the deflection angle of the mirror larger than ±4 when the numerical aperture NA of the light flux from the laser light source is 0.070 and the F number of the projection lens is 7.2, thereby improving the contrast of the projection image.

Next is a description of a projection lens suitable to a miniaturized mirror device.

When a mirror device with an mirror array of 0.87-inch in diagonal size is used for a rear projection system, with an approximate screen size of 65 inches, using a laser light source of which the numerical aperture NA is no larger than 0.14, the required projection magnification ratio is about 70. If a mirror array of which the diagonal size is 0.55 inches is used, the required projection magnification ratio is about 120. As such, the projection magnification increases in association with shrinking the size of the mirror array. This ushers in the problem of color aberration caused by a projection lens.

Here, although the focal distance of the lens needs to be shortened to increase the projection magnification, the placing of a laser light source and the designating of the deflection angle of mirror between ±4 degrees and ±7 degrees make it possible to use a projection lens with a larger F number than the projection lens with the F number at 2.4 and the depth of focus at 15 mm. Further, a capability of using a projection lens with a larger F number reduces the outer size of the projection lens. This in turn reduces the image size with which a light flux passes through the illumination optical system, thereby making it possible to suppress a color aberration caused by the projection lens.

Therefore, in the case of using a laser light source with a mirror device miniaturized, to any size between 0.4 inches and 0.87 inches, the deflection angle of mirror is preferably reduced to any value between ±4 degrees and ±7 degrees and the F number for a projection lens is preferably increased.

As described above, the projection magnification of a projection lens can be set at 75× to 120× by reducing the numerical aperture NA of the light flux emitted from a laser light source to no larger than 0.14, using a mirror device with which the deflection angle of mirror is reduced to any value between ±4 degrees and ±7 degrees and in which the mirror array is miniaturized to a diagonal size of 0.4 inches to 0.87 inches, to increase the F number for a projection lens.

Meanwhile, when a mirror device is moved forward or backward relative to the optical axis of projection, a distance with which an image blur (i.e., out of focus) of a projected image is permissible is called a focal depth. When an image is projected with a permissible blur in the degree of the mirror size by an optical setup of the same focal distance, projection magnification and mirror size, a depth of focus is approximated as follows:

$$\text{Depth of focus } Z = 2*(\text{permissible blur})*(F \text{ number})$$

Namely, the depth of focus is proportional to the F-number of a projection lens. That is, the permissible distance of the shift in positions of a placed mirror device, relative to the optical axis of projection, increases. This factor is represented by the relationship between a permissible circle of confusion and a depth of focus.

As an example, where the F number of a projection lens is "8" and the permissible blur is equivalent to a 10 μm mirror size in the above described approximation equation, the depth of focus is:

$$Z = 2*10*8 = 160 [\mu m]$$

Further, where a mirror size is 5 μm and an F-number is 2.4, the depth of focus is 24 μm. Here, when the top or bottom surface of the glass substrate is defined as reference surface, the height of the mirror surface at either end of the mirror array preferably exists within 20 micrometers or less. Furthermore, considering the error in the projection lens and other optical system and the adjustment of individual devices comprised in a multi-panel system, the aforementioned mirror height preferably exists within a few micrometers.

Furthermore, a blurred image of dust, perched on the surface of a cover glass, can be made invisible by providing a distance between the mirror surface and the bottom surface of the cover glass of no less than the value of the depth of focus. It is preferable to make the distance between the mirror surface and the bottom surface of the cover glass a distance of tens times, or no less than 100 times, the mirror size.

If the cover glass 2010 is thickened, the efficiency of heat transmission from the glass is worsened, while the dust perched on the top surface of the cover glass can be made inconspicuous. A spot requiring the most attention in terms of the temperature rise inside of the package is the heat resistance temperature of a transistor used in the circuit inside of the substrate. Determining the structures of the package and device so as to not allow, for example, a transistor part to exceed 100° C. makes it possible to speed up or stabilize driving the mirror element.

Further, the illumination light is projected along a diagonal direction is externally ejected through the transparent cover glass, instead of being irradiated onto the mirror device. Such a configuration makes it possible to prevent a temperature rise due to heat generated by the illumination light.

Note that the projection apparatus may be a single-panel projection apparatus sequentially illuminating the lights of respective colors R, G and B on a single mirror device, or a multi-panel projection apparatus respectively modulating the lights of the respective colors at a plurality of mirror devices respectively corresponding to a plurality of color light sources.

The following exemplifies a multi-panel projection apparatus.

The multi-panel projection apparatus comprises a plurality of light sources, a plurality of mirror devices, a prism and a projection lens.

The light source may be a laser light source.

The use of the illumination light emitted from a laser light source with the numerical aperture being, for example, between 0.122 and 0.070 allows a degree of freedom in a path to an incident surface to which the laser light is incident, thereby allowing a change of the light path lengths from the individual laser light sources to the prism.

Furthermore, the equipping of laser light sources having plural wavelengths allows independent controls for the respective light sources. For example, it is possible to turn off only a laser light source having a specific wavelength or to reduce its light intensity or perform pulse emission that is difficult to perform with a mercury lamp.

The prism synthesizes the respective reflection lights from a plurality of mirror devices. Particularly, it causes the incident light to enter from a direction approximately orthogonal to a surface used for synthesizing the reflection light of the prism.

In the case of synthesizing, within the prism, the reflection light from different mirror arrays, which is called the dichroic filter, and passes or reflects only a predetermined wavelength, may possibly be equipped. The dichroic filter is capable of selecting only a predetermined wavelength, thereby serving the same function as the color filter. Here, in the case of employing a laser light source to emit a polarized light, the prism may be a polarization beam splitter prism capable of light separation and synthesis using the difference in polarizing directions.

FIGS. 5A through 5D show the configuration of a two-panel projection apparatus 2500 comprising the assembly body 2400, shown in the above described FIGS. 4A through 4C, which is obtained by one package accommodating two mirror devices 2030 and 2040.

The two-panel projection apparatus 2500 does not project one of three colors R, G and B in sequence, nor does it project the R, G and B colors continuously and simultaneously as in the case of a three-panel projection apparatus. A two-panel projection apparatus projects an image by means of a projection method which continuously projects, for example, a green light source with high visibility and projecting a red light source and a blue light source in sequence.

The two-panel projection apparatus 2500 is capable of changing over colors in high speed by means of pulse emission in 180 kHz to 720 kHz by comprising laser light sources, thereby making it possible to obscure flickers caused by changing over among the light sources of the respective colors.

Further, a projection method for continuously projecting the brightest color and changing over the other colors in sequence on the basis of the image signals can also be adopted. Such projection methods can also be adopted for a configuration making R, G and B lights correspond to the respective mirror devices, as in the three-panel projection method.

Figure 5A:
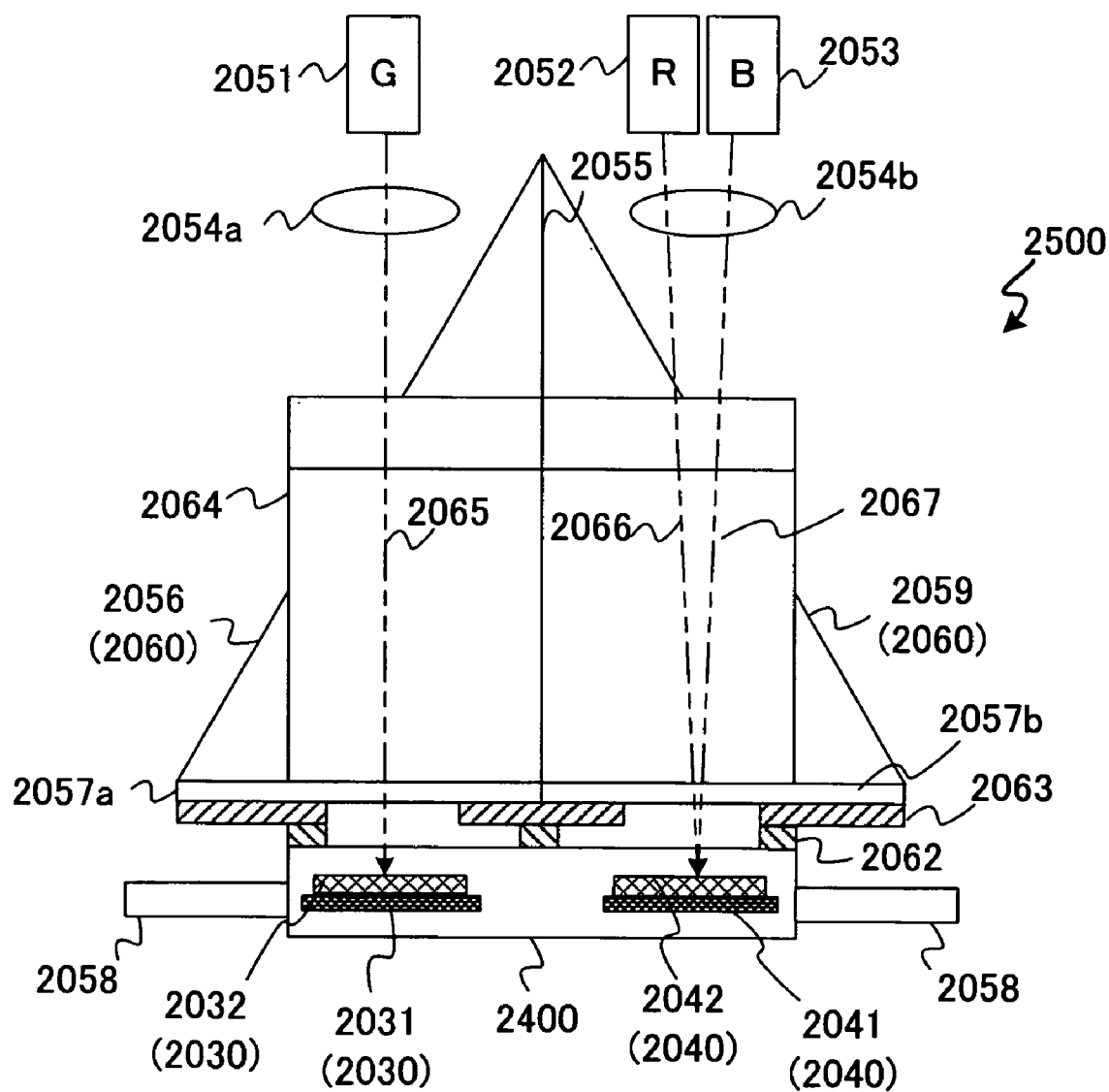
FIG. 5A is a front view diagram of a two-panel projection apparatus comprising a plurality of mirror devices housed in one package.
Figure 5B:
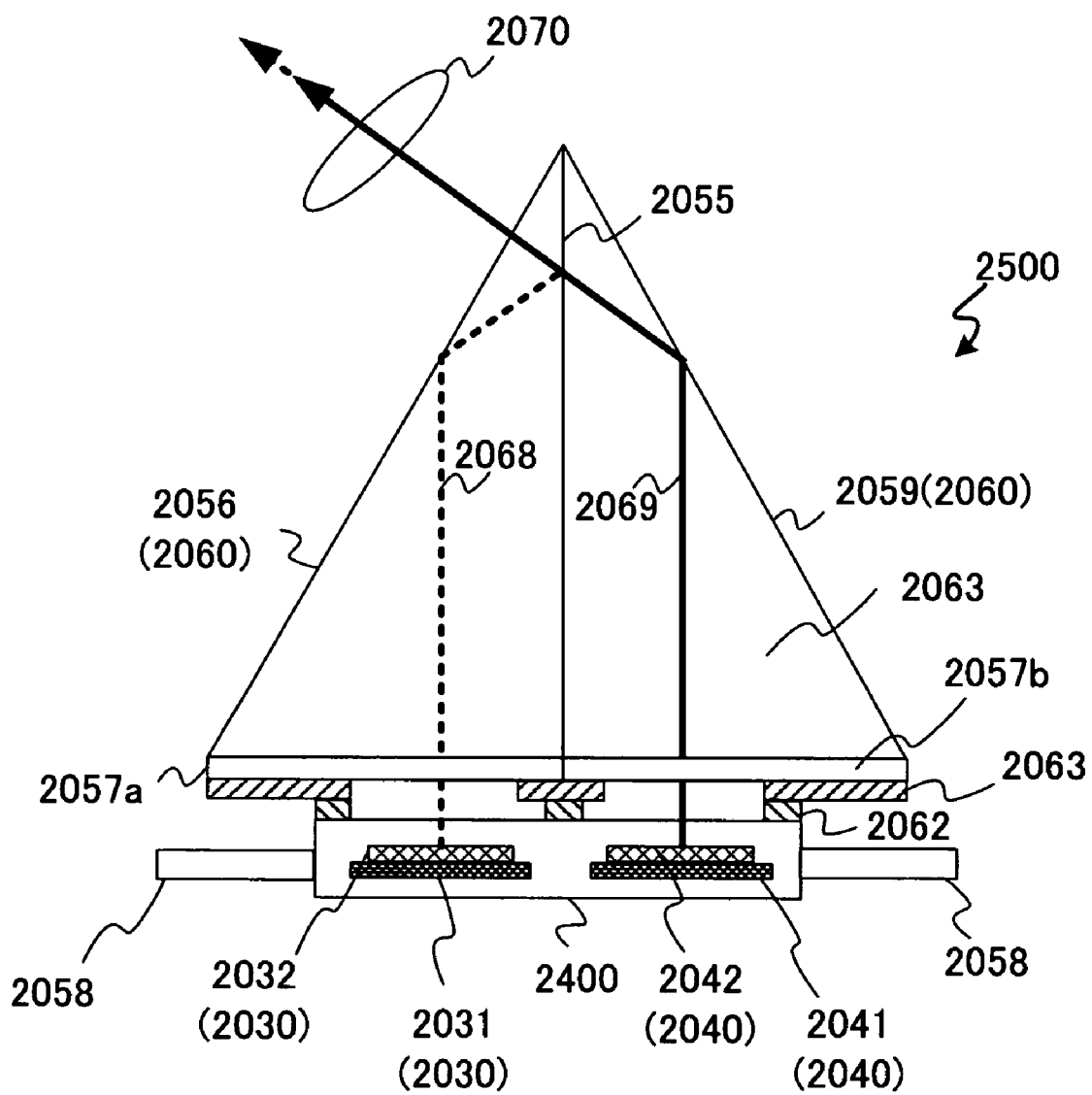
FIG. 5B is a rear view diagram of the two-panel projection apparatus shown in FIG. 5A.
Figures 5C, 5D:
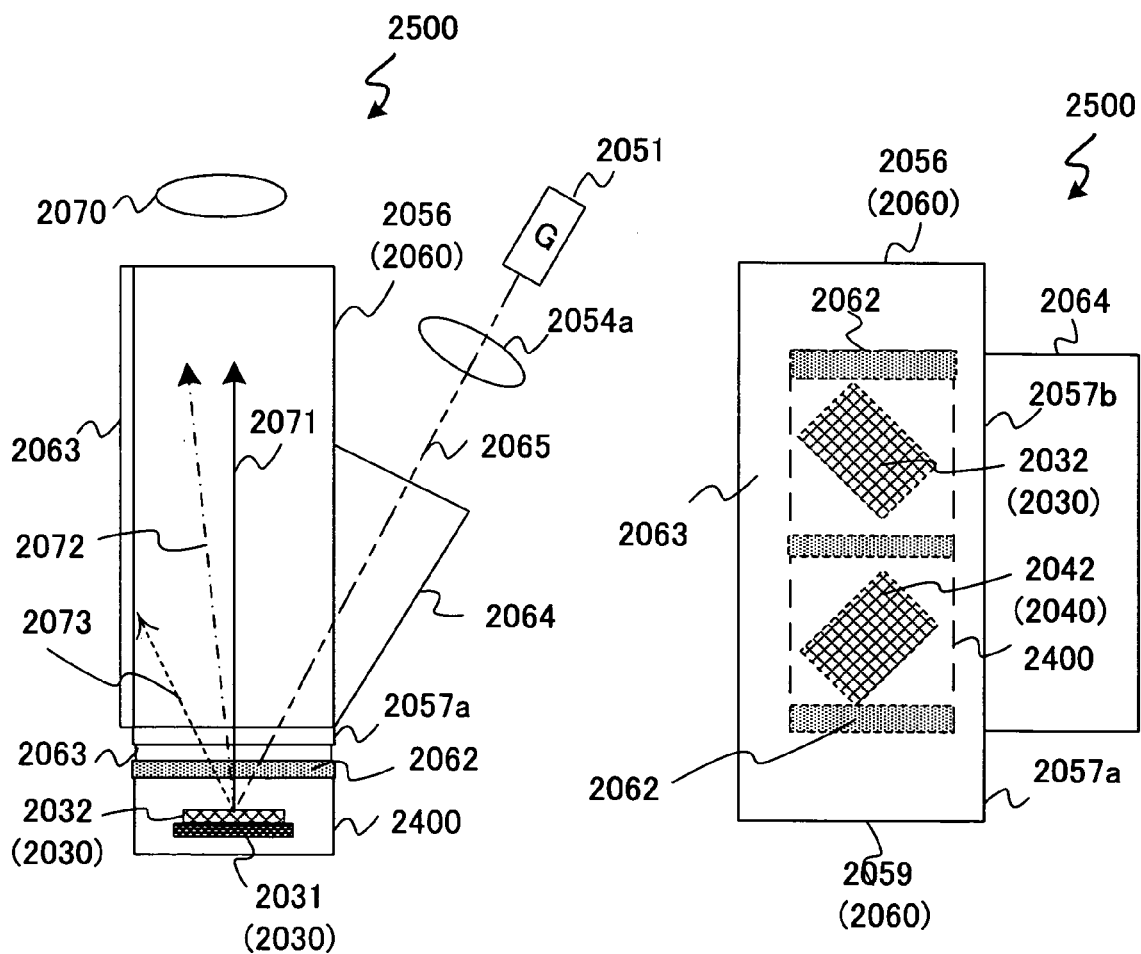
FIG. 5C is a side view diagram of the two-panel projection apparatus shown in FIG. 5A.
FIG. 5D is a diagram of the two-panel projection apparatus shown in FIG. 5A, as viewed from above.

FIG. 5A is a front view diagram of a two-panel projection apparatus 2500; FIG. 5B is a rear view diagram of the two-panel projection apparatus 2500; FIG. 5C is a side view diagram of the two-panel projection apparatus 2500; and FIG. 5D is a top view diagram of the two-panel projection apparatus 2500.

The following is a description of the optical comprisal and principle of projection of the two-panel projection apparatus 2500 shown in FIGS. 5A through 5D.

The projection apparatus 2500 shown in FIGS. 5A through 5D comprises a green laser light source 2051, a red laser light source 2052, a blue laser light source 2053, illumination optical systems 2054a and 2054b, two triangular prisms 2056 and 2059, ¼ wavelength plates 2057a and 2057b, two mirror devices 2030 and 2040 accommodated in a single package, a circuit board 2058, a light guide prism 2064 and a projection lens 2070.

The two triangular prisms 2056 and 2059 are joined together to constitute one polarization beam splitter prism 2060. Further, the joined part between the two triangular prisms 2056 and 2059 has the polarization beam splitter film 2055 or coating. The polarization beam splitter prism 2060 primarily fills the role of synthesizing the light reflected by the two mirror devices 2030 and 2040.

The polarization beam splitter film 2055 is a filter for transmitting only an S-polarized light and reflecting P-polarized light.

A slope face of the right-angle triangle cone light guide prism 2064 is adhesively attached to the front surface of the polarization beam splitter prism 2060, with the bottom of the light guide prism 2064 facing upward. The green laser light source 2051, the illumination optical system 2054a corresponding to the green laser light source 2051, the red laser light source 2052, the blue laser light source 2053, and the illumination optical system 2054d corresponding to the red laser light source 2052 and blue laser light source 2053 are placed beyond the bottom surface of the light guide prism 2064, with the respective optical axes of the green laser light source 2051, red laser light source 2052, blue laser light source 2053 aligned perpendicularly to the bottom surface of the light guide prism 2064.

Here, the light guide prism 2064 is equipped for causing the respective lights of the green laser light source 2051, red laser light source 2052 and blue laser light source 2053 to perpendicularly enter the polarization beam splitter prism 2060. The light guide prism 2064 makes it possible to reduce the amount of the reflection light caused by the polarization beam splitter prism 2060 when the laser light enters the polarization beam splitter prism 2060.

Further, ¼ wavelength plates 2057a and 2057b are placed on the bottom surface of the polarization beam splitter prism 2060 on which a light shield layer 2063 is applied in regions other than the areas where the light is irradiated on the individual mirror devices 2030 and 2040. Note that the ¼ wavelength plates 2057a and 2057b may alternatively be placed on the cover glass of the package.

Furthermore, a light shield layer 2063 is placed also on the rear surface of the polarization beam splitter prism 2060.

Further, the two mirror devices 2030 and 2040, which are accommodated in a single package, are placed under the ¼ wavelength plates 2057a and 2057b, and the cover glass of the package is joined to the polarization beam splitter prism 2060 by way of a thermal conduction member 2062. This joinder makes it possible to radiate heat from the cover glass of the package to the polarization beam splitter prism 2060 by way of the thermal conduction member 2062. Further, the circuit boards 2058 comprising a control circuit(s) for controlling the individual mirror devices 2030 and 2040 are placed respectively on both sides of the package.

The mirror devices 2030 and 2040 are respectively placed to form a 45-degree angle relative to the four sides of the outer circumference of the package. That is, the placement is such that the deflecting direction of each mirror element of the mirror devices 2030 and 2040 is approximately orthogonal to the slope face forming the polarization beam splitter prism 2060 and to the plane on which the reflection lights are synthesized. In terms of positioning the mirror devices 2030 and 2040 in relation to the polarization beam splitter prism 2060, a high precision positioning of the two mirror devices 2030 and 2040 within the package by means of the positioning pattern 2016 is very important.

Incidentally, the illumination optical systems 2054a and 2054b each comprise a convex lens, a concave lens and other components, and the projection lens 2070 comprises a plurality of lenses and other components.

The following is the principle of projection of the projection apparatus 2500 shown in FIGS. 5A through 5D.

In the projection apparatus 2500, the individual laser lights 2065, 2066 and 2067 are projected from the front direction and are reflected by the two mirror devices 2030 and 2040 toward the rear direction, and then an image is projected by way of the projection lens 2070 located in the rear.

Next is a description of the projection principle starting from the incidence of the individual laser lights 2065, 2066 and 2067 to the reflection of the respective laser lights 2065, 2066 and 2067 at the two mirror devices 2030 and 2040 toward the rear direction, with reference to the front view diagram of the two-panel projection apparatus shown in FIG. 5A.

The respective laser lights 2065, 2066 and 2067 from the S-polarized green laser light source 2051, and the P-polarized red laser light source 2052 and blue laser light source 2053 are made to be incident to the polarization beam splitter prism 2060 by way of the illumination optical systems 2054a and 2054b respectively corresponding to the laser lights 2065, and 2066 and 2067, and by way of the light guide prism 2064. Then, having transmitted through the polarization beam splitter prism 2060, the S-polarized green laser light 2065 and the P-polarized red and blue laser lights 2066 and 2067 are incident to the ¼ wavelength plates 2057a and 2057b, which are placed on the bottom surface of the polarization beam splitter prism 2060. Having passed through the ¼ wavelength plates 2057a and 2057b, the individual laser lights 2065, 2066 and 2067 respectively change the polarization by the amount of ¼ wavelengths to become a circular polarized light state.

Then, having passed through the ¼ wavelength plates 2057a and 2057b, the circular polarized green laser light 2065 and the circular polarized red and blue laser lights 2066 and 2067 are respectively incident to the two mirror devices 2030 and 2040 that are accommodated in a single package. The individual laser lights 2065, 2066 and 2067 are modulated and reflected by the correspondingly respective mirror devices so that the rotation directions of the circular polarization are reversed.

Next is a description of the projection principle starting from the reflection of individual laser lights 2065, and 2066 and 2067 to the projection of an image with reference to the rear view diagram of the two-panel projection apparatus shown in FIG. 5B.

The ON light 2068 of the circular polarized green laser and the mixed ON light 2069 of the circular polarized red and blue lasers, which are reflected by the respective mirror devices 2030 and 2040, pass through the ¼ wavelength plates 2057a and 2057b again and enter the polarization beam splitter prism 2060. In this event, the polarization of the green laser ON light 2068 and that of the mixed red and blue laser ON light 2069 are respectively changed by ¼ wavelengths to become a linear polarized state with 90-degree different polarization axes. That is, the green laser ON light 2068 is changed to a P-polarized light, while the mixed red and blue laser ON light 2069 is changed to an S-polarized light.

Then, the green laser ON light 2068 and the mixed red and blue laser ON light 2069 are respectively reflected by the outer side surface of the polarization beam splitter prism 2060, and the P-polarized green laser ON light 2068 is reflected again by the polarization beam splitter film 2055. Meanwhile, the S-polarized mixed red and blue laser ON light 2069 passes through the polarization beam splitter film 2055. Then, the green laser ON light 2068 and red and blue laser mixed ON light 2069 are incident to the projection lens 2070, thereby projecting a color image. Note that the optical axes of the respective lights incident to the projection lens 2070 from the polarization beam splitter prism 2060 are desirable orthogonal to the ejection surface of the polarization beam splitter prism 2060. Alternatively, there is a viable configuration that does not use the ¼ wavelength plates 2057a and 2057b.

With the configuration and the principle of projection as described above, an image can be projected into the two-panel projection apparatus 2500, comprising the assembly body 2400 that packages the two mirror devices 2030 and 2040, which are accommodated in a single package.

FIG. 5C is a side view diagram of the two-panel projection apparatus 2500. The green laser light 2065 emitted from the green laser light source 2051 orthogonally enters the light guide prism 2064 via the illumination optical system 2054a. In this event, the reflection of the laser light 2065 is minimized.

Then, having passed through the light guide prism 2064, the laser light 2065 passes through the polarization beam splitter prism 2060 and ¼ wavelength plates 2057a and 2057b, which are joined to the light guide prism 2064, and then, enters the mirror array 2032 of the mirror device 2030.

The mirror array 2032 reflects the laser light 2065 with the deflection angle of a mirror that puts the reflected light in any of these states: an ON light state in which the entirety of the reflection light is incident to the projection lens 2070, an intermediate light state in which a portion of the reflection light is incident to the projection lens 2070 and an OFF light state in which no portion of the reflection light is incident to the projection lens 2070.

The reflection light of a laser light (i.e., ON light) 2071, from which the ON light state is selected, is reflected by the mirror array 2032 and will be incident to the projection lens 2070.

A portion of the reflection light of a laser light (i.e., intermediate light) 2072, from which the intermediate state is selected, is reflected by the mirror array 2032 and will be incident to the projection lens 2070.

Further, the reflection light of a laser light (i.e., OFF light) 2073, from which the OFF light state is selected, is reflected by the mirror array 2032 toward the light shield layer 2063, in which the reflection light is absorbed.

With this configuration, the laser light enters the projection lens 2070 at the maximum light intensity of the ON light, at an intermediate intensity between the ON light and OFF light of the intermediate light, and at the zero intensity of the OFF light. This configuration makes it possible to project an image in a high level of gradation. Note that the intermediate light state produces a reflection light reflected by a mirror of which the deflection angle is regulated between the ON light state and OFF light state.

Meanwhile, making the mirror perform a free oscillation causes it to cycle three deflection angles producing the ON light, the intermediate light and the OFF light, respectively. Here, the control of the number of free oscillations makes it possible to adjust the light intensity and obtain an image in a higher level of gradation.

FIG. 5D is a top view diagram of the two-panel projection apparatus 2500. The mirror devices 2030 and 2040 are placed in the package and respectively form an approximately 45-degree angle, on the same horizontal plane, in relation to the four sides of the outer circumference of the package as shown in FIG. 5D, thereby the light in the OFF light state can be absorbed by the light shield layer 2063 without allowing the light to be reflected by the slope face of the polarization beam splitter prism 2060, improving the contrast of an image.

Further, the heat generated inside of the package is conducted to the polarization beam splitter prism 2060 by way of the thermal conduction member 2062 and is radiated to the outside from there. As such, the conduction of the heat generated in the mirror device to the polarization beam splitter prism 2060 improves the heat dissipation efficiency. Further, the heat generated by absorbing light is radiated to the outside instantly, because the light shield layer 2063 is exposed to the outside.

When a mirror element reflects the incident light toward a projection lens 2070 at an intermediate light intensity (i.e., an intermediate state) at the intensity between the ON light and OFF light states, an effective reflection plane needs to be conventionally in the longitudinal direction of the slope face of a prism.

In contrast, the projection apparatus 2500 is enabled to provide a wide effective reflection plane in the thickness direction of the polarization beam splitter prism 2060 even when the mirror element as described above is in the intermediate state. With this configuration, a total reflection condition with which the reflection light from the mirror element is reflected by the slope face of the polarization beam splitter prism 2060 can be alleviated.

Embodiment 1-5

A mirror device can be configured to be more compact by shrinking the mirror size of a mirror element. For example, a miniaturized mirror device is constituted by mirror elements that are each made of an approximate square mirror of which a side is any value between about 4 μm and 10 μm. Here, the mirror has the aperture ratio of no lower than 80% and the reflectance of no less than 80%. Further, if the mirror element has a hinge structure capable of avoiding interference with the adjacent mirror, the gap between mirrors may be small, e.g., any value between 0.15 μm and 0.55 μm. In such a case, the aperture ratio of the reflection surface of mirror can be improved to 90% or higher. Such a configuration also reduces the energy of light directly irradiated onto a device substrate after the light goes through the gaps between mirrors.

Then, the diagonally measured size of a mirror array for use in a full high definition (Full HD) television (TV) can be reduced to between 10.16 mm and 22.098 mm (0.4 inches to 0.87 inches) by arraying a plurality of mirror elements described above on a device substrate.

When the land and the like, which are used for the circuit wiring drive each mirror element, are respectively at least about 1 mm are secured in the periphery of the mirror array for which the mirror size is miniaturized as described above, the size of the device substrate is approximately as follows.

For a 6 μm pixel pitch and 4:3 XGA screen, the mirror array is about 7.62 mm (0.3 inches) and the devise substrate is about 10.16 mm (0.4 inches).

For a 7 μm pixel pitch and 4:3 XGA screen, the mirror array is about 8.89 mm (0.35 inches) and the devise substrate is about 11.43 mm (0.45 inches).

For a 7 μm pixel pitch and 16:9 Full HD screen, the mirror array is about 15.24 mm (0.6 inches) and the devise substrate is about 17.78 mm (0.70 inches).

For a 9 μm pixel pitch and 16:9 Full HD screen, the mirror array is about 19.81 mm (0.78 inches) and the devise substrate is about 22.098 mm (0.87 inches).

Enabling the substantial reduction of the device substrate in association with the substantial reduction of the mirror device reduces the volume of the device substrate. Therefore, the increase in the volume of the device substrate due to thermal expansion is less from the device substrate of a 0.95-inch mirror array conventionally used.

In a mirror device, it is possible to prevent undesirable light from being projected, by deflecting a mirror to a large deflection angle. An exemplary configuration is such that the deflection angle of mirror is increased to between minus 13 degrees and plus 13 degrees and the state (i.e., the ON state), in which the reflection light is incident to a projection lens, and the state (i.e., the OFF state), in which the reflection light is not incident to the projection lens, is changed over, therefore, an extraneous light generated at the mirror device can be reduced. This operation makes it possible to improve the contrast of an image projected.

Note that the deflection angle is defined as "0" degrees when the mirror is horizontal, that the angle in clockwise direction (CW) is defined as plus (+) and that the angle in counterclockwise direction (CCW) is defined as minus (−), referencing the deflection angle of a mirror in the present specification document.

Meanwhile, when using a light flux, such as a laser light source, which has a small diffusion angle of light emitted from the light source and which is approximately parallel, the numerical aperture NA of an illumination light flux can be reduced on the basis of the relationship of etendue, and therefore reducing the mirror size. As a result, it is possible to obtain a configuration that avoids the mutual interference between the projection light path and illumination light path, and therefore the deflection angle of the mirror can be reduced to ±10 degrees or smaller. Thus, the changeover between the ON state and OFF state can be carried out by making the deflection angle of the mirror small. Moreover, such a deflection angle of the mirror minimizes the contrast of an image.

Meanwhile, it is also possible to control the light intensity by the mirror performing numerous free oscillations between the deflection angles of the ON state and OFF state.

For example, the ON state is +13 degrees and OFF state is −13 degrees, and therefore the mirror that performs numerous free oscillations changes over frequently between the ON state and OFF state, thereby making it possible to cause a smaller light intensity, during a certain period of time, than in a complete ON state that is incident to the projection lens. This enables the adjustment of the intensity of the projection light and a projection with a higher grade of gray scale. Note that the mirror can also be put into a free oscillation at an angle such as ±8 degrees, ±4 degrees, etc., when the deflection angles of the ON state and OFF state are respectively ±13 degrees.

Further, an extraneous light irradiated onto the mirror device can be reduced by synchronizing the free oscillation of a mirror with the timing of the emission of a light source, thereby the heat generated by the light can be effectively reduced.

Furthermore, controlling the intensity of a light source can further improve a gradation. Note that it is preferable the light source to use a light source capable of performing pulse emission, or a laser light source that comprises an illumination intensity variable circuit and that is capable of emitting a light intensity between that of the maximum emission and OFF.

Meanwhile, the distance between the mirror and the address electrode placed on the device substrate can be shortened by decreasing the deflection angle of the mirror to ±10 degrees or less.

As an example, when the deflection angles of the mirror in the ON state and OFF state are respectively ±13 degrees with a drive voltage required for deflecting a mirror of 16 volts, a reduction in the deflection angle to ±6 degrees, respectively, decreases the distance between the mirror and address electrode to a half. Here, the electrostatic force (i.e., a coulomb force) that functions between the address electrode and mirror when deflecting the mirror is inversely proportional to the second power of the distance between the address electrode and mirror. Therefore, a drive voltage applied to the address electrode will be one quarter of the voltage, that is, 4 volts, when the deflection angle of the mirror used to be ±13 degrees.

Note that the control for deflecting a mirror for which the deflection angle of the mirror is decreased to ±10 degrees or smaller as described above is preferably carried out by applying a drive voltage no higher than 5 volts to the address electrode.

Further, the voltage resistance performance of a transistor constituting the address electrode can also be decreased with a reduction in the drive voltage applied to the address electrode.

Furthermore, the drive voltage applied to the address electrode is lowered by shrinking the mirror size to about 4 µm to 9 µm, and accordingly decreasing the drive voltage applied to the address electrode. This configuration makes it possible to thin the circuit-wiring pattern of the control circuit that controls the mirror. The circuit-wiring pattern can be thinned from, for example, 0.25 µm to 0.13 µm.

Next is a description of a laser light source for irradiating light on the above described mirror device.

It is preferable for a laser light source for irradiating light on the mirror device to use a configuration emitting a 3-watt, or higher, laser light with the numerical aperture NA being small, e.g., 0.07 to 0.14, thereby enabling an observation of a bright video image even with the size of a screen increased to a diagonal size of 50 to 100 inches. In the case of a compact projector for mobile use with a projected screen size of about 10 inches, a sufficient level of brightness is available with the power of 0.5 watts or less, or even 0.1 watts. However, since the entire projection apparatus is made to be compact, this requires a device placed inside of the apparatus to use a structure and material that sufficiently withstands a temperature rise due to the heat of the light source.

Another reason for using a laser light source is that it is capable of emitting light with a single wavelength, high directivity and an approximate parallel light flux, thereby making it possible to alleviate the problem of etendue, unlike the case of using a mercury lamp or the like. Because of this, the brightness of light can be enhanced by increasing the light intensity per unit of area of the laser light irradiated onto a mirror device, therefore not reducing the brightness of light even with the substantial reduction of the mirror array of a mirror device.

Furthermore, the laser light source can also be configured to include an illumination light intensity variable circuit for emitting light at an intermediate intensity between the intensity at the maximum light emission and OFF light. This configuration makes it possible to change the intensities of the laser light source. Therefore, the intensity modulated and reflected by a mirror element in accordance with an image signal can be adjusted by controlling the laser light source. It is preferable for laser light source to have at least two emission states, i.e., maximum intensity and 50% thereof or less.

Further, equipping a laser light source with a circuit for carrying out pulse emission alternately between the ON and OFF states makes it possible to perform pulse emission in a predetermined period.

For example, making a laser light source perform pulse emission makes it possible to elongate the pulse interval of OFF and/or thin out the pulse of ON, thereby making it possible to adjust the light intensity in accordance with an image signal (that is, in accordance with the brightness and/or hue of the entire screen).

Furthermore, the utilization of the pulse emission makes it possible to turn OFF the laser light source appropriately when the colors of one frame or those of an image are changed over. Such a control makes it possible to reduce an incidence of light to the mirror device other than when necessary and accordingly mitigate the temperature rise within the package due to an extraneous irradiation of light onto the mirror device. Note that the dynamic range of an image can be made variable to darken the entire screen of a dark image by dimming a laser light. Considering this, the laser light source is preferably configured to be turned OFF at least once during one frame period.

Further, one laser light source may be constituted by a plurality of sub-laser light sources. This configuration and the adjustment of the number of sub-laser light sources emitted make it possible to adjust light intensity. Note that a plurality of sub-laser light sources may comprise a certain number of sub-laser light sources possessing respective wavelengths that are different from the desired single wavelength by only a few nanometers.

When a laser light is irradiated on a mirror device with such a laser light source, the light is absorbed on the mirror surface and the light passes through the gaps between adjacent mirrors, making the light incident to the device substrate and absorbed. This causes the mirror device to accumulate heat.

These sources of heat cause the inside of the package to become high temperature and to thermally expand the individual constituent components and generate a shift in the position of a mirror, possibly disrupting the function of the mirror device.

Accordingly, what is provided is a package for the mirror device to protect the above described mirror device from dust and damage, which can cause an operation failure, reducing light diffusively reflected by the mirror device and effectively radiating heat.

In the package for a mirror device, if a material with a substantially different coefficient of linear expansion from that of the structure members constituting the mirror device and that of the material used for the circuit wiring pattern is used, those components are broken or mutually peeled off due to the difference in thermal expansion.

Therefore, the mirror device is packaged with a material of which the melting point is lower than that of the material used for the structure member constituting the mirror device and of the material used for the wiring, and of which the coefficient of linear expansion is nearly the same. For example, the material for the package includes transparent glass, silicon, ceramic and metallic material.

Embodiment 2

Figure 6:
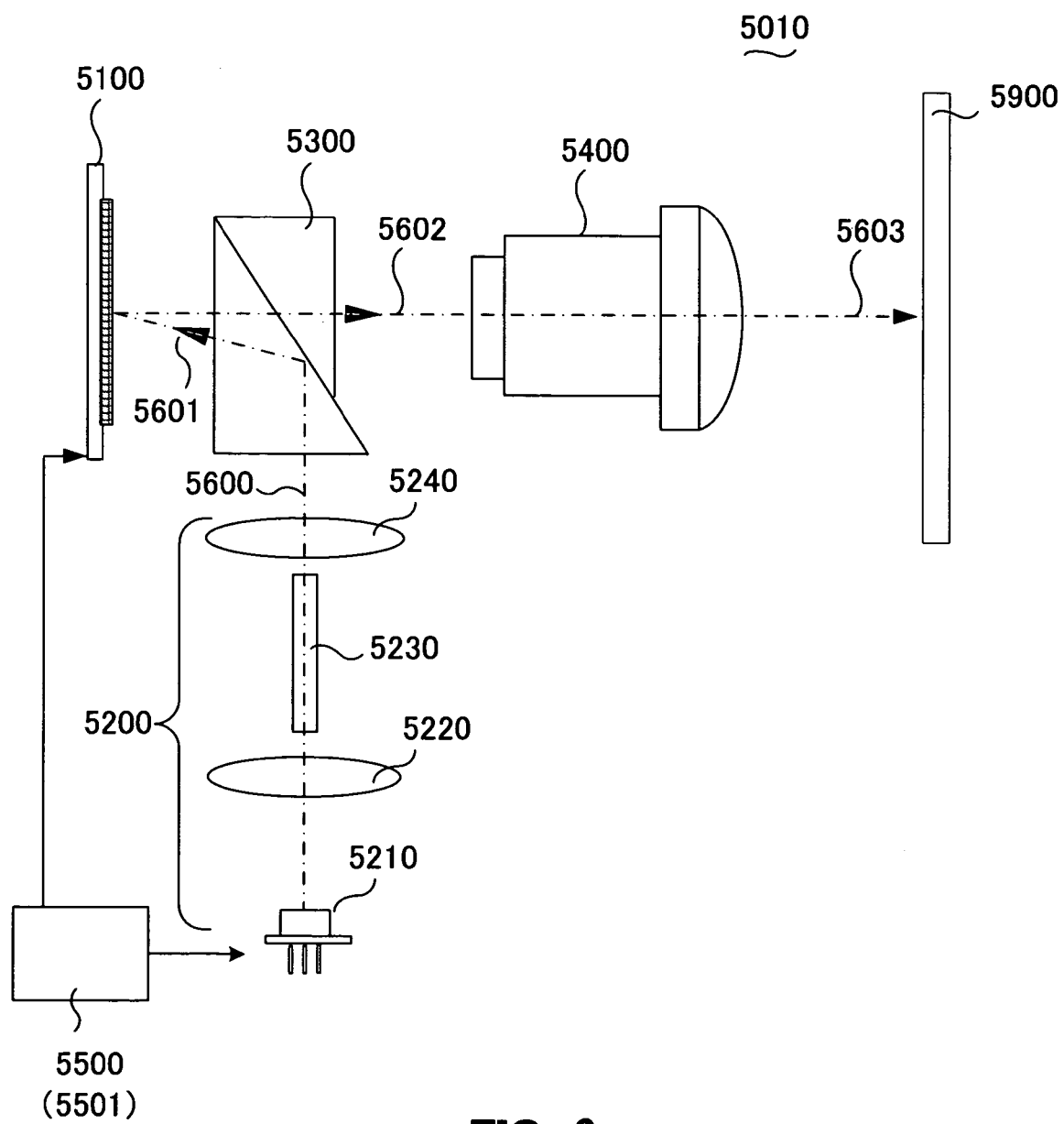
FIG. 6 is a functional block diagram for showing the configuration of a projection apparatus according to a preferred embodiment of the present invention.

FIG. 6 is a conceptual diagram showing the configuration of a projection apparatus according to a preferred embodiment of the present invention.

A projection apparatus 5010 according to the present embodiment comprises a single spatial light modulator (SLM) 5100, a control unit 5500, a Total Internal Reflection (TIR) prism 5300, a projection optical system 5400 and a light source optical system 5200, as exemplified in FIG. 6.

The projection apparatus 5010 is a so-called a "single-panel" projection apparatus 5010 comprising a single spatial light modulator 5100.

In this case, the single spatial light modulator 5100 is constituted by the above described mirror device 2000, and uses any of the above described assembly bodies 2100 through 2400 as a sealing structure.

The spatial light modulator 5100 and TIR prism 5300 are placed in the optical axis of the projection optical system 5400 and the light source optical system 5200 is placed in such a manner that the optical axis matches that of the projection optical system 5400.

The TIR prism 5300 can cause an illumination light 5600, which comes from the light source optical system 5200 placed on its side, to enter the spatial light modulator 5100 at a prescribed inclination angle relative to incident light 5601 and causes a reflection light 5602 to be orthogonally reflected by the spatial light modulator 5100 that is transmitted to reach the projection optical system 5400.

The projection optical system 5400 projects the incoming reflection light 5602 by way of the spatial light modulator 5100 and TIR prism 5300 to a screen 5900, or the like, as projection light 5603.

The light source optical system 5200 comprises a variable light source 5210 for generating the illumination light 5600, for which an emission light intensity, a pulse emission cycle, the number of times of pulse emission, an emission timing, the number of emitting light sources and an emitting light position(s) are variable, a condenser lens 5220 for focusing the illumination light 5600, a rod type condenser body 5230 and a condenser lens 5240.

The variable light source 5210, condenser lens 5220, rod type condenser body 5230 and condenser lens 5240 are sequentially placed in the aforementioned order in the optical axis of the illumination light 5600 emitted from the variable light source 5210 and incident to the side face of the TIR prism 5300.

The projection apparatus 5010 employs a single spatial light modulator 5100 for implementing a color display on the screen 5900 by means of a sequential color display method.

That is, the variable light source 5210, comprising a red laser light source 5211, a green laser light source 5212 and a blue laser light source 5213, which allow independent controls for the light emission states, performs the operation of dividing one frame of display data into a plurality of sub-fields (i.e., three sub-fields, that is, red (R), green (G) and blue (B) in the present case) and causes each of the red laser light source 5211, green laser light source 5212 and blue laser light source 5213 to emit each respective light in time series at the time band corresponding to the sub-field of each color as described later. It is also possible to cause a plurality of color light sources to emit light simultaneously to provide illumination light in white or the complementary colors such as cyan (C), magenta (M) and yellow (Y).

Figure 7A:
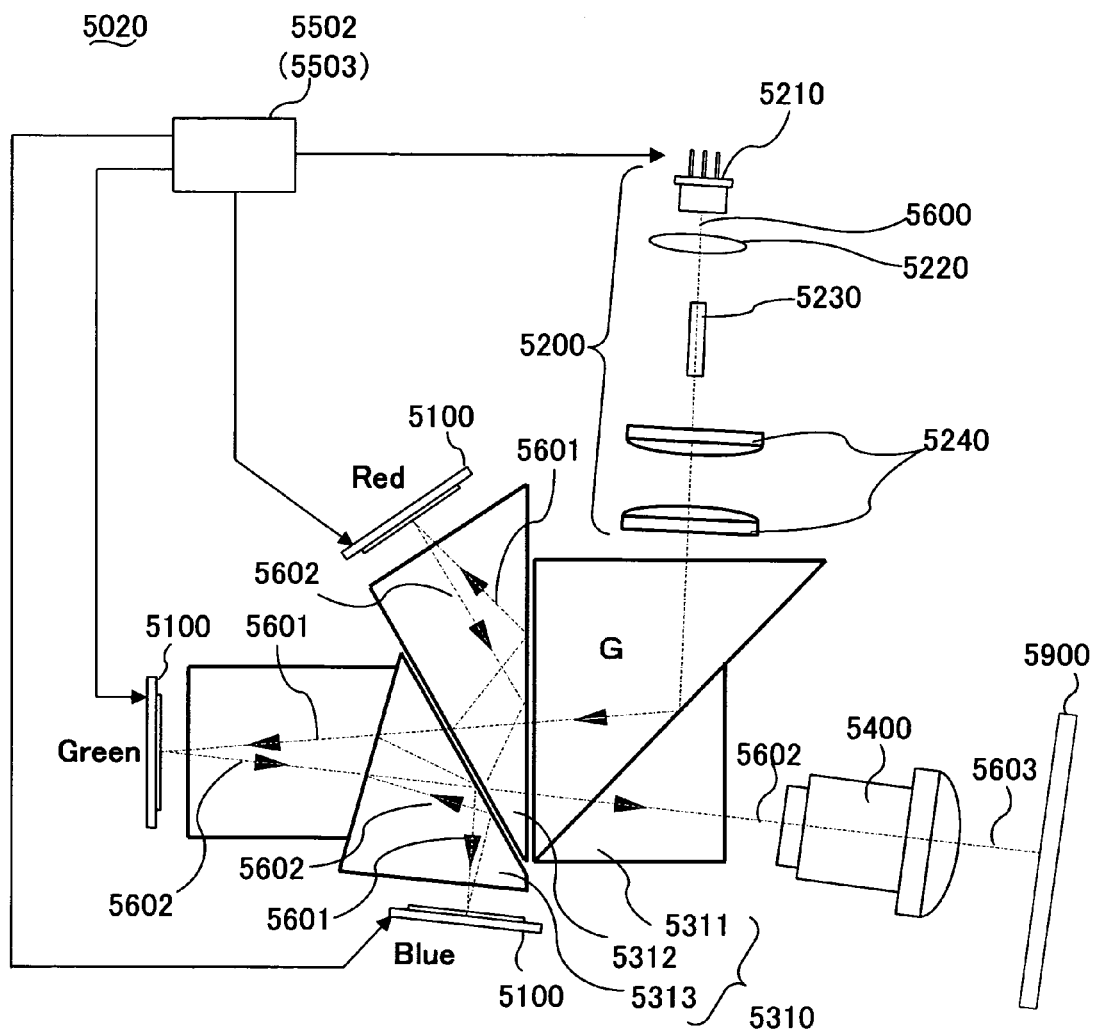
FIG. 7A is a functional block diagram for showing the configuration of a single-panel projection apparatus according to another preferred embodiment of the present invention.

FIG. 7A is a conceptual diagram showing the configuration of a projection apparatus according to another preferred embodiment of the present invention.

The projection apparatus 5020 is a so-called multiple-plate projection apparatus comprising a plurality of spatial light modulators 5100, which is different from the above described projection apparatus 5010. Further, the projection apparatus 5020 comprises a control unit 5501 in place of the control unit 5500.

The projection apparatus 5020 comprises a plurality of spatial light modulators 5100, and is equipped with a light separation/synthesis optical system 5310 between the projection optical system 5400 and each of the spatial light modulators 5100.

The light separation/synthesis optical system 5310 comprises a TIR prism 5311 and a prism 5312, each of which is constituted by plural prisms, and a plurality of prism 5313.

The TIR prism 5311 has the function of guiding the illumination light 5600, which is incident from the side of the optical axis of the projection optical system 5400, to the spatial light modulator 5100 as incident light 5601.

The light separation/synthesis optical system 5310 separates red (R) light from an incident light 5601 incident by way of the TIR prism 5311 and causes the red light to be incident to the red light-use spatial light modulators 5100, and guides the reflection light 5602 of the modulated red light to the direction of the TIR prism 5311.

Likewise, the TIR prism 5313 of the light separation/synthesis optical system 5310 separates blue (B) and green (G) lights from the incident light 5601 incident by way of the TIR prism 5311 and causes them to be incident to the blue color-use and green color-use spatial light modulators 5100, and guides the reflection light 5602 of the modulated green and blue lights to the TIR prism 5311.

Therefore, the spatial light modulations of three colors R, G and B are simultaneously performed at the three spatial light modulators 5100, respectively, and the modulated reflection lights 5602 are projected onto the screen 5900 as projection light 5603 by way of the projection optical system 5400, and thus a color display is produced.

Note that various modifications are conceivable for a light separation/synthesis optical system, in lieu of being limited to the light separation/synthesis optical system 5310.

Figure 7B:
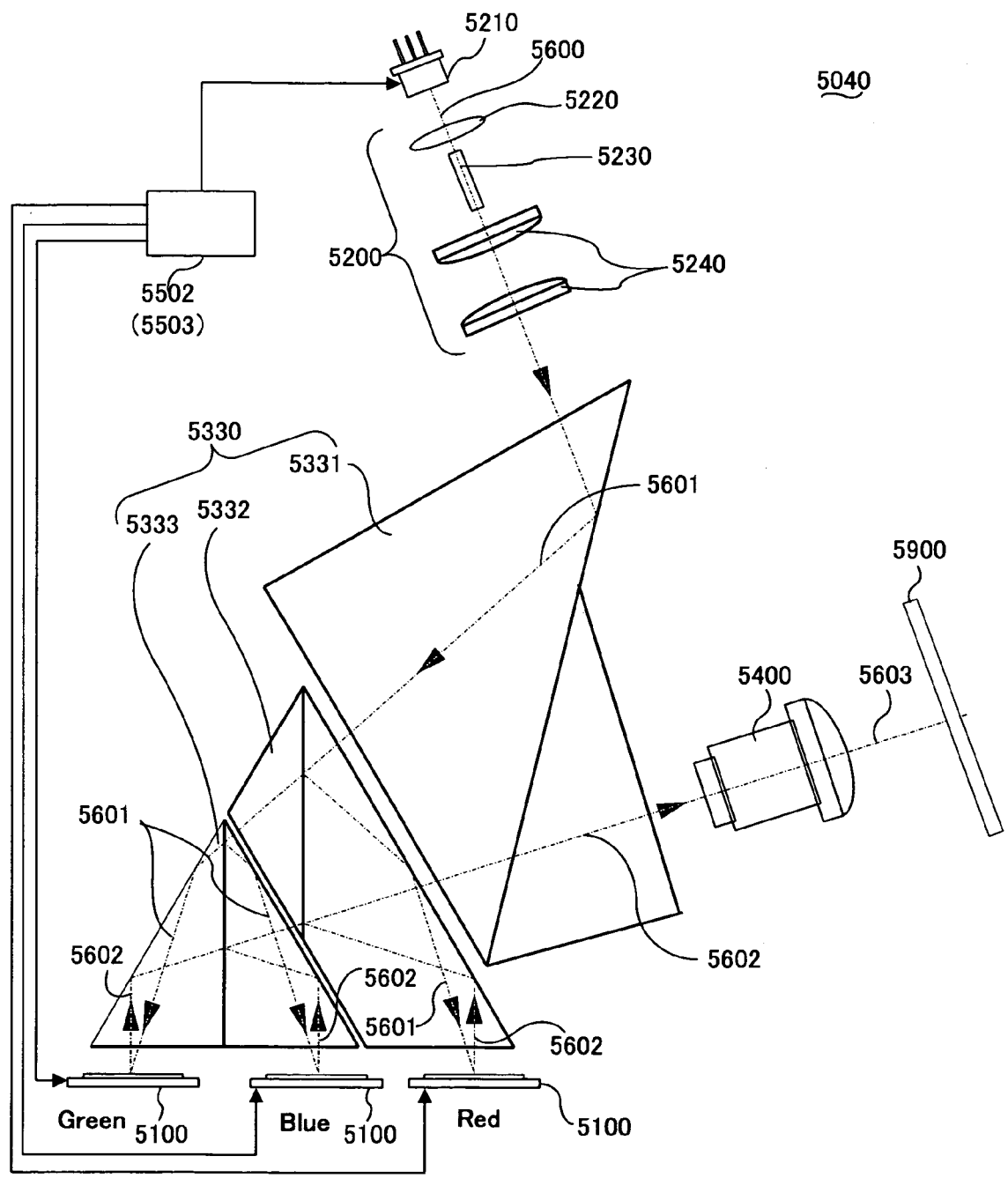
FIG. 7B is a functional block diagram for showing yet another exemplary embodiment of a multi-panel projection apparatus according to a preferred embodiment of the present invention.

FIG. 7B is a conceptual diagram showing the configuration of an exemplary modification of a multi-panel projection apparatus according to another preferred embodiment of the present invention.

The projection apparatus 5040 differs from the above described projection apparatuses 5020 and 5030 where the former is equipped with a plurality of spatial light modulators 5100, which are respectively provided for the individual colors R, G and B, on one side of a light separation/synthesis optical system 5330, with the spatial light modulators 5100 adjacent to one another on the same plane.

This configuration makes it possible to place a plurality of spatial light modulators 5100 integrally in the same mounting unit as a package while saving space.

The light separation/synthesis optical system 5330 comprises a TIR prism 5331, a prism 5332 and a prism 5333.

The TIR prism 5331 guides the illumination light 5600, which is incident from the side direction of the optical axis of the projection optical system 5400 to spatial light modulators 5100 as incident light 5601.

The prism 5332 separates a red color light from the incident light 5601 and guides it to the red color-use spatial light modulator 5100, and also captures the reflection light 5602 and guides it to the projection optical system 5400.

Likewise, the prism 5333 separates the green- and blue-color incident lights 5601 from the incident light 5601, making them incident to the individual spatial light modulators 5100 equipped correspondently with the respective colors, and captures the reflection lights 5602 of the respective colors to lead them to the projection optical system 5400.

Figure 8A:
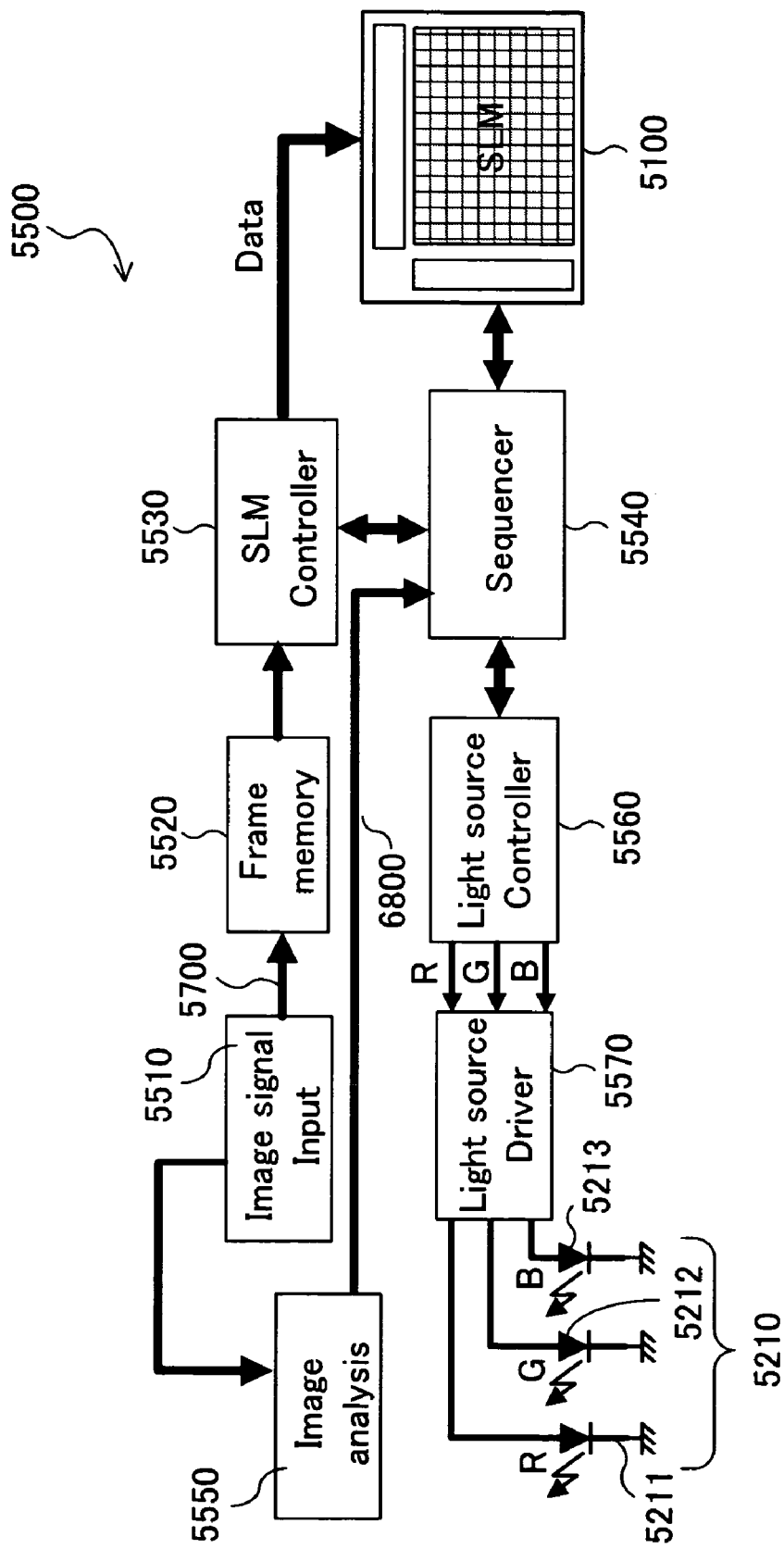
FIG. 8A is a functional block diagram for showing the configuration of a control unit comprised in a single-panel projection apparatus according to a preferred embodiment of the present invention.

FIG. 8A is a functional block diagram that exemplifies the configuration of the control unit 5500 comprised in the above described single-panel projection apparatus 5010. The control unit 5500 comprises a frame memory 5520, an SLM controller 5530, a sequencer 5540, a video image analysis unit 5550, a light source control unit 5560 and a light source drive circuit 5570.

The sequencer 5540, constituted by a microprocessor and the like, controls the operation timing and the like of control unit 5500 and spatial light modulators 5100.

The frame memory 5520 retains, for example, one frame of input digital video data 5700 incoming from an external device (not shown in a drawing herein), which is connected to video signal input unit 5510. The input digital video data 5700 is updated, moment-by-moment, every time the display of one frame is completed.

The SLM controller 5530 processes the input digital video data 5700 read from the frame memory 5520 as described later, separates the read data into a plurality of sub-fields 5701 through 5703, and outputs them to the spatial light modulators 5100 as binary data 5704 and non-binary data 5705, which are used for implementing an the ON/OFF control and oscillation control (which are described later) of a mirror 5112 of the spatial light modulator 5100.

The sequencer 5540 outputs a timing signal to the spatial light modulators 5100 in sync with the generation of the binary data 5704 and non-binary data 5705 performed at the SLM controller 5530.

The video image analysis unit 5550 outputs a light source profile control signal 5800 used for generating various light source patterns (which are described later) on the basis of the input digital video data 5700 inputted from the video signal input unit 5510.

The light source control unit 5560 generates light source pulse patterns 5801 through 5811 (which are described later) on the basis of the light source profile control signal 5800 obtained from the video image analysis unit 5550 by way of the sequencer 5540 and controls, by way of the light source drive circuit 5570, the operation of the variable light source 5210 emitting the illumination light 5600.

The variable light source is desirably an LED or laser and a light source for which the emission state is variable in a plurality of times within one frame or one sub-frame.

The light source drive circuit 5570 performs the operation of driving the red LED or laser light source 5211, green LED or laser light source 5212 and blue LED or laser light source 5213 of the variable light source 5210 to cause any of them to flash, respectively, on the basis of the light source pulse patterns 5801 through 5811 (which are described later), which are input from the light source control unit 5560.

Figure 8B:
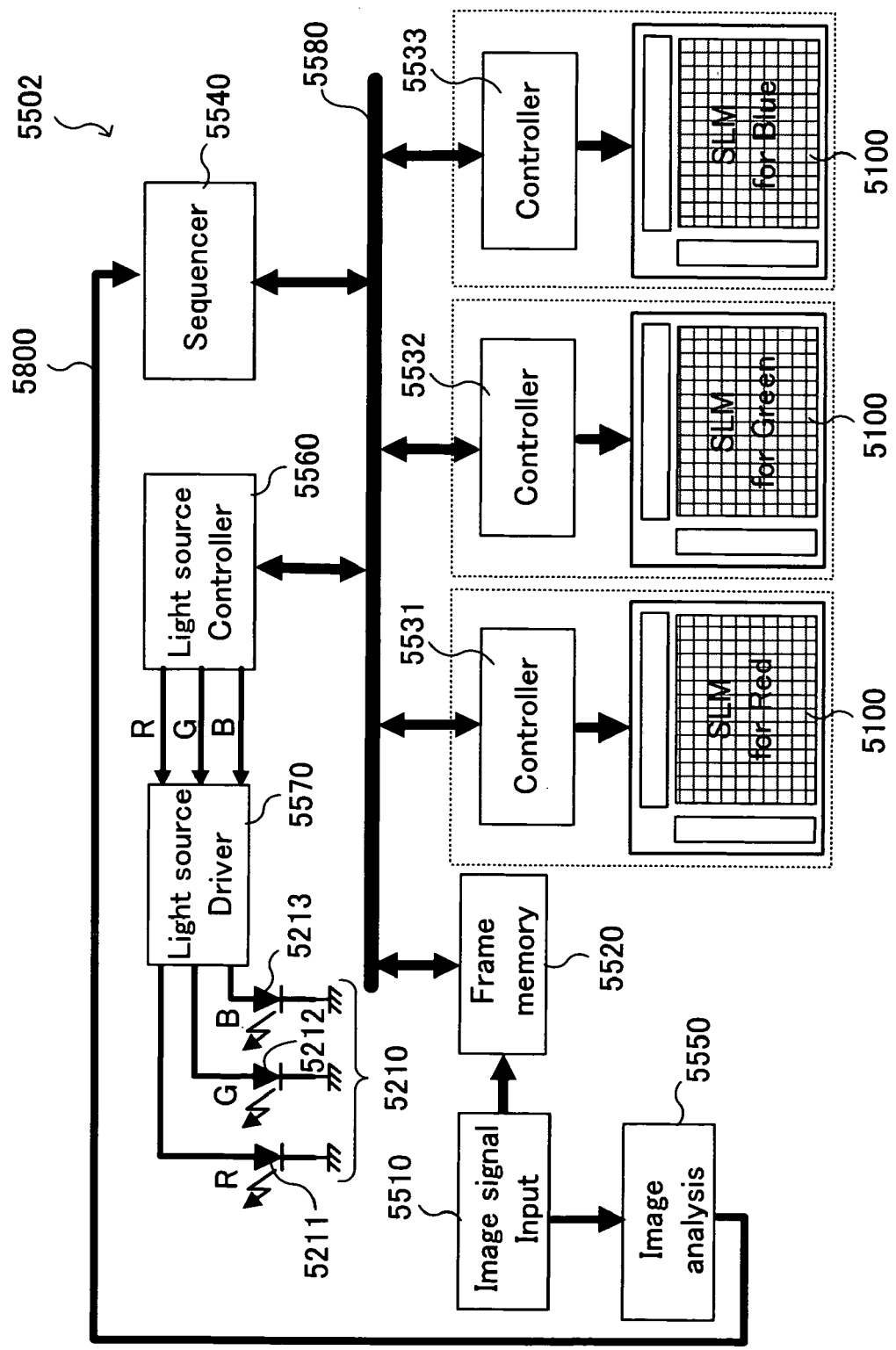
FIG. 8B is a functional block diagram for showing the configuration of a control unit comprised in a multi-panel projection apparatus according to a preferred embodiment of the present invention.

FIG. 8B is a functional block diagram exemplifying the configuration of the control unit of a multi-panel projection apparatus according to the present embodiment.

The control unit 5502 comprises a plurality of SLM controllers 5531, 5532 and 5533, which are used for controlling each of the plurality of spatial light modulators 5100 equipped for the respective colors R, G and B, and the configuration of the respective controllers is the difference between control unit 5502 and control unit 5500.

That is, the SLM controller 5531, SLM controller 5532 and SLM controller 5533, corresponding to the respective color-use spatial light modulators 5100 are equipped with the same substrates as those of the respective spatial light modulators 5100. This configuration makes it possible to improve the rate of data transfers between the individual spatial light modulators 5100 and the corresponding SLM controller 5531, SLM controller 5532 and SLM controller 5533.

Further, a system bus 5580 is equipped to connect the frame memory 5520, light source control unit 5560, sequencer 5540 and SLM controllers 5531 through 5533, in order to speed up and simplify the connection path of each connecting element.

Figure 8C:
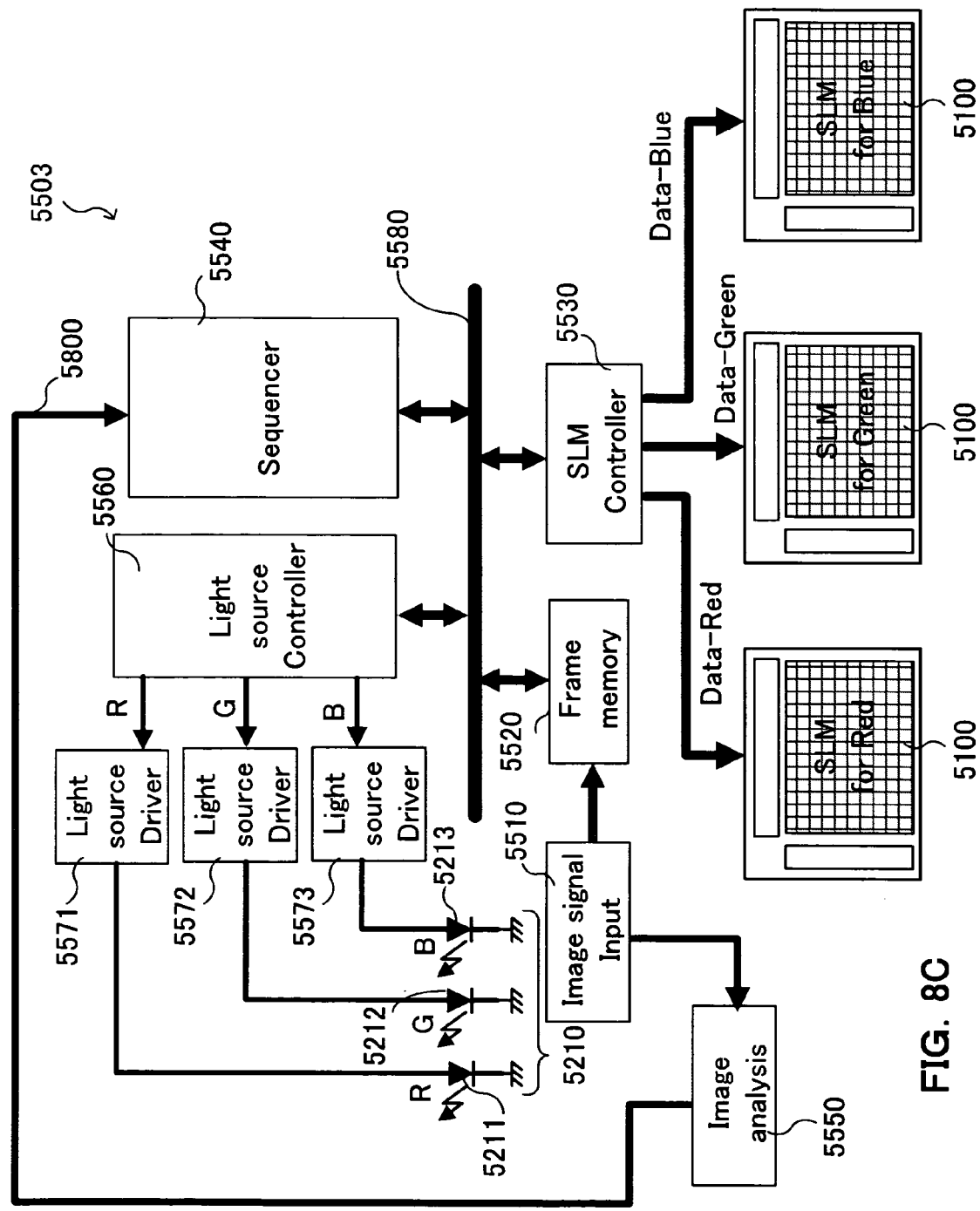
FIG. 8C is a functional block diagram for showing an exemplary modification of the configuration of a control unit used for a multi-panel projection apparatus according to a preferred embodiment of the present invention.

FIG. 8C is a functional block diagram showing a modified embodiment of the configuration of a control unit used for a multi-panel projection apparatus according to the present embodiment.

The control unit 5503 is different from control unit 5500 where the former is equipped with a light source drive circuit 5571, a light source drive circuit 5572 and a light source drive circuit 5573, which are specifically used for a plurality of red laser light source 5211, green laser light source 5212 and blue laser light source 5213, respectively, and where a common SLM controller 5530 controls each of a plurality of spatial light modulators 5100 equipped for the respective colors R, G and B.

This configuration enables a single chip SLM controller 5530 to control the plurality of spatial light modulators 5100, thereby shrinking the apparatus. Further, if a plurality of mirror devices is placed in one package, at least a part of the controller can also be placed in the package.

Next is a description, in detail, of an exemplary configuration of a spatial light modulator 5100 according to the present embodiment.

The spatial light modulator 5100 according to the present embodiment is a deflective mirror device in which a plurality of mirror elements is arranged in array (noted as "arrayed" hereinafter).

Figure 9:
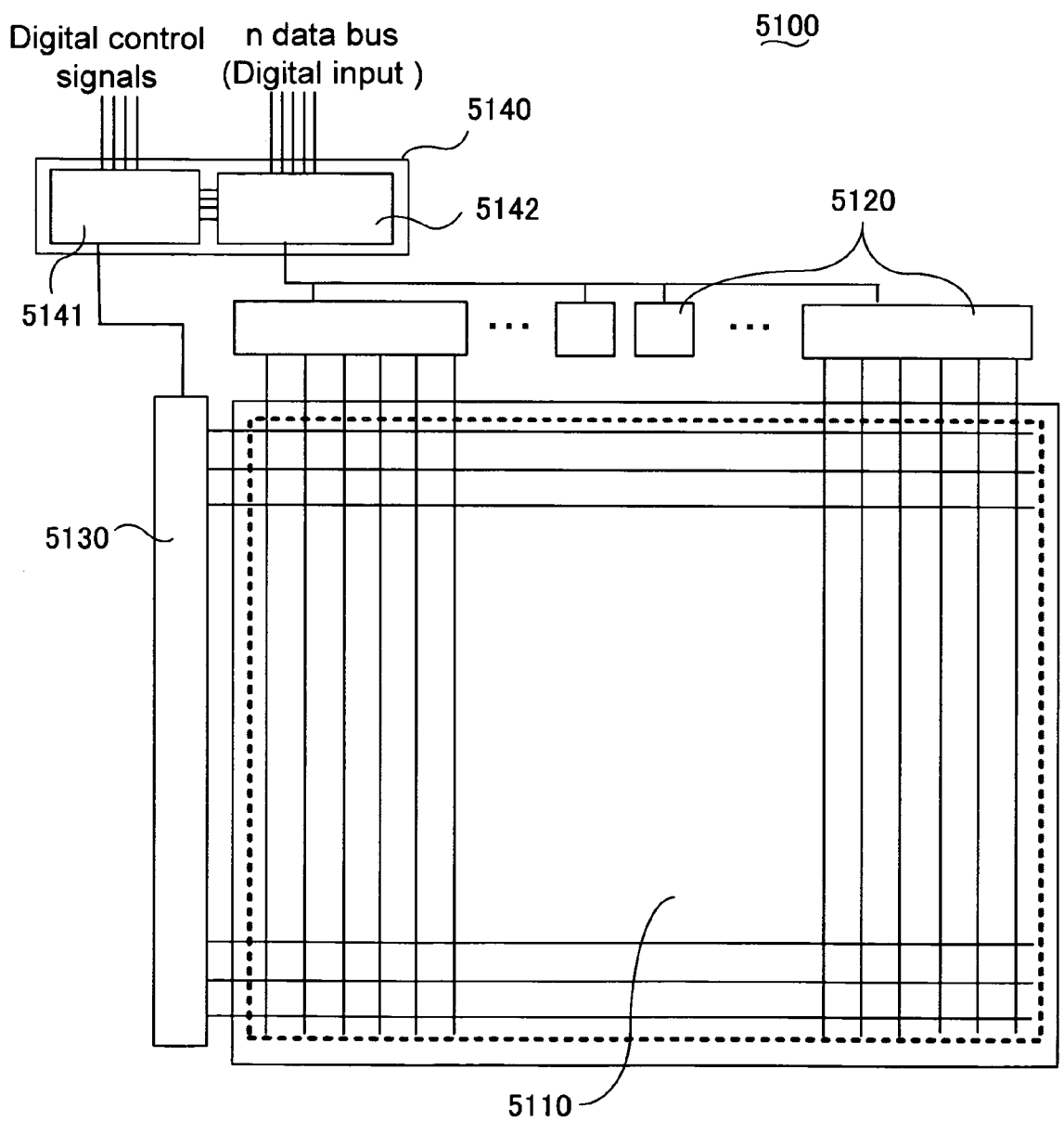
FIG. 9 is a schematic circuit diagram for showing a layout of the internal comprisal of a spatial light modulator according to the embodiment of the present invention.

FIG. 9 is a conceptual diagram exemplifying the layout of the internal configuration of the spatial light modulator 5100 according to the present embodiment.

Figure 10:
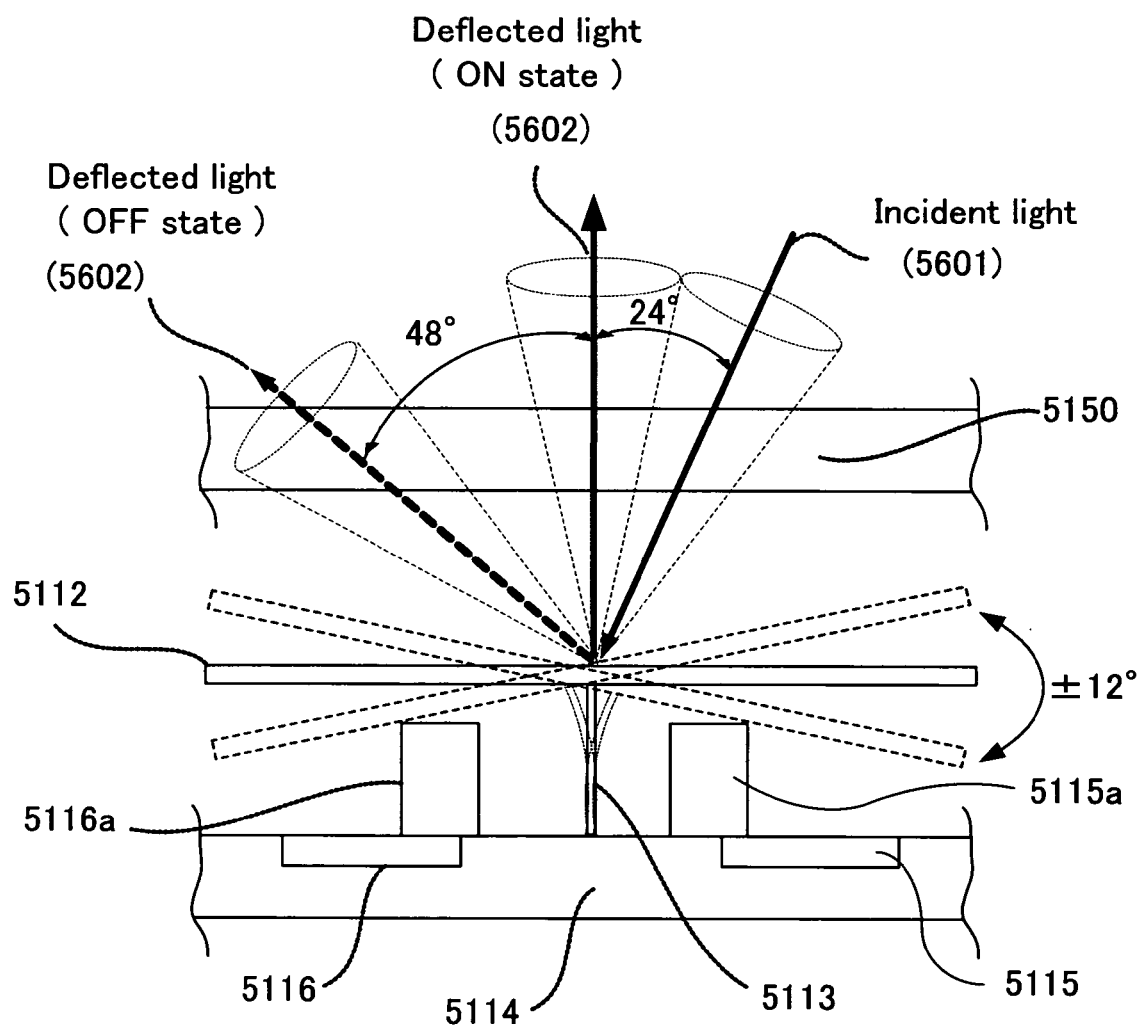
FIG. 10 is a cross-sectional diagram of an individual pixel unit constituting a spatial light modulator according to the preferred embodiment of the present invention.
Figure 11:
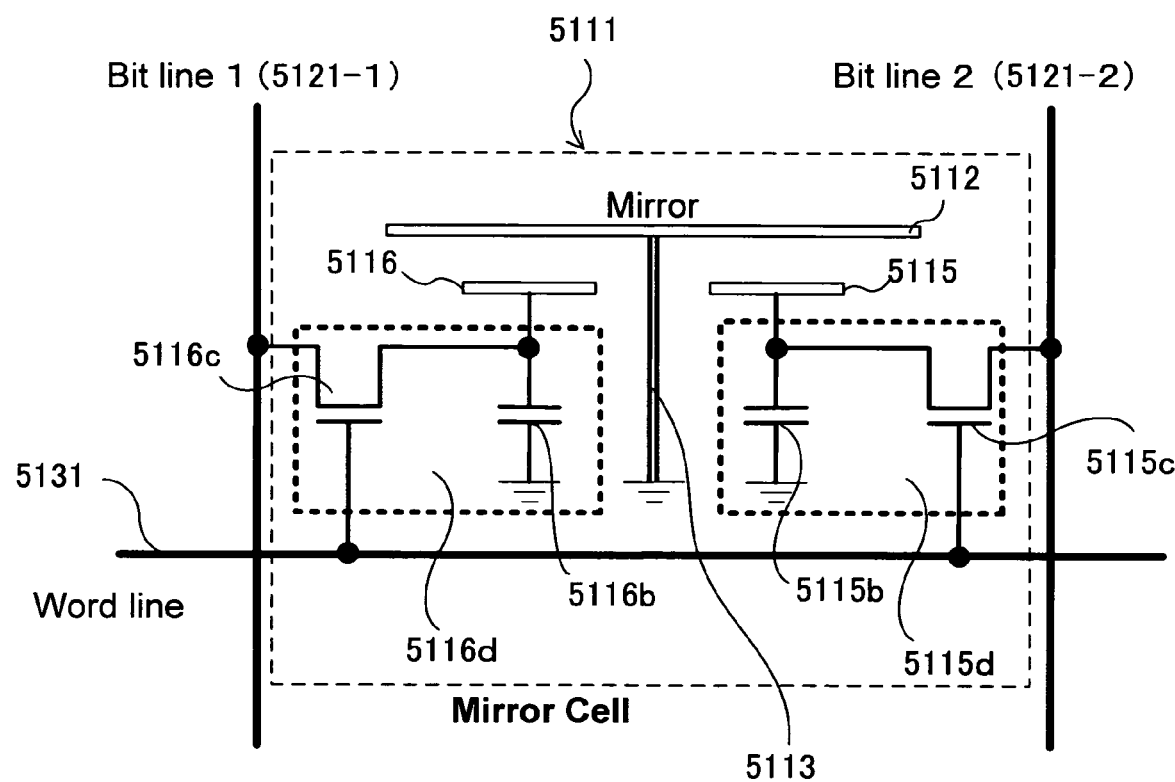
FIG. 11 is a side cross sectional view to illustrate the configuration of an individual pixel unit constituting a spatial light modulator according to the embodiment of the present invention.

FIG. 10 is a cross-sectional diagram of an individual pixel unit constituting the spatial light modulator 5100 according to the present embodiment. FIG. 11 is a conceptual diagram exemplifying the configuration of an individual pixel unit constituting the spatial light modulator 5100 according to the present embodiment.

As exemplified in FIG. 9, the spatial light modulator 5100 according to the present embodiment comprises a mirror element array 5110, column drivers 5120, ROW line decoders 5130 and an external interface unit 5140. The external interface unit 5140 comprises a timing controller 5141 and a selector 5142. The timing controller 5141 controls the ROW line decoder 5130 on the basis of a timing signal from the sequencer 5540. The selector 5142 supplies the column driver 5120 with a digital signal incoming from the SLM controller 5530.

As exemplified in FIG. 11, in the mirror element array 5110, a plurality of mirror elements 5111 is arrayed at the positions where individual bit lines 5121, which are vertically extended respectively from the column drivers 5120, cross individual word lines 5131 which are horizontally extended respectively from the row line decoders 5130.

As exemplified in FIG. 10, the individual mirror element 5111 is comprised of a freely deflectable mirror 5112 supported on a substrate 5114 by way of a hinge 5113. The mirror 5112 is covered with a cover glass 5150 for protection.

An OFF electrode 5116 (and an OFF stopper 5116a) and an ON electrode 5115 (and an ON stopper 5115a) are placed by positioning them symmetrically across the hinge 5113 on the substrate 5114.

The OFF electrode 5116 attracts the mirror 5112 with a coulomb force by the application of a predetermined voltage and tilts the mirror 5112 to a position of contact with the OFF stopper 5116a. This causes the incident light 5601 incident to the mirror 5112 to be reflected in a light path in an OFF position that is shifted from the optical axis of the projection optical system 5400.

The ON electrode 5115 attracts the mirror 5112 with a coulomb force by the application of a predetermined voltage and tilts the mirror 5112 to a position of contact with the ON stopper 5115a. This causes the incident light 5601 incident to the mirror 5112 to be reflected in a light path in the ON position matching the optical axis of the projection optical system 5400.

Figure 12:
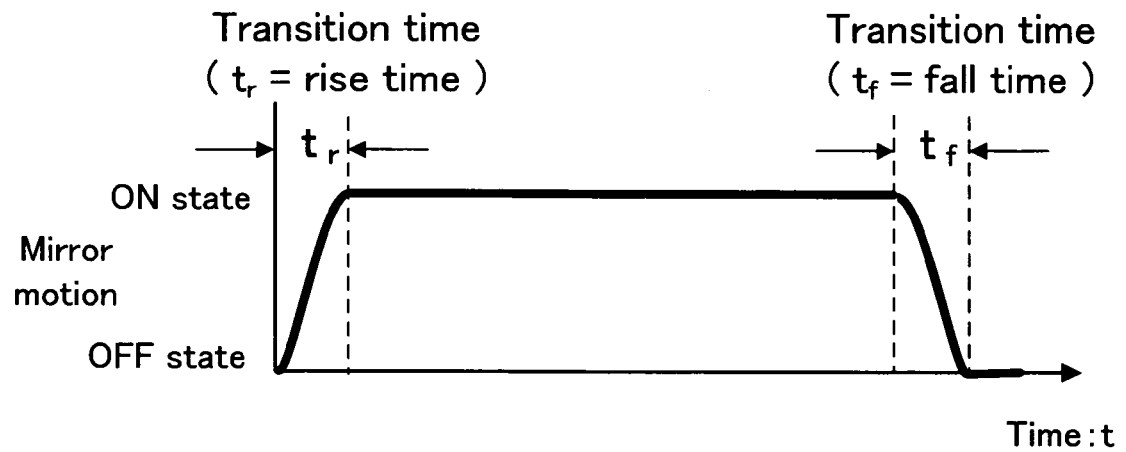
FIG. 12 is a timing diagram for showing a transition response between the ON state and OFF state of a mirror of a spatial light modulator.

FIG. 12 is a chart showing a transition response between the ON state and OFF state of the mirror 5112. In the transition from the OFF state, in which the mirror is attracted by the OFF electrode 5116 and in contact with the OFF stopper 5116a, to the ON state, in which the mirror is attracted by the ON electrode 5115 and in contact with the ON stopper 5115a, a rise time $t_r$ is required until the transition to a complete ON state at the beginning of the transition start, and likewise a fall time $t_f$ is required until the transition to a complete OFF state.

Since the state of the reflection light 5602 is unstable during the period between the rise time $t_r$ and fall time $t_f$, therefore the present embodiment is configured to reduce the emission of the variable light source 5210 as described later, thereby eliminating the generation of such unstable reflection light 5602.

Figure 13:
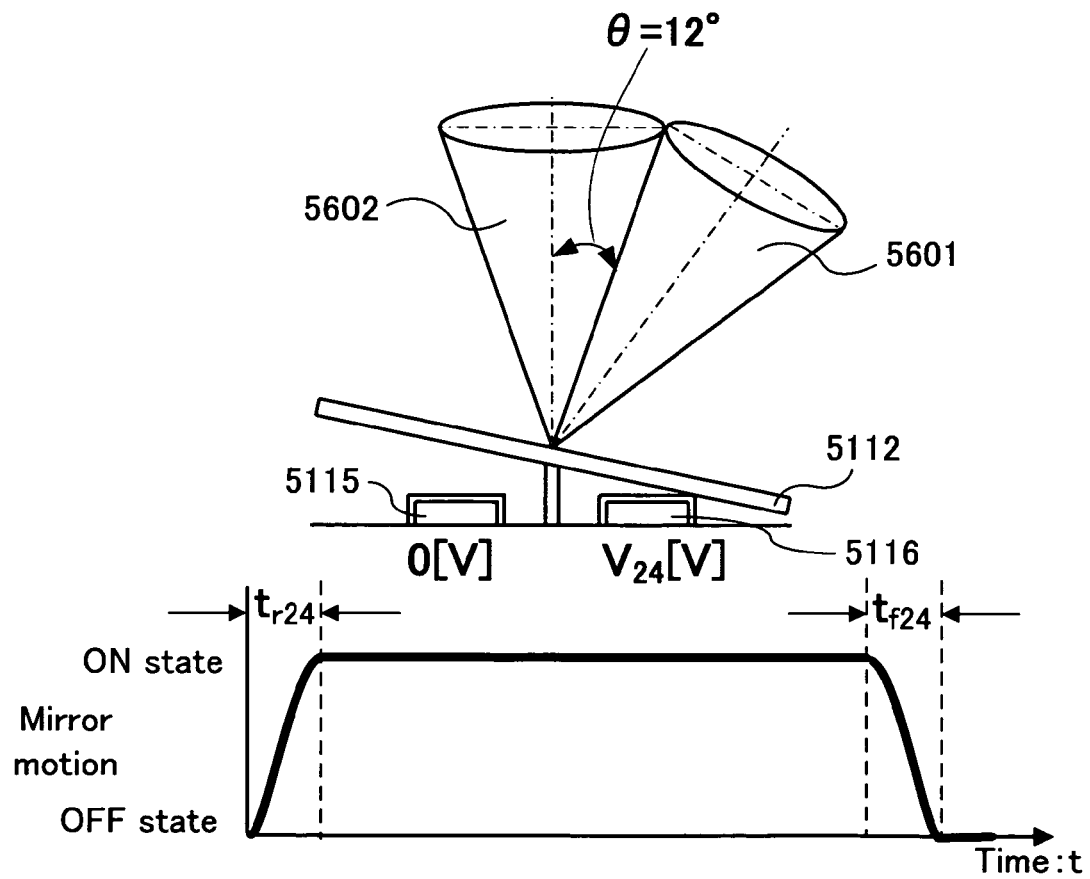
FIG. 13 is a side perspective view for showing the tilt states of a mirror when using a non-directive light source such as a high-pressure mercury lamp and a xenon lamp.

FIG. 13 is a conceptual diagram showing a tilting state of the mirror 5112 when a non-directional light source, such as the conventional high-pressure mercury lamp and xenon lamp, is used.

In the conventional technique, the spreads of incident light 5601 and reflection light 5602 are large, and therefore the tilt angle of the mirror 5112 needs to be set at about ±12 degrees in order to increase the contrast and the like by avoiding the interference between the two lights 5601 and 5602, making the optical axes formed by the illumination light and reflection light 24 degrees. Consequently, both the rise time $t_{r24}$ and fall time $t_{f24}$ are extended in the ON/OFF control of the mirror 5112, and the voltage ($V_{24}$) to be applied to the ON electrode 5115 and OFF electrode 5116 for tilting the mirror 5112 by means of a static electric attraction is also increased.

Figure 14:
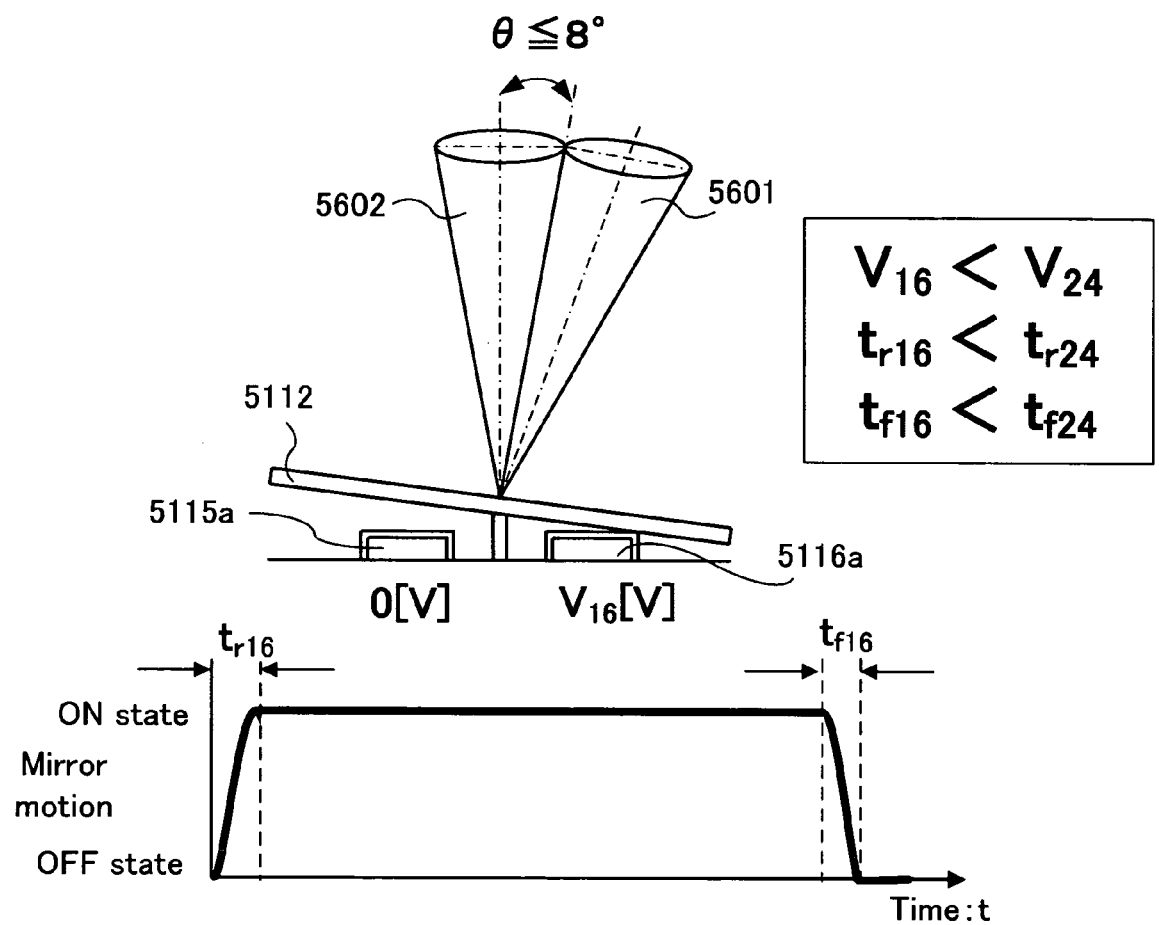
FIG. 14 is a side perspective view for showing an ON/OFF control for a mirror of a spatial light modulator according to the embodiment of the present invention.

FIG. 14 is a conceptual diagram showing the ON/OFF control of the mirror 5112 in a spatial light modulator 5100 according to the present embodiment.

The projection apparatus according to the present embodiment is configured to use, as the variable light sources 5210, the red laser light source 5211, green laser light source 5212 and blue laser light source 5213, all with high directivity, thereby making it possible to decrease the tilting angle θ of the mirror 5112 to about ±8 degrees.

As a result, the rise time $t_{r16}$ and fall time $t_{f16}$ can be reduced from the conventional rise time $t_{r24}$ and fall time $t_{f24}$ or the like.

Also, a voltage ($V_{16}$) applied to the ON electrode 5115 and OFF electrode 5116 for tilting the mirror 5112 by means of an electrostatic attraction can be reduced from the conventional voltage $V_{24}$.

As exemplified by the above described FIG. 11, an OFF capacitor 5116b is connected to the OFF electrode 5116, and the OFF capacitor 5116b is connected to a bit line 5121-1 and a word line 5131 by way of a gate transistor 5116c.

Further, an ON capacitor 5115b is connected to the ON electrode 5115, and the ON capacitor 5115b is connected to a bit line 5121-2 and a word line 5131 by way of a gate transistor 5115c.

The opening and closing of the gate transistor 5116c and gate transistor 5115c is controlled by the word line 5131. That is, the mirror elements 5111 on one horizontal row in line with an arbitrary word line 5131 are simultaneously selected, and the charging, and discharging, the charge in the OFF capacitor 5116b and ON capacitor 5115b are controlled by the bit lines 5121-1 and 5121-2, respectively, therefore the ON and OFF of the mirrors 5112 of the individual mirror elements 5111 on the present one horizontal row are respectively controlled. Each of the memory cells, constituted by the field effect transistor (FET) and capacitance and connected to the ON electrode and OFF electrode, has a dynamic random access memory (DRAM) structure, in this configuration. Each memory cell structure is arbitrary and it may have a memory structure such as a static random access memory (SRAM) structure.

Embodiment 3

Figure 15A:
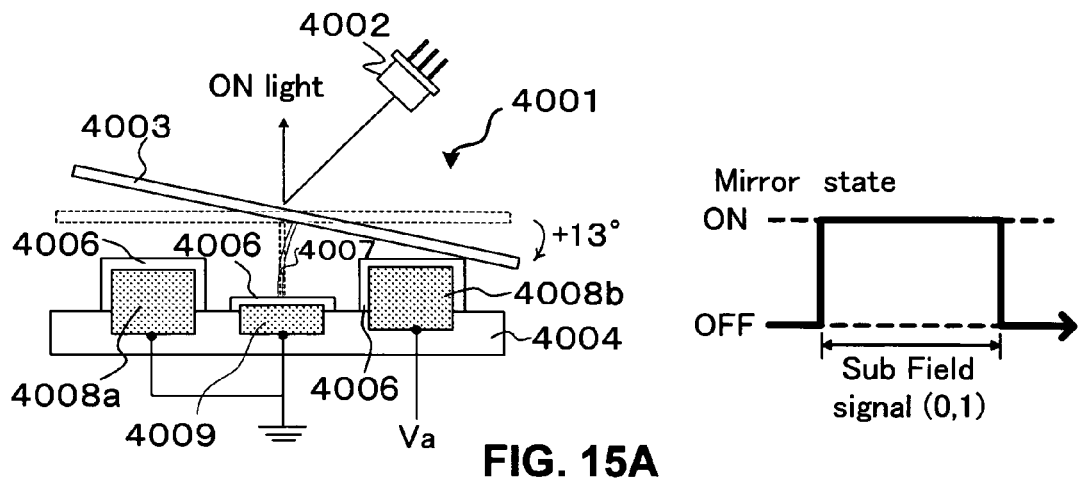
FIG. 15A is a side cross sectional view and a timing diagram for depicting how incident light is reflected towards a projection optical system by deflecting a mirror element.
Figure 15B:
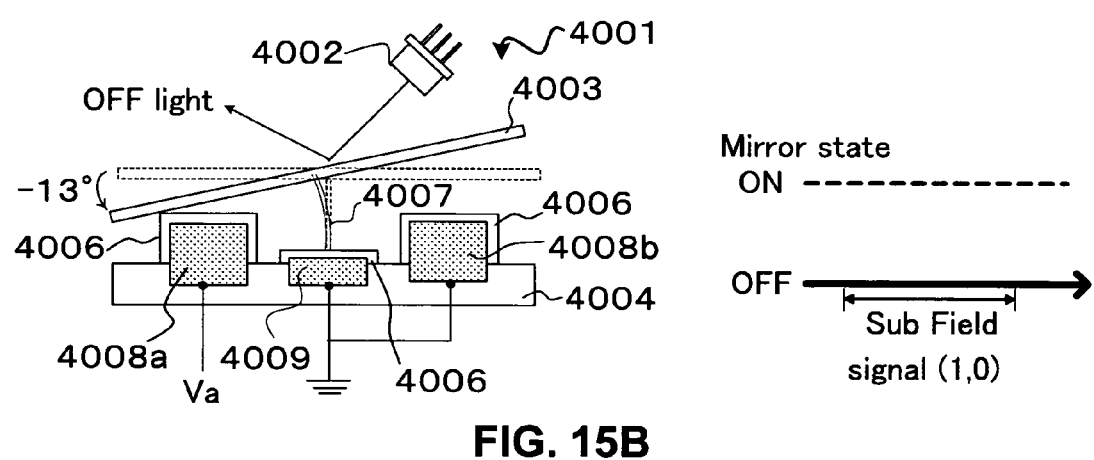
FIG. 15B is a side cross sectional view and a timing diagram for depicting how an incident light is reflected away from a projection optical system by deflecting the mirror of a mirror element.
Figure 15C:
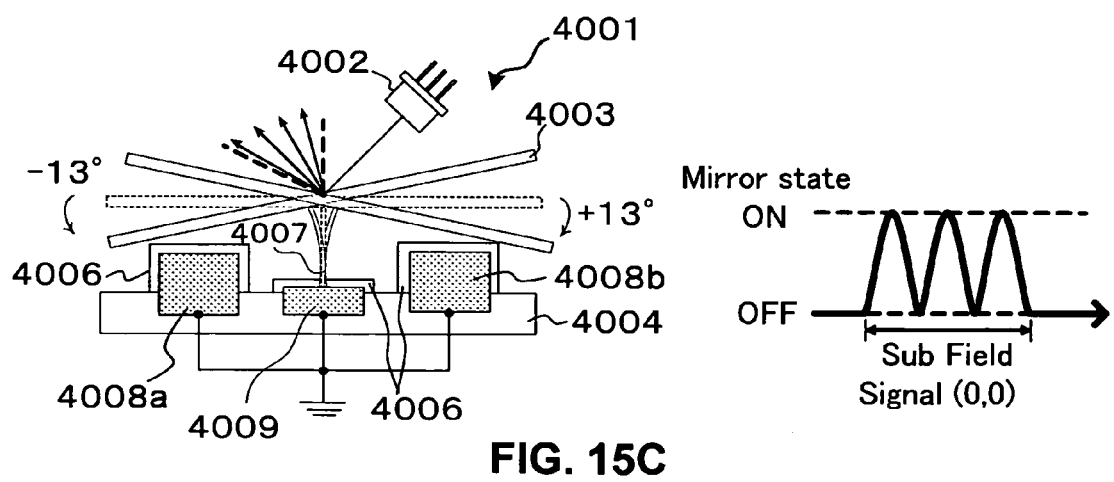
FIG. 15C is a side cross sectional view and a timing diagram for depicting how a reflection of incident light is repeatedly reflected towards and away from a projection optical system and a reflection of the incident light the projection optical system are repeated by the free oscillation of the mirror element.

Next is a description of the deflecting operation of the mirror 5112 of the mirror element 5111 shown in FIG. 11 by referring to FIGS. 15A through 15C.

FIG. 15A is a diagram depicting how an incident light is reflected to a projection optical system by deflecting a mirror element.

Giving a control signal (0, 1) to the memory cells 5116d and 5115d (which are not shown here) described in FIG. 11 applies a voltage of "0" volts to the address electrode 4008a of FIG. 15A and applies a voltage of Ve volts to the address electrode 4008b. As a result, the mirror 5112 is deflected from a deflection angle of "0" degrees, i.e., the horizontal state, to that of +13 degrees attracted by a coulomb force in the direction of the address electrode 4008*b* to which the voltage of Ve volts is applied. This causes the incident light to be reflected by the mirror 5112 toward the projection optical system (which is called the ON light state).

Note that the present specification document defines the deflection angles of the mirror 5112 as "+" (positive) for clockwise (CW) direction and "−" (negative) for counter-clockwise (CCW) direction, with "0" degrees as the initial state of the mirror 5112.

Further, an insulation layer 4006 is provided on the device substrate 4004, and a hinge electrode 4009 connected to the elastic hinge 4007 is grounded through the insulation layer 4006.

The insulation layer 4006 is made of an oxidized compound, a nitride compound, silicon or silicide, with the specific examples being SiC, $SiO_2$, $Al_2O_3$ and Si. The dielectric strength voltage of the insulation layer determines the film thickness to withstand a higher voltage required for driving a mirror. The dielectric strength voltage may be designated at two times, or higher, the drive voltage of the mirror, or no less than 10 volts. Further, selecting a material, for the insulation material, possessing resistance to an etchant in an etching process makes it possible to also serve as an electrode protection film for an etching process for a sacrifice layer, thus simplifying the production process, which is ideal.

Furthermore, the present embodiment is configured such that the address electrodes 4008*a* and 4008*b* each also fill the role of a stopper to determine the deflection angle of mirror. That is, the deflection angle is determined by the mirror contacting with the insulation layer 4006, so that the mirror does not directly contact the electrode.

The deflection angle of mirror is an angle determined by the aperture ratio of a projection lens satisfying a theoretical resolution determined on the basis of the pitch of adjacent mirrors. Alternatively, it is possible to designate an angle equal to the determined angle or larger. The deflection angle of mirror is, for example, any value between 10 and 13 degrees relative to the horizontal state of the mirror 4003 or any value between 2 and 10 degrees relative to the aforementioned horizontal state. The electrode also fills the role of a stopper, and makes it possible to maximize the space for placing the electrode, when a mirror element is reduced, as compared when the electrode and stopper are placed separately in the conventional practice. This is known is a phenomenon called a stiction, that is, the mirror 4003 is stuck to the insulation layer 4006 at the contact surface due to surface tension and intermolecular force when the mirror 4003 is deflected, hampering the operation. Therefore, it is preferable to provide the mirror 4003 and stopper part with a surface inactive material, such as halide, in order to reduce the occurrence of the stiction phenomenon.

With reference to FIG. 15A, next is a description of an exemplary configuration of the mirror element of a mirror device according to the present embodiment.

In the mirror element 4001 shown in FIG. 15A, a mirror 4003, which is made of a high reflectance material such as aluminum and gold, is supported by an elastic hinge 4007 made of a silicon material, a metallic material and the like, and is placed on a device substrate 4004. Here, the silicon material comprehends poly-silicon, single crystal silicon and amorphous silicon, while the metallic material comprehends aluminum, titanium and an alloy of some of these metallic materials, or a composite material. The mirror 4003 has the form of an approximate square, with the length of one side being, for example, any size between 4 µm and 10 µm. Further, the pitch between adjacent mirrors is any value between, for example, 0.15 µm and 0.55 µm.

FIG. 15B is a diagram depicting how an incident light is not reflected to a projection optical system by deflecting a mirror element.

Giving a control signal (1, 0) to the memory cells 5116*d* and 5115*d* (which are not shown here) described in FIG. 11 applies a voltage of Ve volts to the address electrode 4008*a* shown in FIG. 15B, and "0" volts to the address electrode 4008*b* shown in FIG. 15B. As a result, the mirror 4003 is deflected from a deflection angle of "0" degrees, i.e., the horizontal state, to that of −13 degrees attracted by a coulomb force in the direction of the address electrode 4008*a* to which the voltage of Ve volts is applied. This causes the incident light to be reflected by the mirror 4003 to elsewhere other than the light path toward the projection optical system (which is called the OFF light state).

FIG. 15C is a diagram depicting how the reflection of an incident light to a projection optical system and the reflection of the incident light not to the projection optical system are repeated by free-oscillating a mirror element.

In either of the states shown in FIGS. 15A and 15B, in which the mirror 4003 is pre-deflected, giving of a signal (0, 0) to the memory cells 5116*d* and 5115*d* (which are not shown here) a voltage of "0" volts is applied to the address electrodes 4008*a* and 4008*b*. As a result, the coulomb force, which has been generated between the mirror 4003 and the address electrode 4008*a* or 4008*b*, is eliminated so that the mirror 4003 performs a free oscillation within the range of the deflection angles, ±13 degrees in accordance with the property of the elastic hinge 4007. The incident light is reflected toward the projection optical system only within the range of a deflection angle to produce the ON light in association with the free oscillation of the mirror 4003. The mirror 4003 repeats the free oscillations, changing over frequently between the ON light state and OFF light state. This control makes it possible to finely adjust the intensity of light reflected toward the projection optical system.

The total intensity of light reflected by means of the free oscillation toward the projection optical system is certainly lower than the intensity when the mirror 4003 is continuously in the ON light state and higher than the intensity when it is continuously in the OFF light state. That is, it is possible to make an intermediate intensity between those of the ON light state and OFF light state. Therefore, a higher gradation image can be projected than with the conventional technique by finely adjusting the intensity as described above.

Note that the mirror device provided with the oscillation state or intermediate state is advantageous in terms of long life, low voltage, high grade of gray scale, high resolution (i.e., miniaturization), high contrast and high brightness, as compared to a mirror device provided with only the binary value, i.e., ON and OFF. Furthermore, the mirror device is preferable as a device for displaying the next generation fine video image. It is also preferable for a projection apparatus to display a still image.

Embodiment 4

The use of a light source possessing a coherent characteristic, like the light source in the respective projection apparatuses as described above, enables an image projection that uses an optical device with a larger F number (allowing small expansion of a light flux) than the use a conventional arc discharge lamp as the light source.

The light flux transmitting through the illumination optical system and projection optical system is F=2 to 3 when using a conventional arc discharge lamp.

In contrast, a projection apparatus comprising a semiconductor laser light source as the light source enables an optical design with, for example, a light flux of f/10, making it possible to set the deflection angle of the mirror of a spatial light modulator at about ±3 degrees CW in relation to the initial state of the mirror.

Using a conventional arc discharge lamp, causes the directivity of light to be lower than when using a laser light, therefore the illumination can be designed to be brighter as a larger optical device is used because of the usage efficiency of light. This is a relationship that is generally called etendue.

Figure 16A:
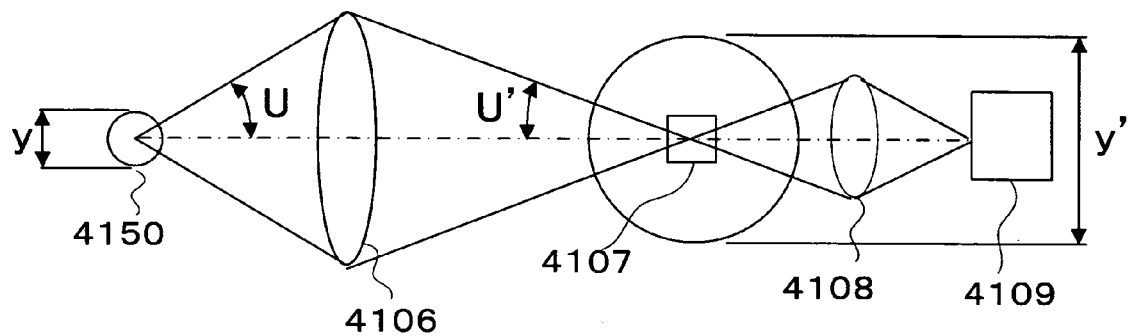
FIG. 16A is a side view diagram for describing etendue in projecting an image by way of an optical device using a light source.

FIG. 16A is an example for describing etendue in the projection of an image by way of an optical device using an arc discharge lamp.

Let it be assumed that "y" is the size of a light source 4150, and "u" is the angle of light with which an optical lens 4106 imports the light from the light source. Further, "u'" is the converging angle on the image side converged from the use of the optical lens 4106, and "y'" is the size of an image projected onto a screen 4109 by way of a projection lens 4108 after the use an optical device 4107 for the converged light. Here, there is a relationship called the etendue among the size y of the light source 4150, the import angle u of light, the converging angle u' on the image side, and the size y' of an image, as follows:

$$y*u=y'*u'$$

Based on the relationship, the smaller the optical device 4107 that attempts to image the light source 4150, the smaller the import angle u of light becomes. Because of this, when the optical device is made smaller, the image becomes darker as a result of limiting the import angle u of light. Therefore, when an arc discharge lamp with low directivity is used, the import angle u of light needs to be proportionally large in order to keep the brightness of an image. That is, it is necessary to increase the sizes of the optical lens 4106 and optical device 4107.

Figure 16B:
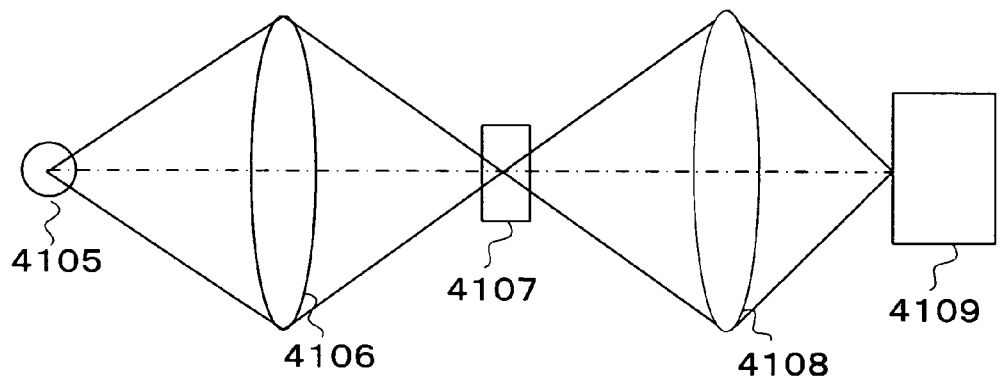
FIG. 16B is a side view diagram for illustrating an image projection by way of an optical device using an arc discharge lamp.

FIG. 16B is a diagram illustrating an image projection by way of an optical device using an arc discharge lamp.

The light output from an arc discharge lamp light source 4105 is converged by using an optical lens 4106, and irradiated onto the optical device 4107. Then, the light passing through the optical device 4107 is projected onto a screen 4109 by way of a projection lens 4108.

The larger the optical lens used in this case, the larger the converging capacity is, the better the usage efficiency of light is, and therefore a projected image can be made brighter by increasing the size of the optical device 4107. A larger size of the optical lens 4106 or optical device 4107, however, is not acceptable to the demand for the substantial reduction of a spatial light modulator or projection apparatus.

In contrast, a laser light source has higher directivity of light and smaller expansion of a light flux than those of an arc discharge lamp light source. Therefore, a projected image can be sufficiently made brighter without the need to increase the sizes of an optical lens or optical device. Furthermore, if there is a shortage of brightness in a projected image, the brightness can be improved by increasing the output of the laser light source. Also, the light intensity can be increased without requiring a substantial increase in the expansion of the light flux because of the high directivity of the laser light.

Figure 16C:
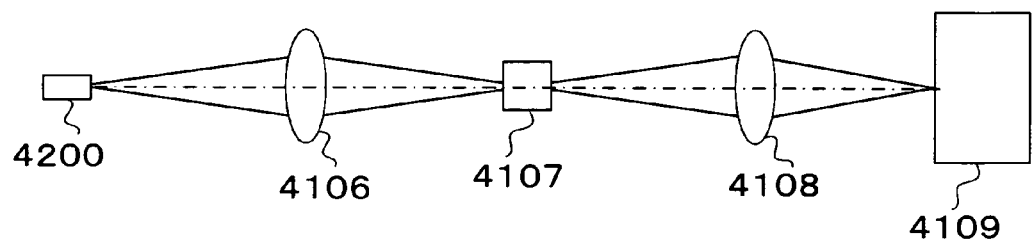
FIG. 16C is a side view diagram for illustrating an image projection by way of an optical device using a laser light source.

FIG. 16C is a diagram illustrating an image projection by way of an optical device using a laser light source. The laser light emitted from a laser light source 4200 is made to be incident to an optical device 4107 using an optical lens 4106. Then, the light passing through the optical device 4107 is projected onto a screen 4109 by way of a projection lens 4109.

In this event, the usage efficiency of light is improved by taking advantage of the high directivity of the laser light, and therefore a projected image can be made brighter without increasing the size of the optical lens 4106 or optical device 4107. This eliminates the problem of etendue, making it possible to miniaturize the optical lens 4106 and optical device 4107, and leads to the attainment of a compact projection apparatus.

Note that the reason for causing each laser light to be orthogonally incident to each respective prism face is to reduce, to a minimum, the loss of light due to the reflection of light from each prism upon entrance.

Figure 17:
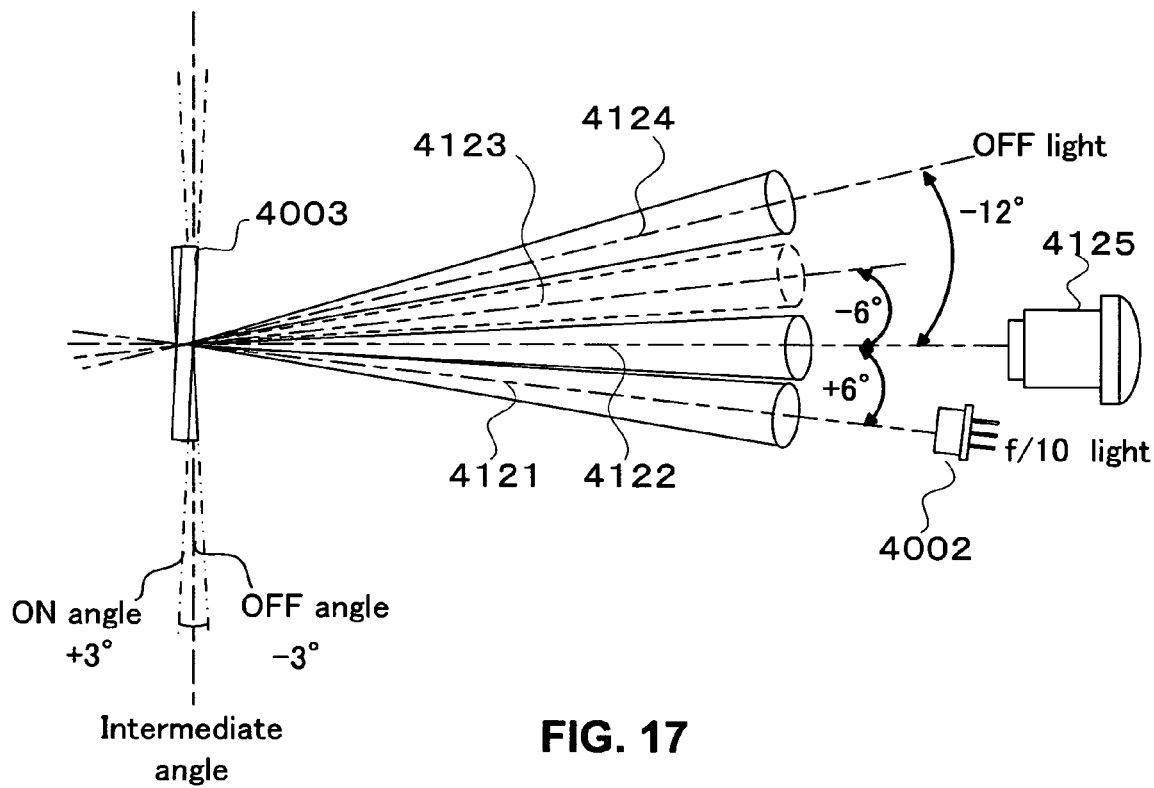
FIG. 17 is a side view diagram for illustrating how a light flux output from a light source with a coherent characteristic is reflected.

FIG. 17 is an illustrative cross-sectional diagram depicting how a light flux output from a light source with a coherent characteristic is reflected by a spatial light modulator, for which the deflection angles of mirror in an ON light state and an OFF light state are respectively designated at ±3 degrees, when using an illumination light flux from an F/10 illumination optical system emitted from a light source possessing a coherent characteristic.

Theoretically, with the deflection angle of mirror in an OFF state being set at "0" degrees, an angle of +6 degrees may exist between the optical axis 4122 of an ON light and the optical axis 4123 of a theoretical OFF light, so that no OFF light enters a projection optical system 4125 nor does the OFF light overlap with the ON light.

The present embodiment, however, is configured to designate a larger deflection angle of the mirror 4003 than that of the mirror 4003 in the OFF state that is theoretically represented to improve the contrast of an image.

For example, with the deflection angle of mirror in an OFF state being set at −3 degrees, an angle of −12 degrees is provided between the optical axis 4124 of the OFF light and the optical axis 4122 of the ON light so that the flux of the ON light does not overlap with not only the flux of the ON light but also that of the theoretically led OFF light. This configuration makes it possible to prevent the OFF light or the diffraction light and diffused light caused by the mirror from entering the projection optical system 4125 securely.

Figure 18:
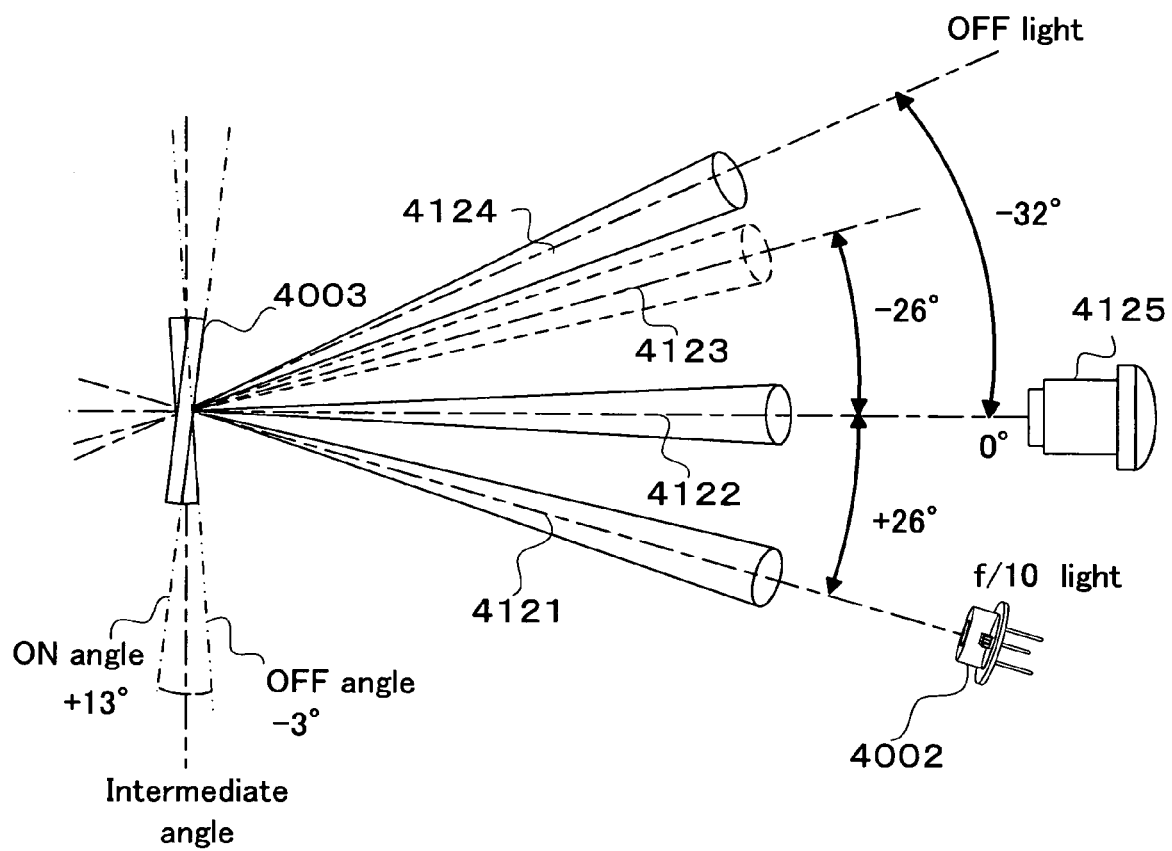
FIG. 18 is a side view diagram for illustrating how a light flux output from a light source with a coherent characteristic is reflected.

FIG. 18 is an illustrative cross-sectional diagram depicting how a light flux output from a light source with a coherent characteristic is reflected by a spatial light modulator, for which the deflection angle of mirror in an ON light state is designated at +13 degrees and that of an OFF light state is designated at −3 degrees, in the use of a light flux emitted from a light source 4002 possessing a coherent characteristic.

With the deflection angle of the mirror 4003 in an ON light state designated at +13 degrees, an angle of +26 degrees exists between the optical axis of an ON light and that of an illumination light 4121 so that the ON light enters the projection optical system 4125 without overlapping with the illumination light flux.

With the deflection angle of the mirror 4003 in an OFF light state designated at "0" degrees, an OFF light state may possibly be set by designating an angle of −26 degrees between the optical axis 4123 of an OFF light and the optical axis 4122 of the ON light. The present embodiment, however, is configured to designate a larger deflection angle than that of the mirror 4003 in the OFF state in order to further improve the contrast of an image.

For example, with the deflection angle of mirror in an OFF state being set at −3 degrees, an angle of −32 degrees is designated between the optical axis 4124 of an OFF light and the optical axis 4122 of an ON light, so that the flux of the OFF light does not overlap with not only the flux of the ON light but also that of the theoretically led OFF light. Such a configuration makes it possible to prevent the OFF light or the diffraction light and diffused light caused by the mirror from entering the projection optical system 4125 securely, thereby enabling an improvement of the contrast of a projected image.

A laser light source has higher directivity of light and smaller expansion of a light flux than those of an arc discharge lamp, and the brightness can be maintained even if the numerical aperture NA of an illumination light flux on the basis of the relationship is etendue. Therefore, a projected image can be sufficiently made brighter without a need to increase the sizes of an optical lens or optical device. Further, if there is a shortage of the brightness in a projected image, the brightness can be enhanced by increasing the output of the laser light source. Also, the light intensity can be enhanced without requiring a substantial increase in the expansion of the light flux because of the high directivity of the laser light.

Meanwhile, the resolution of an image projected in a projection apparatus is determined by the size of a mirror, the F number of a projection lens, the numerical aperture NA of a light source and the coherency of a light flux. When a laser light is used as the light source, degradation in the high frequency component of the spatial frequency of the laser light is small. Because of this, as compared to the use of a mercury lamp or the like, the resolution of the projected image can be maintained even if the F-number of a projection lens is enlarged.

Furthermore, enlarging the F numbers of lenses in the illumination system and projection system makes it possible to decrease the deflection angle of a mirror element, enabling the manufacture of a smaller mirror device requiring a low drive voltage. Further, the enlarging of the F-number of a projection lens makes it possible to increase the amount of allowable shift in the placement of a mirror device in relation to the focus position. Therefore, the optimization of the package structure of the mirror device makes it possible to shrink the mirror device and the entirety of a projection apparatus.

Note that the present invention can be changed in various ways within the spirit and scope of the present invention, and is not limited to the configurations exemplified in the embodiments described above.

What is claimed is:

1. A mirror device, comprising:
a mirror element comprises an elastic hinge and a mirror to modulate an incident light emitted from a light source;
a device substrate supports a drive circuit for driving the mirror;
a package includes a package substrate, composed of a transparent glass or a silicon material for containing and supporting the device substrate thereon
the package further includes a cover glass disposed on top of the package substrate covering over the device substrate; and
a metallic thermal transfer path comprising a plurality of metal traces disposing on a top surface of the package substrate and extending from a central portion near the drive circuit of the mirror to a peripheral edge of the package substrate outside of the area covered under the cover glass.

2. The mirror device according to claim 1, wherein:
the package substrate or cover glass further comprising a cavity for placing the device substrate therein.

3. The mirror device according to claim 1, wherein:
at least a part of the metal traces of the thermal transfer path comprising patterned circuit wires connected to the device substrate.

4. The mirror device according to claim 1, wherein:
the package further comprises an open space adjacent to the bottom surface of the device substrate for radiating heat from the bottom surface of the device substrate to transfer heat through the thermal transfer path to outside of the package substrate.

5. The mirror device according to claim 1, wherein:
an area surface of the package substrate not covered by the cover glass and the surface areas of the cover glass are further covered by a light absorption layer for reducing a reflection from the package.

6. A mirror device comprising:
a mirror element comprises an elastic hinge and a mirror to modulate an incident light emitted from a light source;
a device substrate supports a drive circuit for driving the mirror substrate,
a package includes a package substrate composed of a transparent glass or a silicon material for containing and supporting the device substrate thereon
a metallic thermal transfer path connected to the device substrate;
the package further includes a cover glass disposed on top of the package substrate covering over the device substrate; and
a nano-structured anti-reflection coating layer with the reflectance no more than 0.4% of the incident light is formed on the cover glass and/or the package substrate.

7. A mirror device, comprising:
a mirror for modulating incident light emitted from a light source;
an elastic hinge for supporting the mirror on the bottom surface thereof;
a device substrate on which a drive circuit for driving the mirror is placed;
a thermal conduction member placed on the bottom surface of the device substrate;
a package substrate for supporting the device substrate; and
a cover glass joined, with a fitted glass or a low-melt metal, onto the package substrate so as to cover the device substrate, wherein the difference in linear expansion rates between the package substrate and cover glass is no more than $2*10^{-6}/K$.

8. The mirror device according to claim 7, wherein:
the package substrate is constituted by a material with the thermal conductivity being no less than 40 Wm/K.

9. The mirror device according to claim 7, wherein:
the package substrate is constituted by approximately the same material as that of the device substrate.

10. The mirror device according to claim 7, wherein:
the package substrate and elastic hinge are constituted by a material containing silicon.

11. The mirror device according to claim 7, wherein:
the package substrate is constituted by a silicon material.

12. The mirror device according to claim 7, wherein:
the package substrate is constituted by a silicon nitride material.

13. The mirror device according to claim 7, wherein:
the package substrate is constituted by a silicon carbide material.

14. The mirror device according to claim 7, wherein:
the package substrate is constituted by a glass layer and a silicon layer.

15. The mirror device according to claim 7, wherein:
the glass transition temperature of the fritted glass is no higher than 350 degrees C. and the melting point of the low-melt metal is no higher than 350 degrees C.

16. A mirror device, comprising:
a mirror element comprises a mirror for modulating incident light emitted from a light source;

a device substrate supports a drive circuit for driving the mirror;

a package substrate for disposing the device substrate thereon, wherein the package substrate composed of silicon wafer comprising diced wafer edges and the device substrate comprising said driving circuit formed by processes performed on the device substrate as another silicon wafer; and a metallic thermal transfer path comprising a plurality of metal traces disposing on a top surface of the package substrate and extending from a central portion near the drive circuit of the mirror to a peripheral area near the dice wafer edges of the package substrate away from an area under the device substrate.

17. The mirror device according to claim 16, wherein:

the silicon wafer comprising said diced wafer edges comprises a recycled silicon wafer.

18. The mirror device according to claim 16, wherein:

the silicon wafer to form the package substrate is substantially the same size as said another silicon wafer to form the device substrate.

19. The mirror device according to claim 16, wherein:

the metal traces further comprises circuit wires connected to the device substrate.

* * * * *